(12) United States Patent
Nikitin

(10) Patent No.: US 10,404,268 B2
(45) Date of Patent: Sep. 3, 2019

(54) METHOD AND APPARATUS FOR NONLINEAR FILTERING AND FOR MITIGATION OF INTERFERENCE

(71) Applicant: Alexei V. Nikitin, Wamego, KS (US)

(72) Inventor: Alexei V. Nikitin, Wamego, KS (US)

(*) Notice: Subject to any disclaimer, the term of this patent is extended or adjusted under 35 U.S.C. 154(b) by 0 days.

(21) Appl. No.: 16/265,363

(22) Filed: Feb. 1, 2019

(65) Prior Publication Data

US 2019/0215005 A1    Jul. 11, 2019

Related U.S. Application Data

(63) Continuation-in-part of application No. 15/865,569, filed on Jan. 9, 2018.

(51) Int. Cl.
| | | |
|---|---|---|
| H03M 1/06 | (2006.01) | |
| H03M 3/00 | (2006.01) | |
| H03H 7/12 | (2006.01) | |
| H03H 21/00 | (2006.01) | |

(52) U.S. Cl.
CPC ........... H03M 3/368 (2013.01); H03H 7/12 (2013.01); H03H 21/0001 (2013.01); H03H 21/0016 (2013.01); H03M 3/422 (2013.01); H03M 3/438 (2013.01); H03M 3/458 (2013.01)

(58) Field of Classification Search
CPC ........ H03M 3/368; H03M 3/422; H03M 3/43; H03M 3/438; H03M 3/456; H03M 3/458
USPC .......... 341/110, 118, 145, 156.144
See application file for complete search history.

(56) References Cited

U.S. PATENT DOCUMENTS

| | | | | |
|---|---|---|---|---|
| 4,684,931 A | * | 8/1987 | Parks ................. | G08B 13/26 340/510 |
| 6,081,198 A | * | 6/2000 | Adamson ............ | A01K 3/005 324/527 |
| 6,492,929 B1 | * | 12/2002 | Coffey ............... | H03M 1/127 341/118 |
| 6,778,966 B2 | * | 8/2004 | Bizjak ............... | H03G 3/3089 704/225 |
| 7,190,292 B2 | * | 3/2007 | Bizjak ............... | H03G 3/32 341/110 |

* cited by examiner

Primary Examiner — Jean B Jeanglaude
(74) Attorney, Agent, or Firm — Dale J. Ream

(57) ABSTRACT

Method and apparatus for nonlinear signal processing include mitigation of outlier noise in the process of analog-to-digital conversion and adaptive real-time signal conditioning, processing, analysis, quantification, comparison, and control. Methods, processes and apparatus for real-time measuring and analysis of variables include statistical analysis and generic measurement systems and processes which are not specially adapted for any specific variables, or to one particular environment. Methods and corresponding apparatus for mitigation of electromagnetic interference, for improving properties of electronic devices, and for improving and/or enabling coexistence of a plurality of electronic devices include post-processing analysis of measured variables and post-processing statistical analysis.

20 Claims, 73 Drawing Sheets

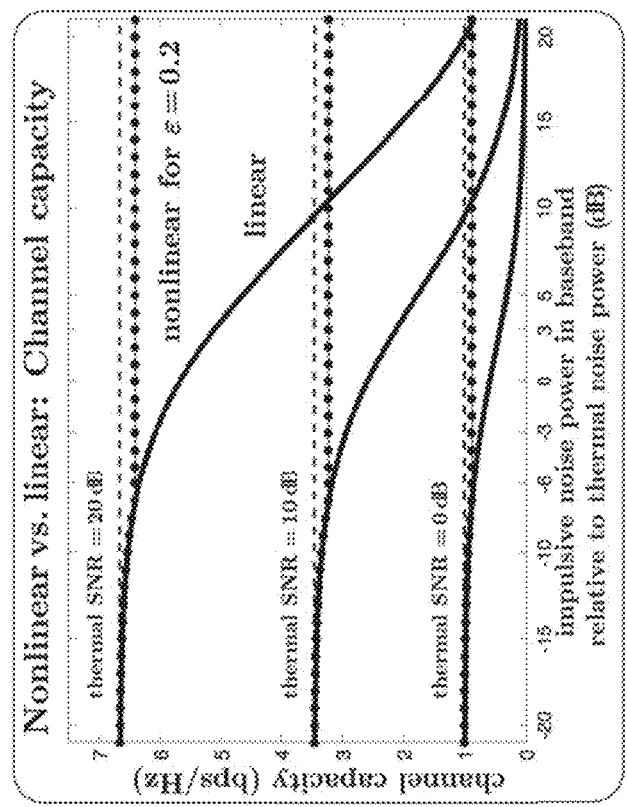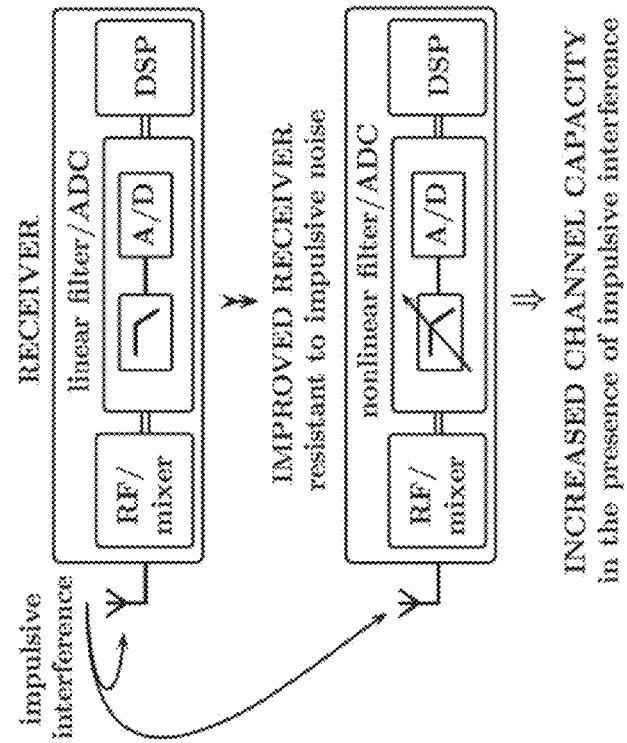
Fig. 2

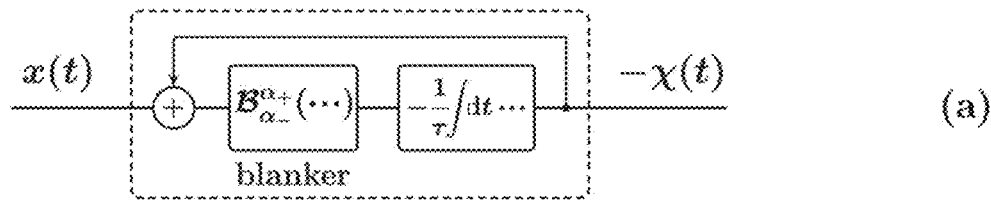
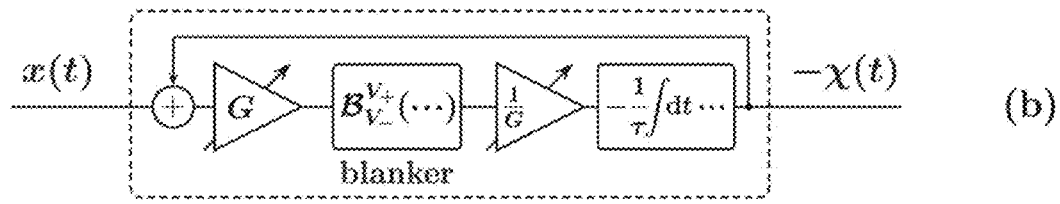
Fig. 5

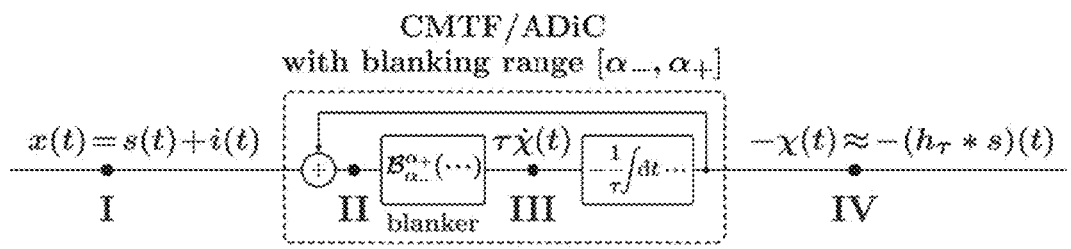

(1) $s(t) \approx \tau\dot\chi(t) + \chi(t)$: "Prime" ADiC output
 - extracted non-impulsive ("background") component
 (signal at point III minus signal at point IV)

(2) $i(t) \approx [x(t) - \chi(t)] - \tau\dot\chi(t)$: "Auxiliary" ADiC output
 - extracted impulsive component
 (signal at point II minus signal at point III)

(3) $-\chi(t) \approx -(h_\tau * s)(t)$: CMTF output
 - extracted non-impulsive ("background") component
 filtered with 1st order lowpass filter $h_\tau(t)$ (4) $(h_\tau * i)(t) \approx (h_\tau * x)(t) - \chi(t)$
 - extracted impulsive component
 filtered with 1st order lowpass filter $h_\tau(t)$

Fig. 10

$$\mathcal{T}_{\alpha_-}^{\alpha_+}(x) = \begin{cases} 1 & \text{for } \alpha_- \leq x \leq \alpha_+ \\ \left(\frac{\mathcal{R}}{x-\mathcal{M}}\right)^2 & \text{otherwise} \end{cases},$$

where $\mathcal{R} = \dfrac{\alpha_+ - \alpha_-}{2}$ and $\mathcal{M} = \dfrac{\alpha_+ + \alpha_-}{2}$

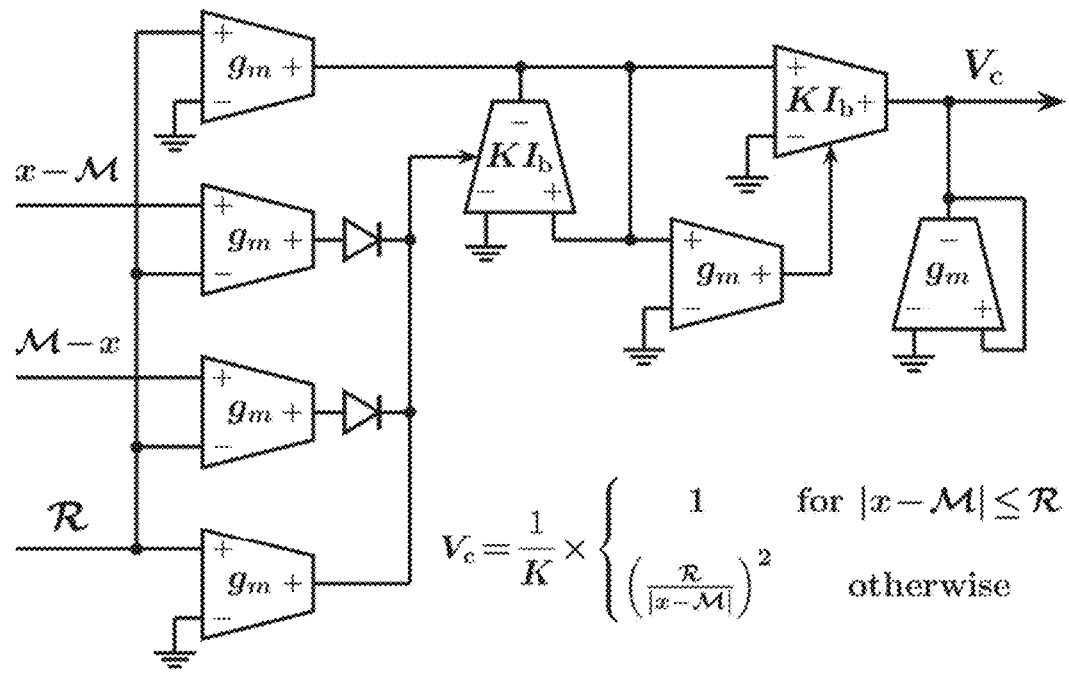
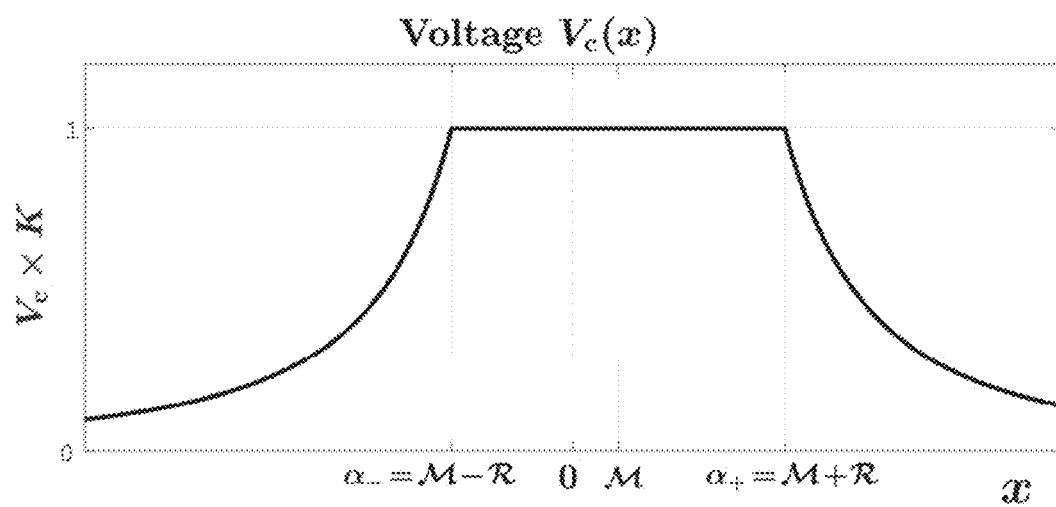
Fig. 71

METHOD AND APPARATUS FOR NONLINEAR FILTERING AND FOR MITIGATION OF INTERFERENCE

CROSS REFERENCES TO RELATED APPLICATIONS

This application is a continuation-in-part of the U.S. patent application Ser. No. 15/865,569, filed on 9 Jan. 2018. This application is also related to the U.S. provisional patent applications 62/444,828 (filed on 11 Jan. 2017) and 62/569,807 (filed on 9 Oct. 2017), which are incorporated therein by reference in their entirety.

STATEMENT REGARDING FEDERALLY SPONSORED RESEARCH OR DEVELOPMENT

None.

COPYRIGHT NOTIFICATION

Portions of this patent application contain materials that are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to nonlinear signal processing, and, in particular, to method and apparatus for mitigation of outlier noise in the process of analog-to-digital conversion. Further, the present invention relates to discrimination between signals based on their temporal and amplitude structures. More generally, this invention relates to adaptive real-time signal conditioning, processing, analysis, quantification, comparison, and control, and to methods, processes and apparatus for real-time measuring and analysis of variables, including statistical analysis, and to generic measurement systems and processes which are not specially adapted for any specific variables, or to one particular environment. This invention also relates to methods and corresponding apparatus for mitigation of electromagnetic interference, and further relates to improving properties of electronic devices and to improving and/or enabling coexistence of a plurality of electronic devices. The invention further relates to post-processing analysis of measured variables and to post-processing statistical analysis.

BACKGROUND

An outlier is something "abnormal" that "sticks out". For example, the noise that "protrudes" from background noise. Such noise would typically be, in terms of its amplitude distribution, non-Gaussian. What is actually observed may depend on a source, the way noise couples into a system, and where in the system it is observed. Hence various particular instances of outlier noise may be known under different names, including, but not limited to, such as impulsive noise, transient noise, sparse noise, platform noise, burst noise, crackling noise, clicks & pops, and others. Depending on the way noise couples into a system and where in the system it is observed, noise with the same origin may have different appearances, and may or may not even be seen as an outlier noise.

Non-Gaussian (and, in particular, outlier) noise affecting communication and data acquisition systems may originate from a multitude of natural and technogenic (man-made) phenomena in a variety of applications. Examples of natural outlier (e.g. impulsive) noise sources include ice cracking (in polar regions) and snapping shrimp (in warmer waters) affecting underwater acoustics [1-3]. Electrical man-made noise is transmitted into a system through the galvanic (direct electrical contact), electrostatic coupling, electromagnetic induction, or RF waves. Examples of systems and services harmfully affected by technogenic noise include various sensor, communication, and navigation devices and services [4-15], wireless internet [16], coherent imaging systems such as synthetic aperture radar [17], cable, DSL, and power line communications [18-24], wireless sensor networks [25], and many others. An impulsive noise problem also arises when devices based on the ultra-wideband (UWB) technology interfere with narrowband communication systems such as WLAN [26] or CDMA-based cellular systems [27]. A particular example of non-Gaussian interference is electromagnetic interference (EMI), which is a widely recognized cause of reception problems in communications and navigation devices. The detrimental effects of EMI are broadly acknowledged in the industry and include reduced signal quality to the point of reception failure, increased bit errors which degrade the system and result in lower data rates and decreased reach, and the need to increase power output of the transmitter, which increases its interference with nearby receivers and reduces the battery life of a device.

A major and rapidly growing source of EMI in communication and navigation receivers is other transmitters that are relatively close in frequency and/or distance to the receivers. Multiple transmitters and receivers are increasingly combined in single devices, which produces mutual interference. A typical example is a smartphone equipped with cellular, WiFi, Bluetooth. and GPS receivers, or a mobile WiFi hotspot containing an HSDPA and/or LTE receiver and a WiFi transmitter operating concurrently in close physical proximity. Other typical sources of strong EMI are on-board digital circuits, clocks, buses, and switching power supplies. This physical proximity, combined with a wide range of possible transmit and receive powers, creates a variety of challenging interference scenarios. Existing empirical evidence [8, 28, 29] and its theoretical support [6, 7, 10] show that such interference often manifests itself as impulsive noise, which in some instances may dominate over the thermal noise [5, 8, 28].

A simplified explanation of non-Gaussian (and often impulsive) nature of a technogenic noise produced by digital electronics and communication systems may be as follows. An idealized discrete-level (digital) signal may be viewed as a linear combination of Heaviside unit step functions [30]. Since the derivative of the Heaviside unit step function is the Dirac δ-function [31], the derivative of an idealized digital signal is a linear combination of Dirac δ-functions, which is a limitlessly impulsive signal with zero interquartile range and infinite peakedness. The derivative of a "real" (i.e. no longer idealized) digital signal may thus be viewed as a convolution of a linear combination of Dirac δ-functions with a continuous kernel. If the kernel is sufficiently narrow (for example, the bandwidth is sufficiently large), the resulting signal would appear as an impulse train protruding from a continuous background signal. Thus impulsive interference occurs "naturally" in digital electronics as "di/dt" (inductive) noise or as the result of coupling (for example, capacitive) between various circuit components and traces, leading to the so-called "platform noise" [28]. Additional illustrative mechanisms of impulsive interference in digital communication systems may be found in [6-8, 10, 32].

The non-Gaussian noise described above affects the input (analog) signal. The current state-of-art approach to its mitigation is to convert the analog signal to digital, then apply digital nonlinear filters to remove this noise. There are two main problems with this approach. First, in the process of analog-to-digital conversion the signal bandwidth is reduced (and/or the ADC is saturated), and an initially impulsive broadband noise would appear less impulsive [7-10, 32]. Thus its removal by digital filters may be much harder to achieve. While this can be partially overcome by increasing the ADC resolution and the sampling rate (and thus the acquisition bandwidth) before applying digital nonlinear filtering, this further exacerbates the memory and the DSP intensity of numerical algorithms, making them unsuitable for real-time implementation and treatment of non-stationary noise. Thus, second, digital nonlinear filters may not be able to work in real time, as they are typically much more computationally intensive than linear filters. A better approach would be to filter impulsive noise from the analog input signal before the analog-to-digital converter (ADC), but such methodology is not widely known, even though the concepts of rank filtering of continuous signals are well understood [32-37].

Further, common limitations of nonlinear filters in comparison with linear filtering are that (1) nonlinear filters typically have various detrimental effects (e.g., instabilities and intermodulation distortions), and (2) linear filters are generally better than nonlinear in mitigating broadband Gaussian (e.g. thermal) noise.

Time Domain Analysis of 1st- and 2nd-Order Delta-Sigma ($\Delta\Sigma$) ADCs with Linear Analog Loop Filters Nowadays, delta-sigma ($\Delta\Sigma$) ADCs are used for converting analog signals over a wide range of frequencies, from DC to several megahertz. These converters comprise a highly oversampling modulator followed by a digital/decimation filter that together produce a high-resolution digital output [38-40]. As discussed in this section, which reviews the basic principle of operation of $\Delta\Sigma$ ADCs from a time domain prospective, a sample of the digital output of a $\Delta\Sigma$ ADC represents its continuous (analog) input by a weighted average over a discrete time interval (that should be smaller than the inverted Nyquist rate) around that sample.

Since frequency domain representation is of limited use in analysis of nonlinear systems, let us first describe the basic $\Delta\Sigma$ ADCs with 1st- and 2nd-order linear analog loop filters in the time domain. Such 1st- and 2nd-order $\Delta\Sigma$ ADCs are illustrated in panels I and II of FIG. 1, respectively. Note that the vertical scales of the shown fragments of the signal traces vary for different fragments.

Without loss of generality, we may assume that if the input D to the flip-flop is greater than zero, D>0, at a specific instance in the clock cycle (e.g. the rising edge), then the output $\overline{Q}$ takes a negative value $\overline{Q}=-V_c$. If D<0 at a rising edge of the clock, then the output $\overline{Q}$ takes a positive value $\overline{Q}=V_c$. At other times, the output $\overline{Q}$ does not change. We also assume in this example that x(t) is effectively band-limited, and is bounded by $V_c$ so that $|x(t)|<V_c$ for all t. Further, the clock frequency $F_s$ is significantly higher (e.g. by more than about 2 orders of magnitude) than the bandwidth $B_x$ of x(t), $\log_{10}(F_s/B_x) \gtrsim 2$. It may be then shown that, with the above assumptions, the input D to the flip-flop would be a zero-mean signal with an average zero crossing rate much higher than the bandwidth of x(t).

Note that in the limit of infinitely large clock frequency $F_s$ ($F_s \to \infty$) the behavior of the flip-flop would be equivalent to that of an analog comparator. Thus, while in practice a finite flip-flop clock frequency is used, based on the fact that it is orders of magnitude larger that the bandwidth of the signal of interest we may use continuous-time (e.g. (w*y)(t) and x(t−$\Delta$t)) rather than discrete-time (e.g. (w*y)[k] and x[k−m]) notations in reference to the ADC outputs, as a shorthand to simplify the mathematical description of our approach.

As can be seen in FIG. 1, for the 1st-order modulator shown in panel I $$\overline{x(t)-y(t)}=0, \qquad (1)$$

and for the 2nd-order modulator shown in panel II $$\overline{\dot{y}(t)} = \frac{1}{\tau}[\overline{x(t)=y(t)}], \qquad (2)$$

where the overdot denotes a time derivative, and the overlines denote averaging over a time interval between any pair of threshold (including zero) crossings of D (such as, e.g., the interval $\Delta T$ shown in FIG. 1). Indeed, for a continuous function $f(t)$, the time derivative of its average over a time interval $\Delta T$ may be expressed as $$\overline{\dot{f}(t)} = \overline{\dot{f}(t)} = \frac{d}{dt}\left[\frac{1}{\Delta T}\int_{t-\Delta T}^{t} ds f(s)\right] = \frac{1}{\Delta T}[f(t)=f(t-\Delta T)], \qquad (3)$$

and it will be zero if $f(t)-f(t-\Delta T)=0$.

Now, if the time averaging is performed by a lowpass filter with an impulse response w(t) and a bandwidth $B_w$ much smaller than the clock frequency, $B_w \ll F_s$, equation (1) implies that the filtered output of the 1st-order $\Delta\Sigma$ ADC would be effectively equal to the filtered input, $$(w*y)(t)=(w*x)(t)+\delta y, \qquad (4)$$

where the asterisk denotes convolution, and the term $\delta y$ (the "ripple", or "digitization noise") is small and will further be neglected. We would assume from here on that the filter w(t) has a flat frequency response and a constant group delay $\Delta t$ over the bandwidth of x(t). Then equation (4) may be rewritten as $$(w*y)(t)=x(t-\Delta t), \qquad (5)$$

and the filtered output would accurately represent the input signal.

Since y(t) is a two-level staircase signal with a discrete step duration $n/F_s$, where n is a natural (counting) number, it may be accurately represented by a 1-bit discrete sequence y[k] with the sampling rate $F_s$. Thus the subsequent conversion to the discrete (digital) domain representation of x(t) (including the convolution of y[k] with w[k] and decimation to reduce the sampling rate) is rather straightforward and will not be discussed further.

If the input to a 1st-order $\Delta\Sigma$ ADC consists of a signal of interest x(t) and an additive noise n(t), then the filtered output may be written as $$(w*y)(t)=x(t-\Delta t)+(w*v)(t), \qquad (6)$$

provided that $x(t-\Delta t)+(w*v)(t)|<V_c$ for all t. Since w(t) has a flat frequency response over the bandwidth of x(t), it would not change the power spectral density of the additive noise v(t) in the signal passband, and the only improvement in the passband signal-to-noise ratio for the output (w*y)(t) would come from the reduction of the quantization noise δy by a well designed filter w(t).

Similarly, equation (2) implies that the filtered output of the 2nd-order ΔΣ ADC would be effectively equal to the filtered input further filtered by a 1st order lowpass filter with the time constant τ and the impulse response $h_\tau(t)$, $$(w*y)(t)=(h_\tau*w*x)(t). \quad (7)$$

From the differential equation for a 1st order lowpass filter it follows that $h_\tau*(w+\tau\dot{w})=w$, and thus we may rewrite equation (7) as $$(h_\tau*(w+\tau\dot{w})*y)(t)=(h_\tau*w*x)(t). \quad (8)$$

Provided that r is sufficiently small (e.g., $\tau \lesssim 1/(4\pi B_x)$), equation (8) may be further rewritten as $$((w+\tau\dot{w})*y)(t)=(w*x)(t)=x(t-\Delta t). \quad (9)$$

The effect of the 2nd-order loop filter on the quantization noise by is outside the scope of this disclosure and will not be discussed.

SUMMARY

Since at any given frequency a linear filter affects both the noise and the signal of interest proportionally, when a linear filter is used to suppress the interference outside of the passband of interest the resulting signal quality is affected only by the total power and spectral composition, but not by the type of the amplitude distribution of the interfering signal. Thus a linear filter cannot improve the passband signal-to-noise ratio, regardless of the type of noise. On the other hand, a nonlinear filter has the ability to disproportionately affect signals with different temporal and/or amplitude structures, and it may reduce the spectral density of non-Gaussian (e.g. impulsive) interferences in the signal passband without significantly affecting the signal of interest. As a result, the signal quality may be improved in excess of that achievable by a linear filter. Such non-Gaussian (and, in particular, impulsive, or outlier, or transient) noise may originate from a multitude of natural and technogenic (man-made) phenomena. The technogenic noise specifically is a ubiquitous and growing source of harmful interference affecting communication and data acquisition systems, and such noise may dominate over the thermal noise. While the non-Gaussian nature of technogenic noise provides an opportunity for its effective mitigation by nonlinear filtering, current state-of-the-art approaches employ such filtering in the digital domain, after analog-to-digital conversion. In the process of such conversion, the signal bandwidth is reduced, and the broadband non-Gaussian noise becomes more Gaussian-like. This substantially diminishes the effectiveness of the subsequent noise removal techniques.

The present invention overcomes the limitations of the prior art through incorporation of a particular type of nonlinear noise filtering of the analog input signal into nonlinear analog filters preceding an ADC, and/or into loop filters of ΔΣ ADCs. Such ADCs thus combine analog-to-digital conversion with analog nonlinear filtering, enabling mitigation of various types of in-band non-Gaussian noise and interference, especially that of technogenic origin, including broadband impulsive interference. This may considerably increase quality of the acquired signal over that achievable by linear filtering in the presence of such interference. An important property of the presented approach is that, while being nonlinear in general, the proposed filters would largely behave linearly. They would exhibit nonlinear behavior only intermittently, in response to noise outliers, thus avoiding the detrimental effects, such as instabilities and intermodulation distortions, often associated with nonlinear filtering.

The intermittently nonlinear filters of the present invention would also enable separation of signals (and/or signal components) with sufficiently different temporal and/or amplitude structures in the time domain, even when these signals completely or partially overlap in the frequency domain. In addition, such separation may be achieved without reducing the bandwidths of said signal components.

Even though the nonlinear filters of the present invention are conceptually analog filters, they may be easily implemented digitally, for example, in Field Programmable Cate Arrays (FPGAs) or software. Such digital implementations would require very little memory and would be typically inexpensive computationally, which would make them suitable for real-time signal processing.

Further scope and the applicability of the invention will be clarified through the detailed description given hereinafter. It should be understood, however, that the specific examples, while indicating preferred embodiments of the invention, are presented for illustration only. Various changes and modifications within the spirit and scope of the invention should become apparent to those skilled in the art from this detailed description. Furthermore, all the mathematical expressions, diagrams, and the examples of hardware implementations are used only as a descriptive language to convey the inventive ideas clearly, and are not limitative of the claimed invention.

BRIEF DESCRIPTION OF FIGURES

FIG. 2. Simplified diagram of improving receiver performance in the presence of impulsive interference.

FIG. 5. Block diagrams of CMTFs with blanking ranges $[\alpha_-,\alpha_+]$ (a) and $[V_-,V_+]/G$ (b).

FIG. 10. Using sums and/or differences of input and output of CMTF and its various intermediate signals for separating impulsive (outlier) and non-impulsive signal components.

[α_,α_+] for separating incoming signal x(t) into impulsive i(t) and non-impulsive s(t) ("background") signal components.

Figure 13:
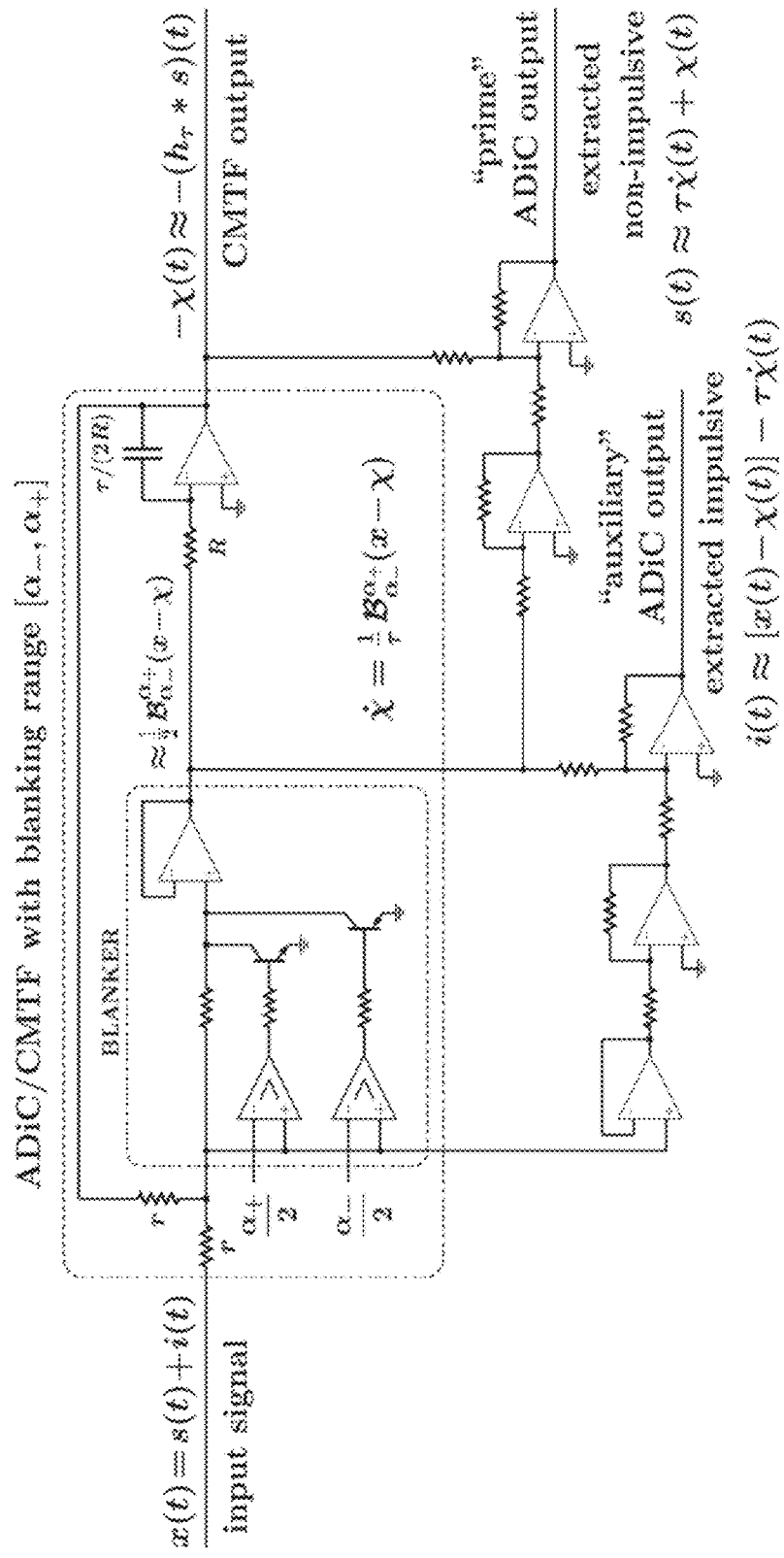
FIG. 13. Simplified illustrative electronic circuit diagram of using CMTF with appropriately chosen blanking range
Figure 14:
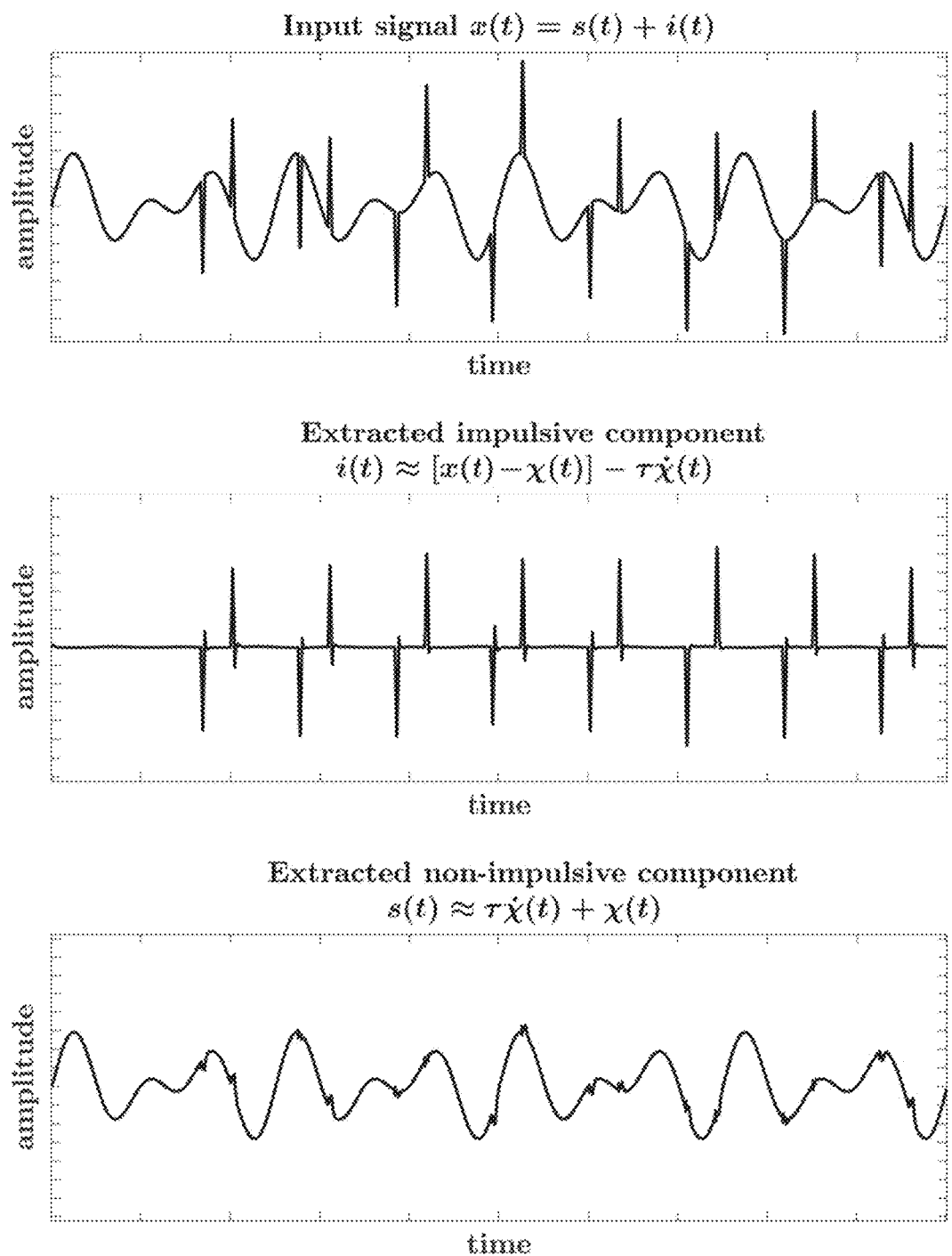

FIG. 14. Illustration of separating incoming signal x(t) into impulsive i(t) and non-impulsive s(t) ("background") components by the circuit of FIG. 13.

Figure 15:
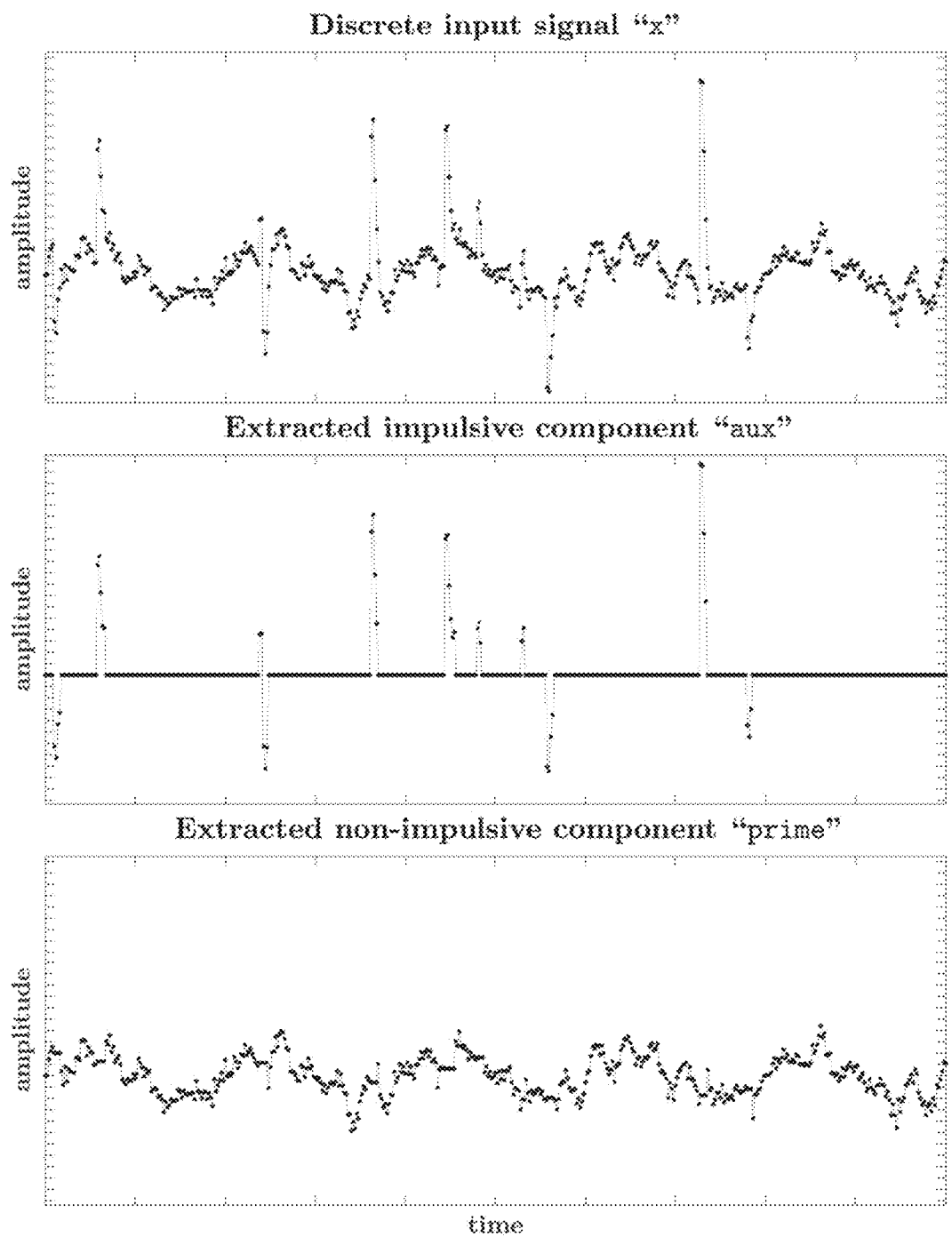

FIG. 15. Illustration of separation of discrete input signal "x" into impulsive component "aux" and non-impulsive ("background") component "prime" using the MATLAB function of § 2.5 with appropriately chosen blanking values "alpha_p" and "alpha_m".

Figure 16:
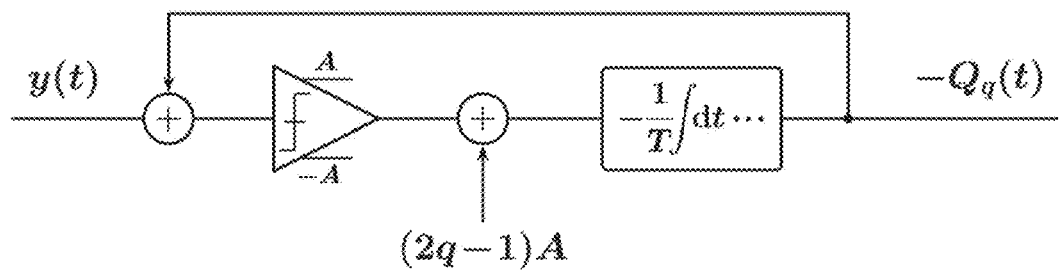

FIG. 16. Illustrative block diagram of a circuit implementing equation (21) and thus tracking a qth quantile of y(t).

Figure 17:
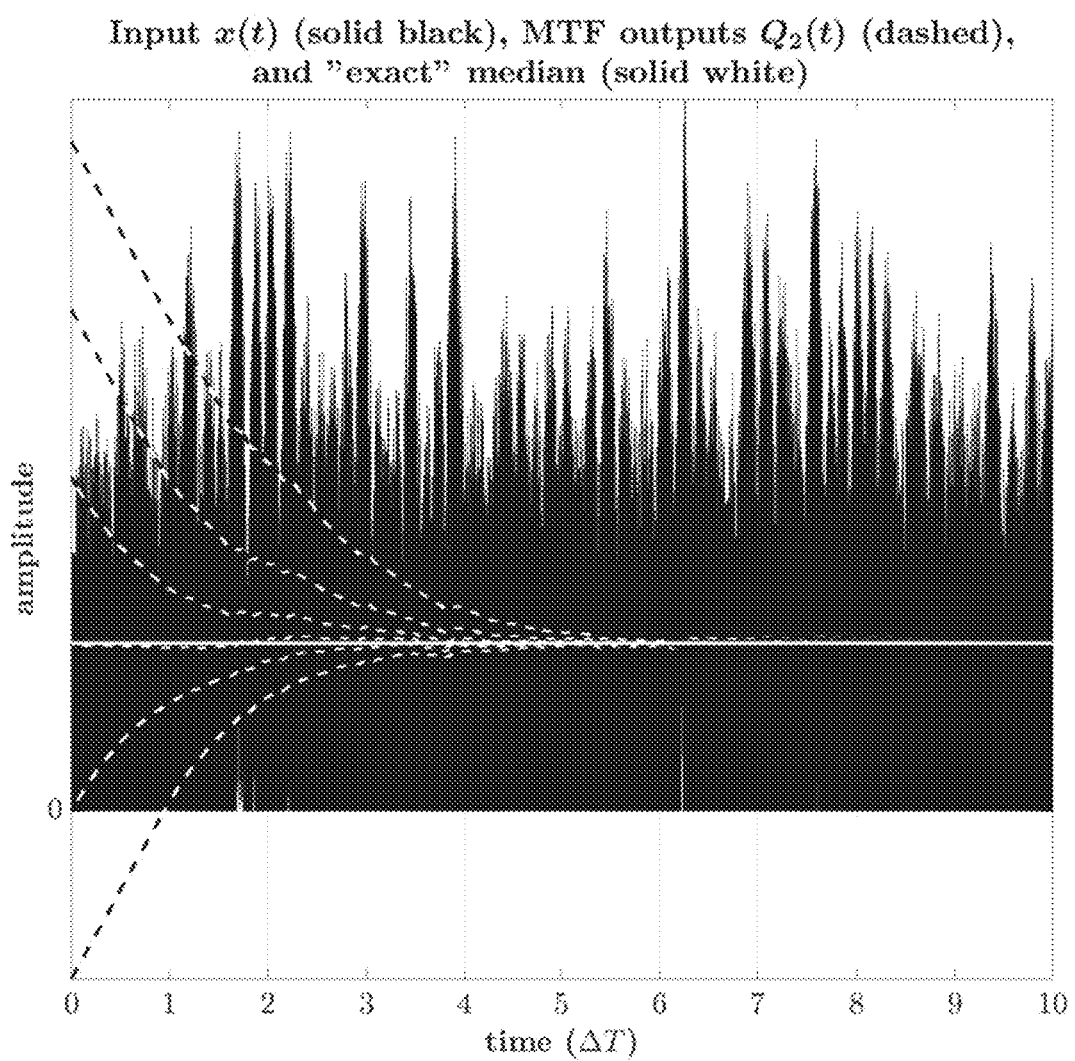

FIG. 17. Illustration of MTF convergence to steady state for different initial conditions.

Figure 18:
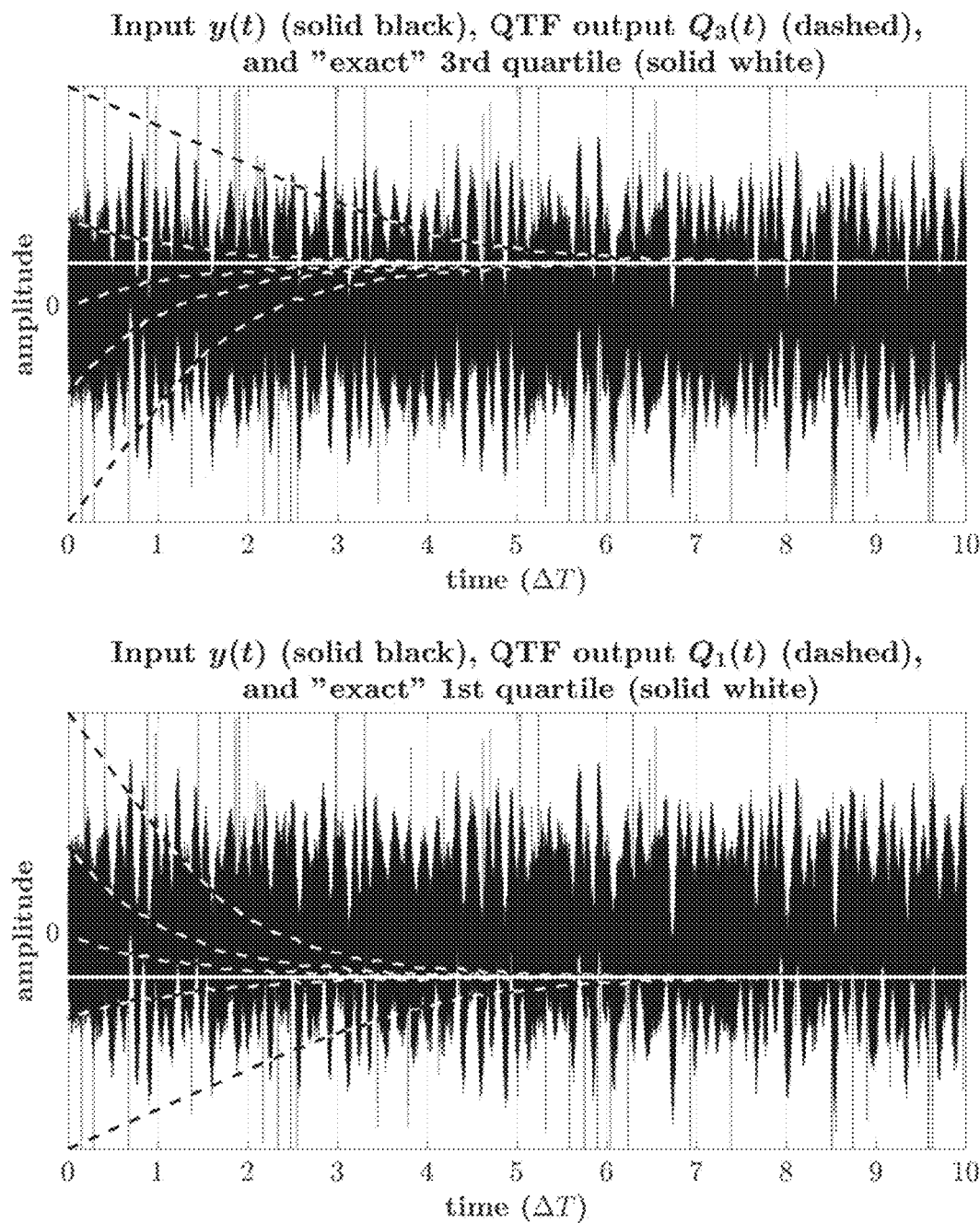

FIG. 18. Illustration of QTFs' convergence to steady state for different initial conditions.

Figure 19:
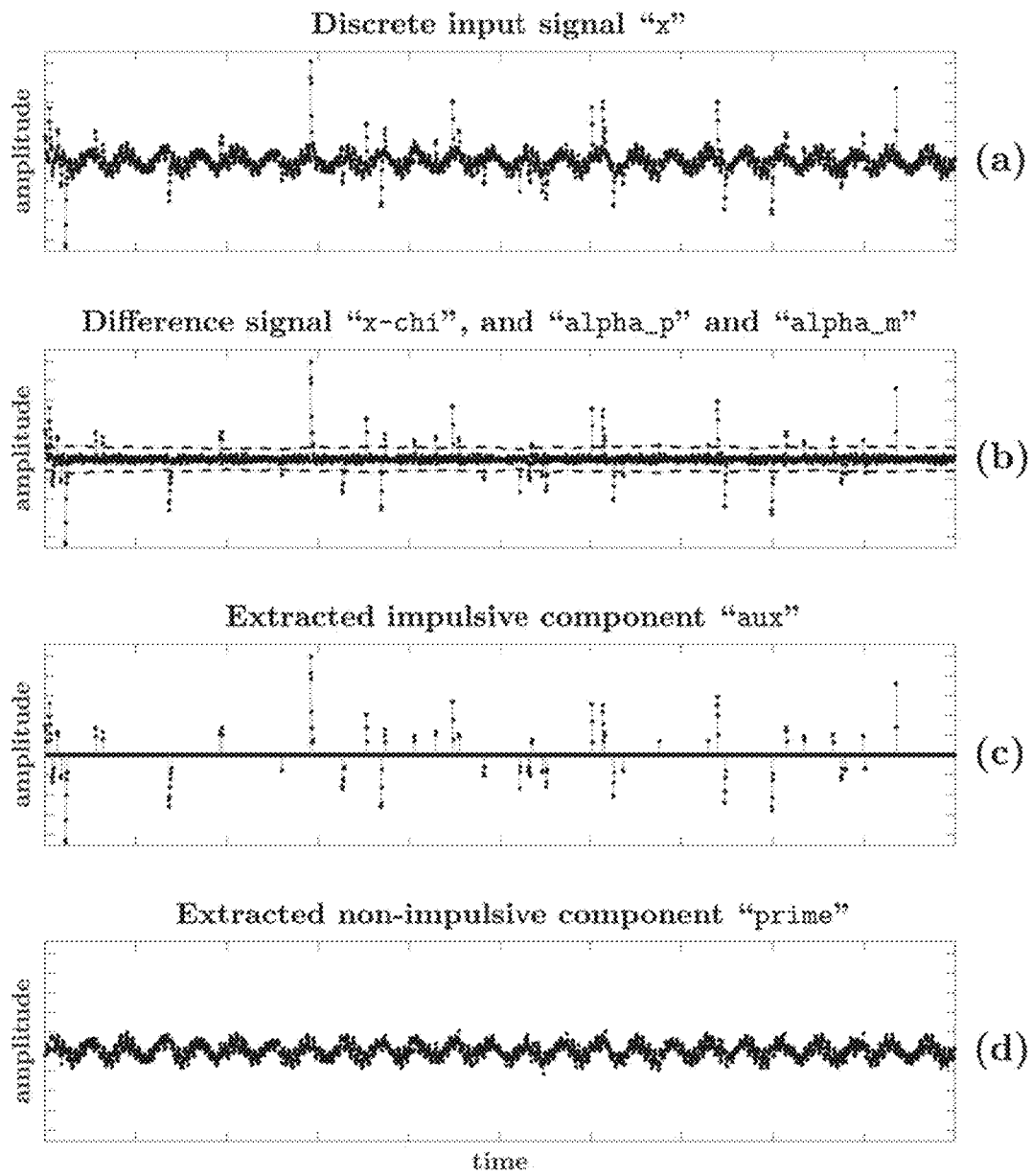

FIG. 19. Illustration of separation of discrete input signal "x" into impulsive component "aux" and non-impulsive ("background") component "prime" using the MATLAB function of § 3.3 with the blanking range computed as Tukey's range using digital QTFs.

Figure 20:
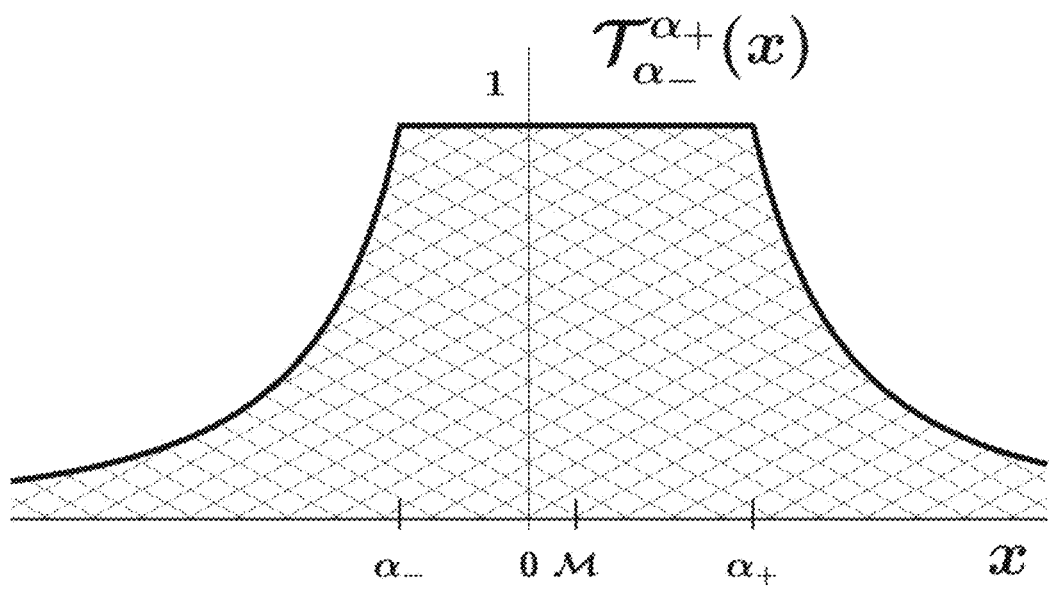

FIG. 20. Transparency function descrobed by equation (30).

Figure 21:
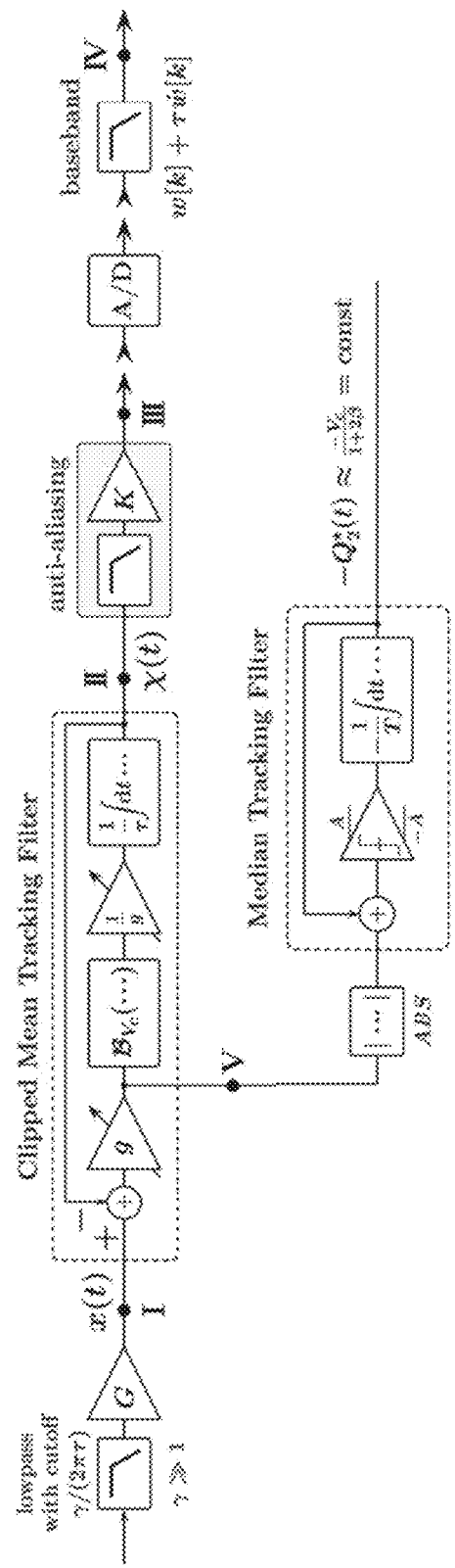

FIG. 21. Illustrative block diagram of an adaptive intermittently nonlinear filter for mitigation of outlier noise in the process of analog-to-digital conversion.

Figure 22:
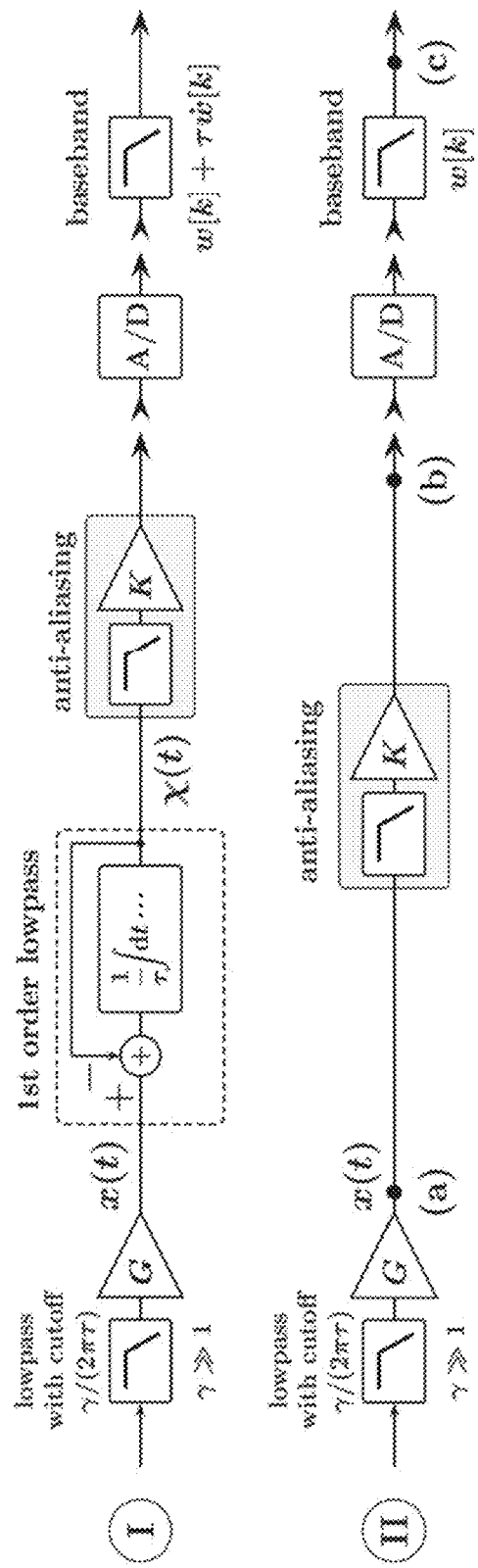

FIG. 22. Equivalent block diagram for the filter shown in FIG. 21 operating in linear regime.

Figure 23:
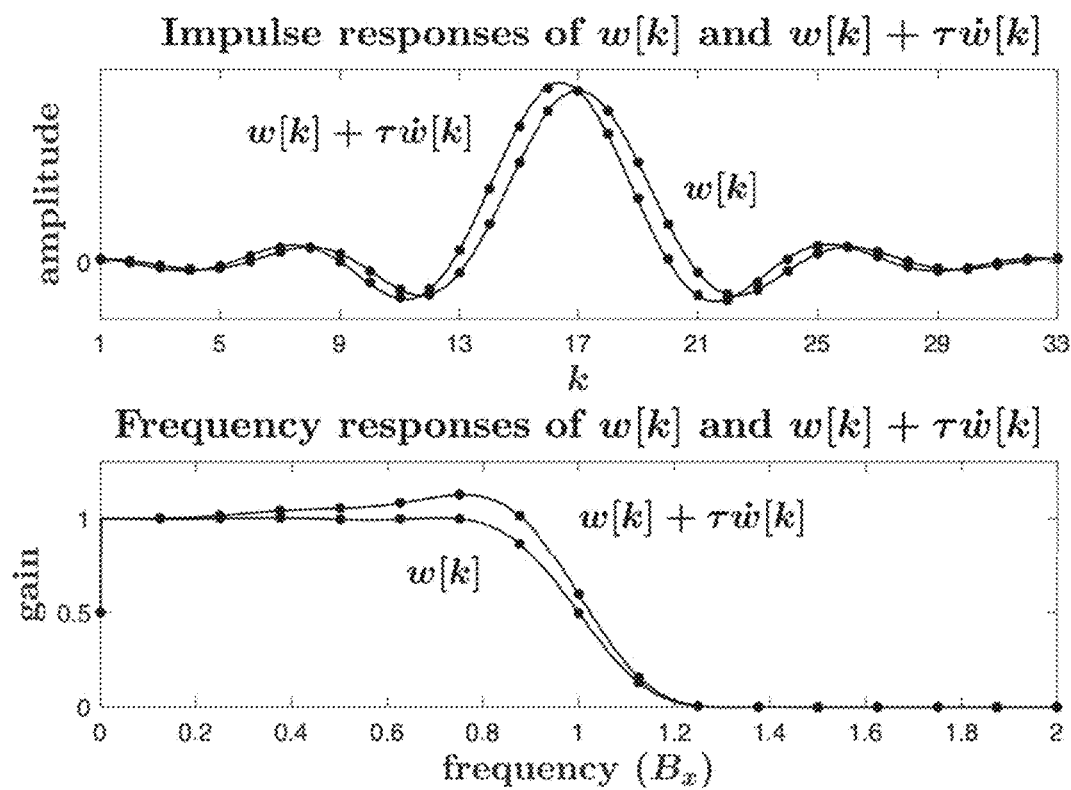

FIG. 23. Impulse and frequency responses of w[k] and w[k]+τẇ[k] used in the subsequent examples.

Figure 24:
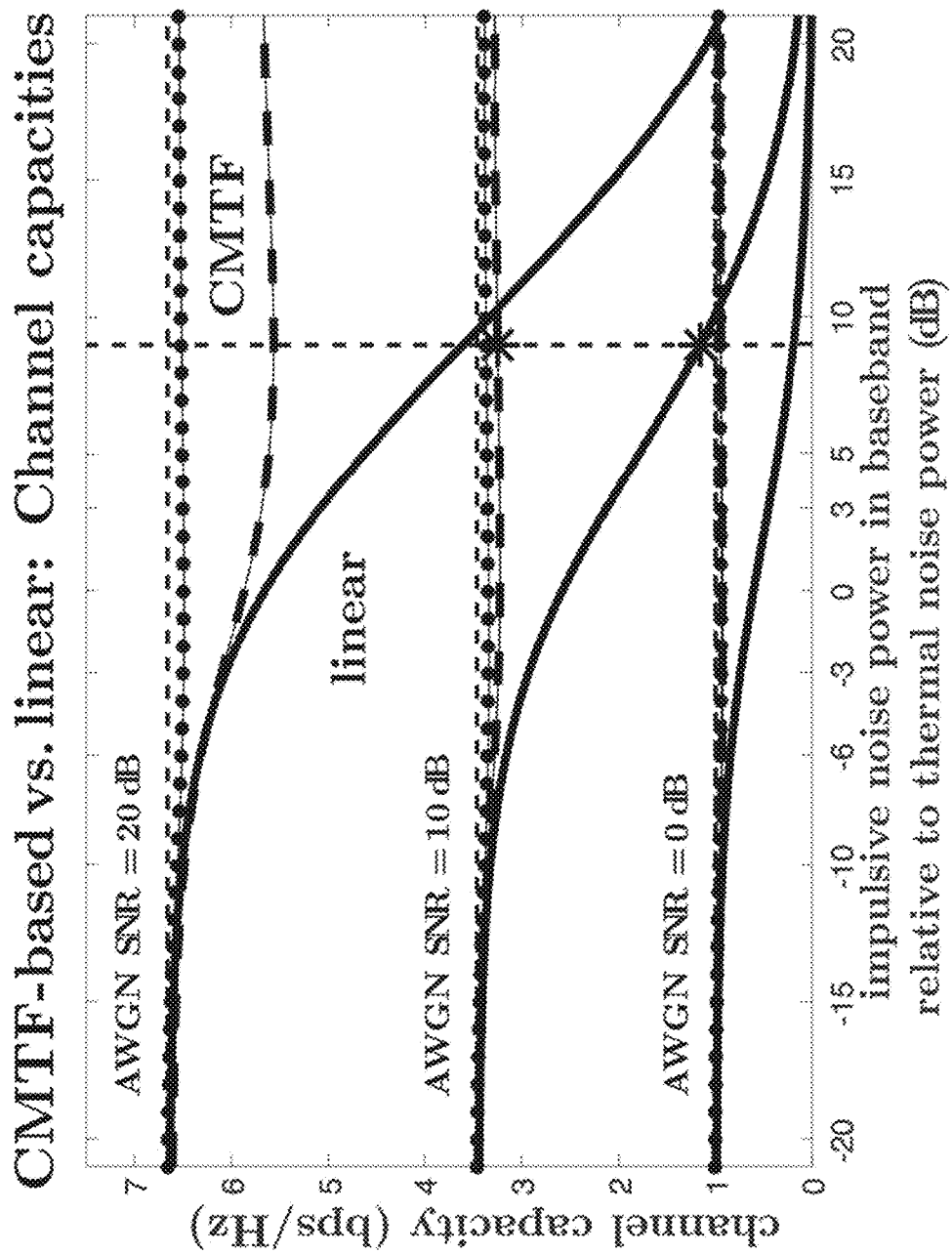

FIG. 24. Comparison of simulated channel capacities for the linear processing chain (solid curves) and the CMTF-based chains with β=3 (dotted and dashed curves). The dashed curves correspond to channel capacities for the CMTF-based chain with added interference in an adjacent channel. The asterisks correspond to the noise and adjacent channel interference conditions used in FIG. 25.

Figure 25:
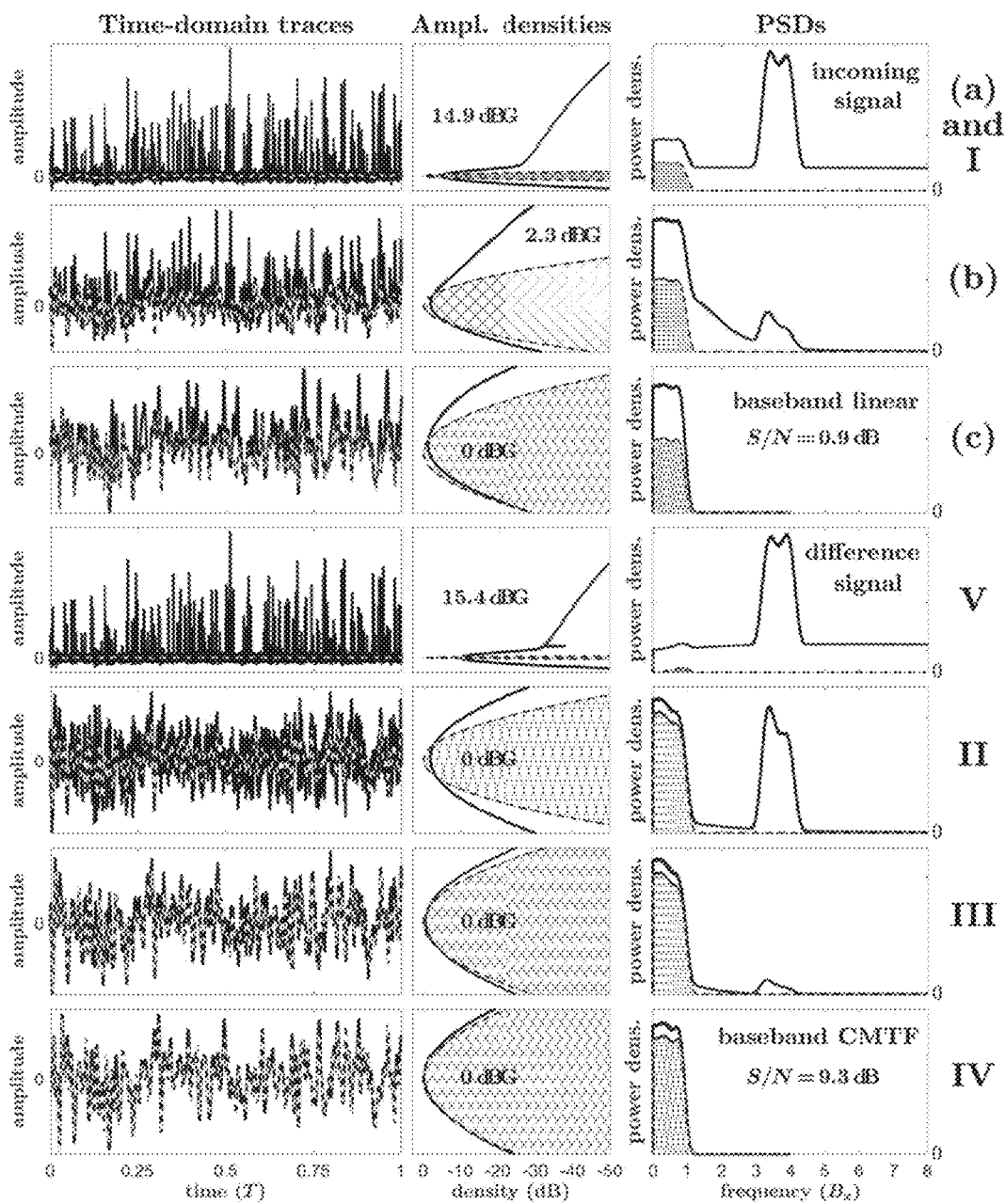

FIG. 25. Illustration of changes in the signal time- and frequency domain properties, and in its amplitude distributions, while it propagates through the signal processing chains, linear (points (a), (b), and (c) in panel II of FIG. 22), and the CMTF-based (points I through IV, and point V, in FIG. 21).

Figure 26:
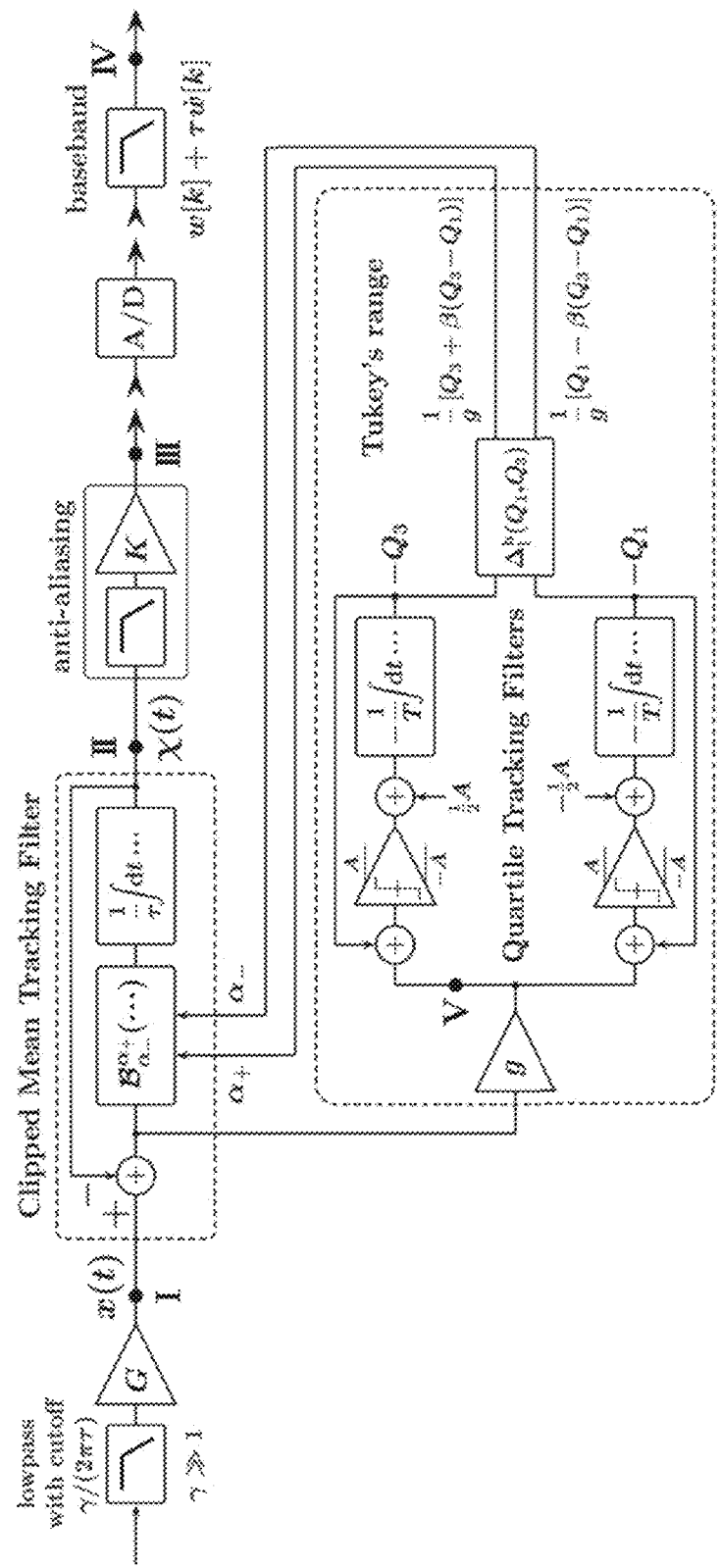

FIG. 26. Alternative topology for signal processing chain shown in FIG. 21.

Figure 27:
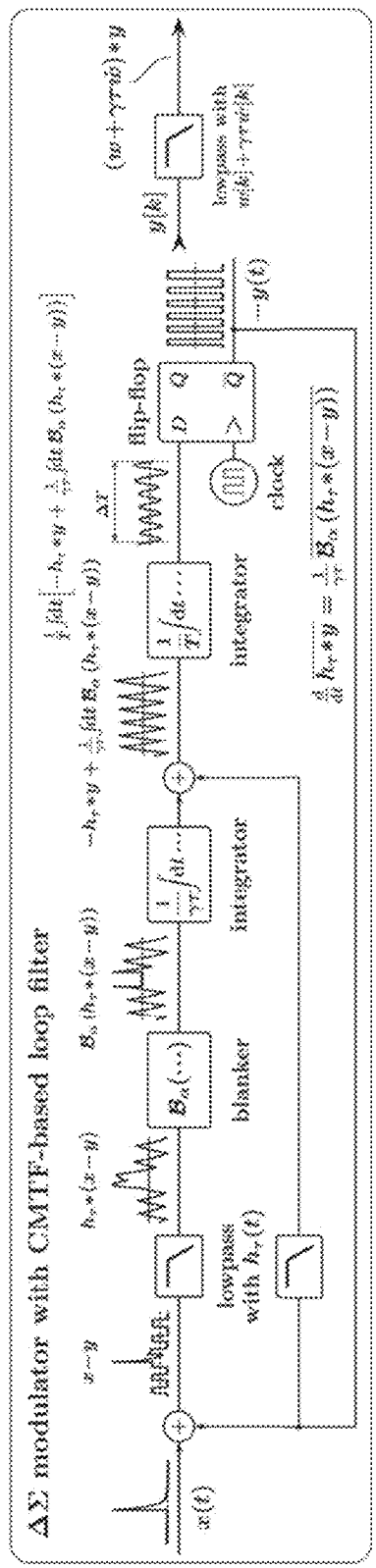

FIG. 27. ΔΣ ADC with an CMTF-based loop filter.

Figure 28:
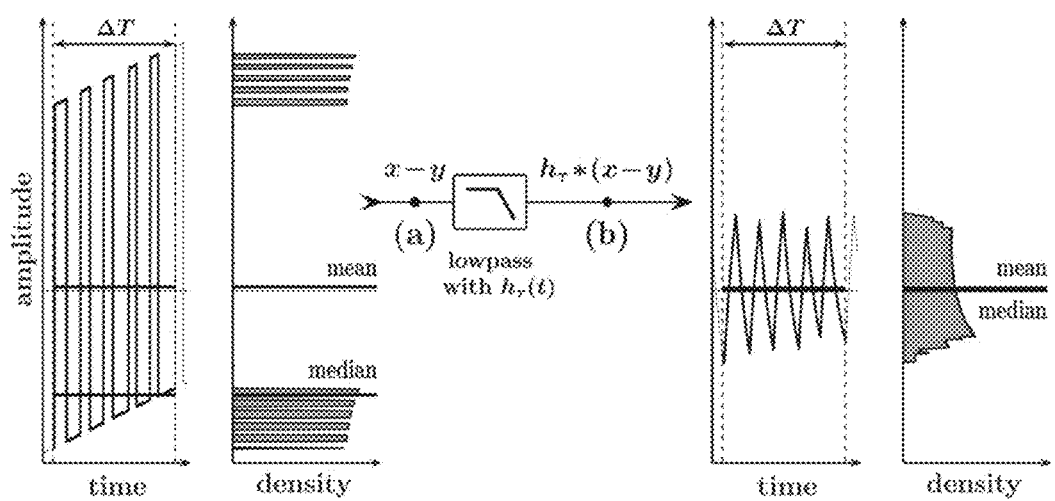

FIG. 28. Modifying the amplitude density of the difference signal x−y by a 1st order lowpass filter.

Figure 29:
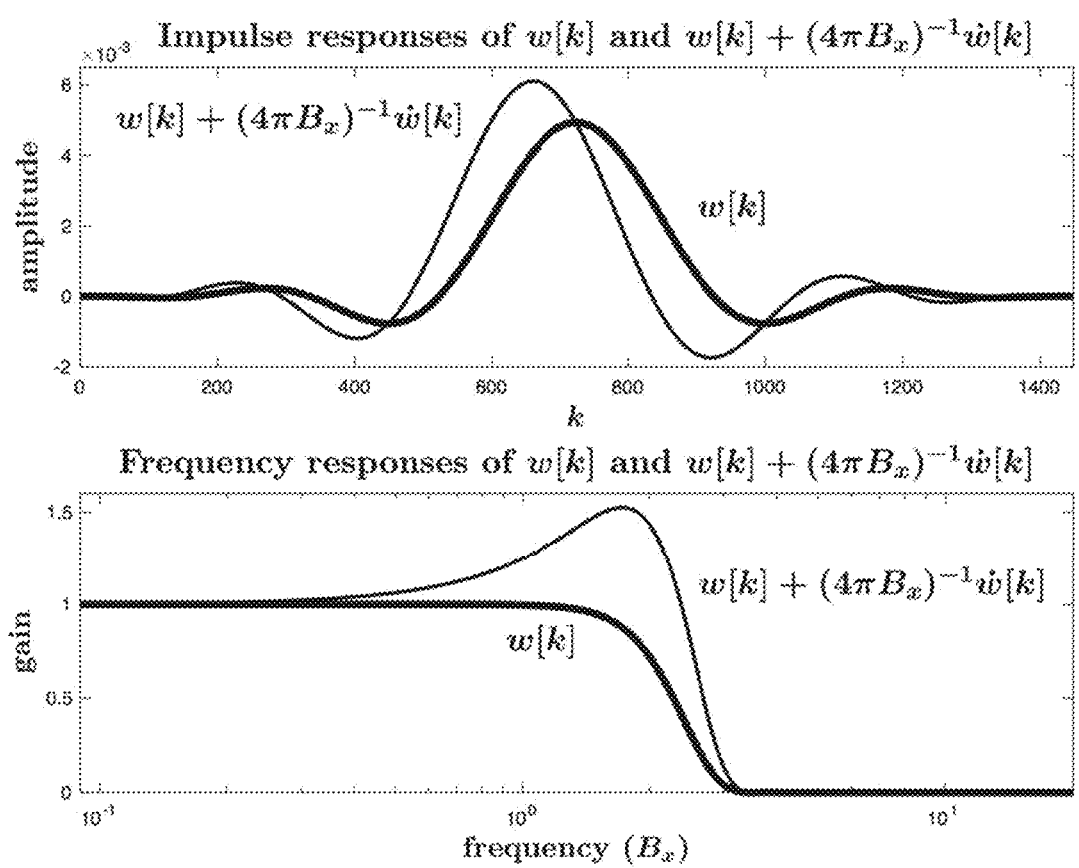

FIG. 29. Impulse and frequency responses of w[k] and w[k]+(4πB_x)^{−1}ẇ[k] used in the examples of FIG. 30.

Figure 30:
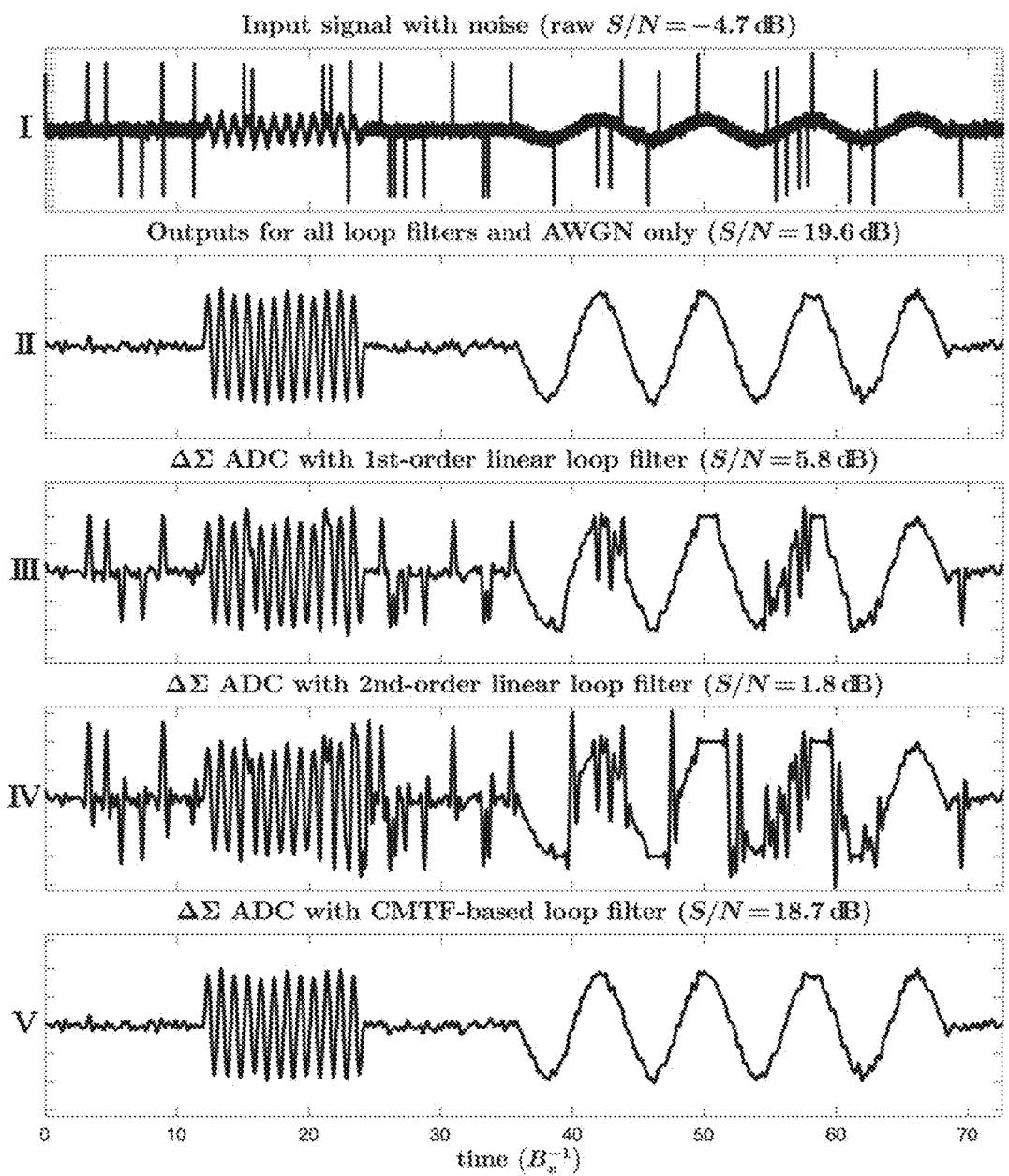

FIG. 30. Comparative performance of ΔΣ ADCs with linear and nonlinear analog loop filters.

Figure 31:
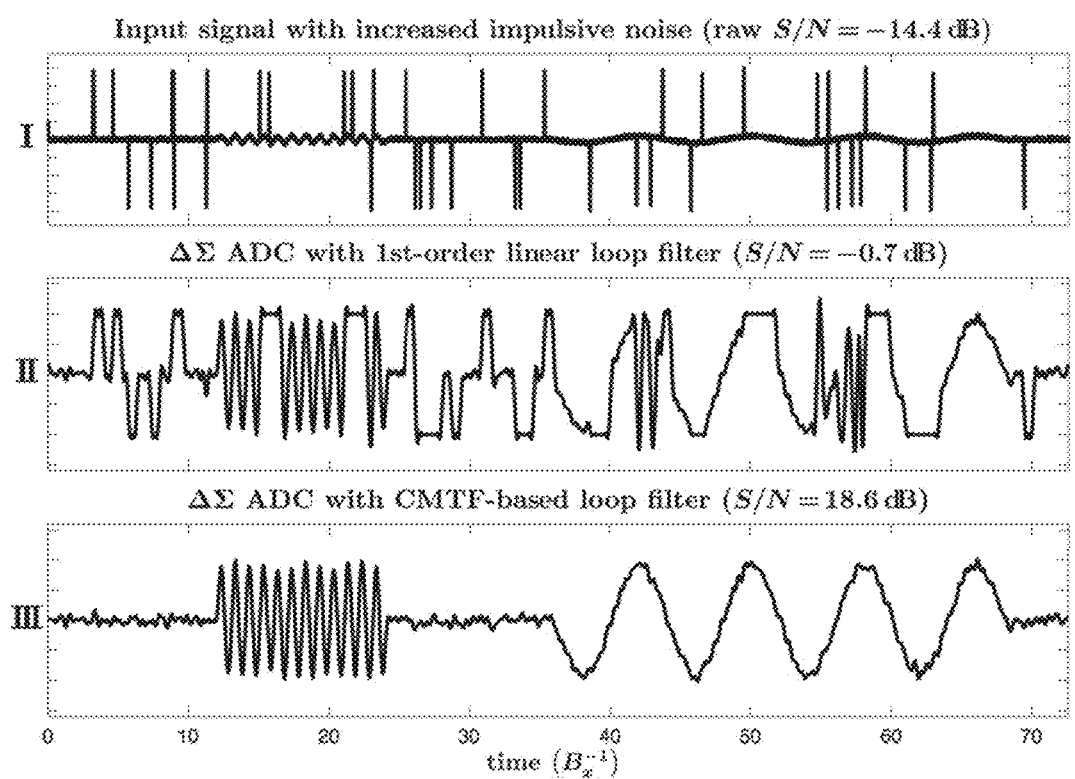

FIG. 31. Resistance of ΔΣ ADC with CMTF-based loop filter to increase in impulsive noise.

Figure 32:
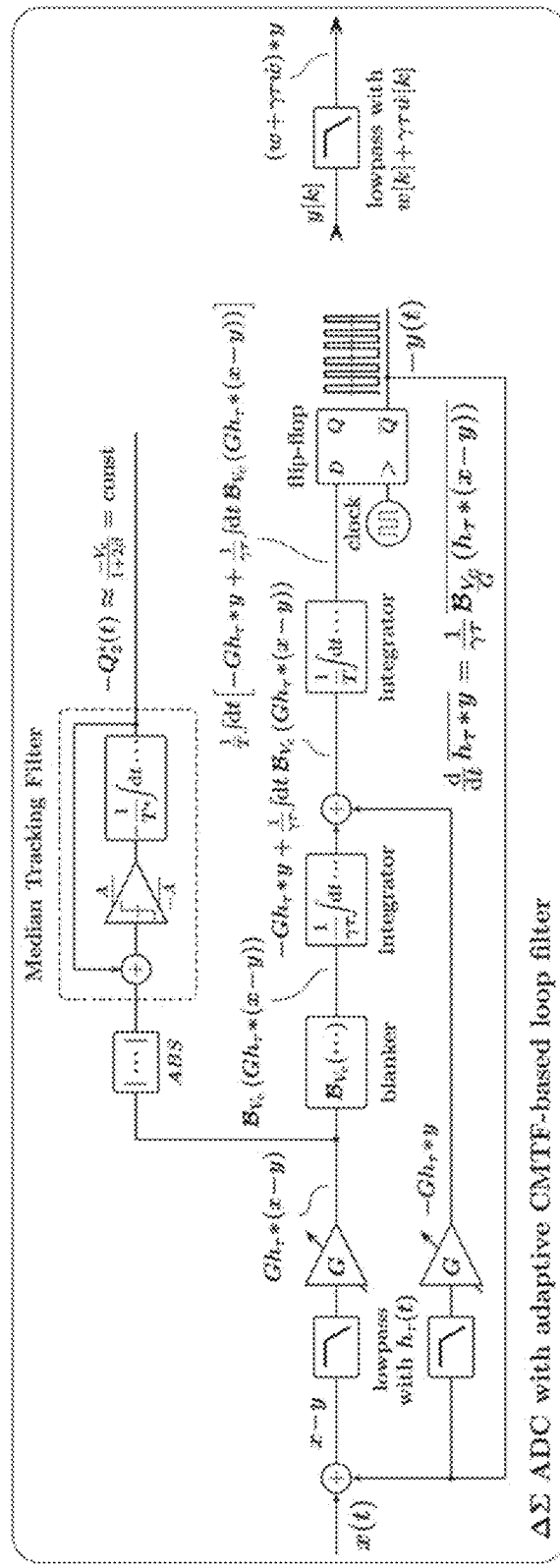

FIG. 32. Outline of ΔΣ ADC with adaptive CMTF-based loop filter.

Figure 33:
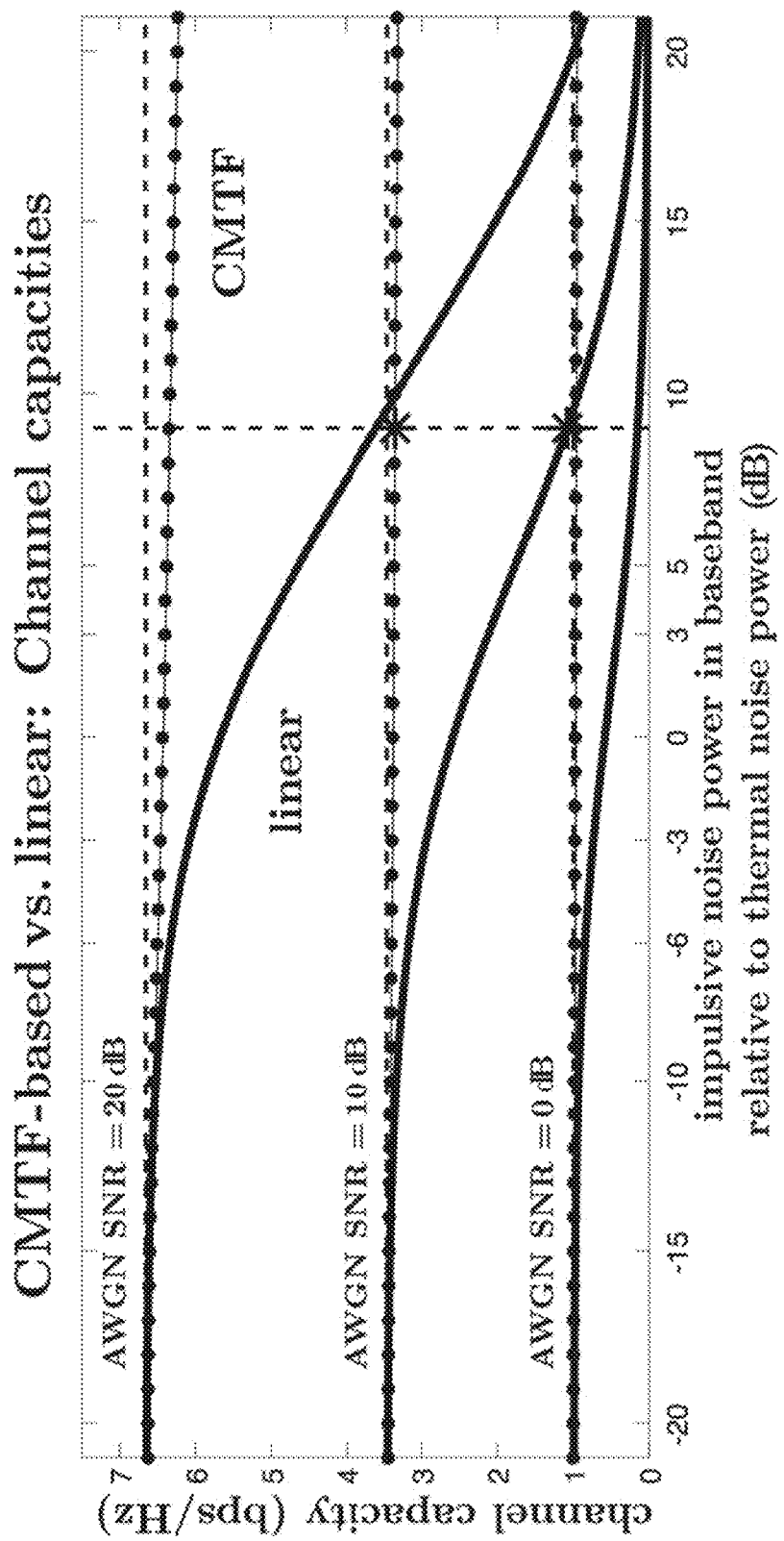

FIG. 33. Comparison of simulated channel capacities for the linear processing chain (solid lines) and the CMTF-based chains with β=1.5 (dotted lines). The meaning of the asterisks is explained in the text.

Figure 34A:
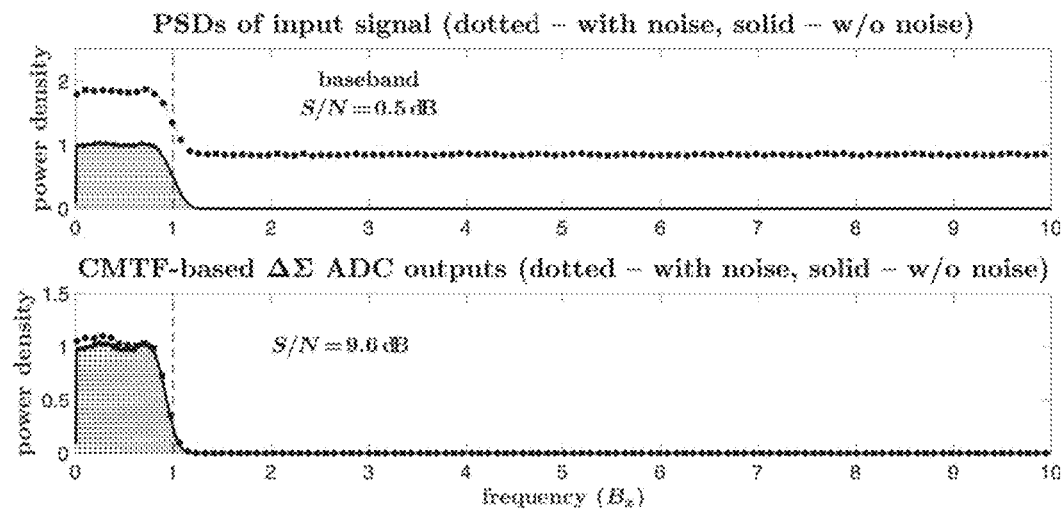

FIG. 34A. Reduction of the spectral density of impulsive noise in the signal baseband without affecting that of the signal of interest.

Figure 34B:
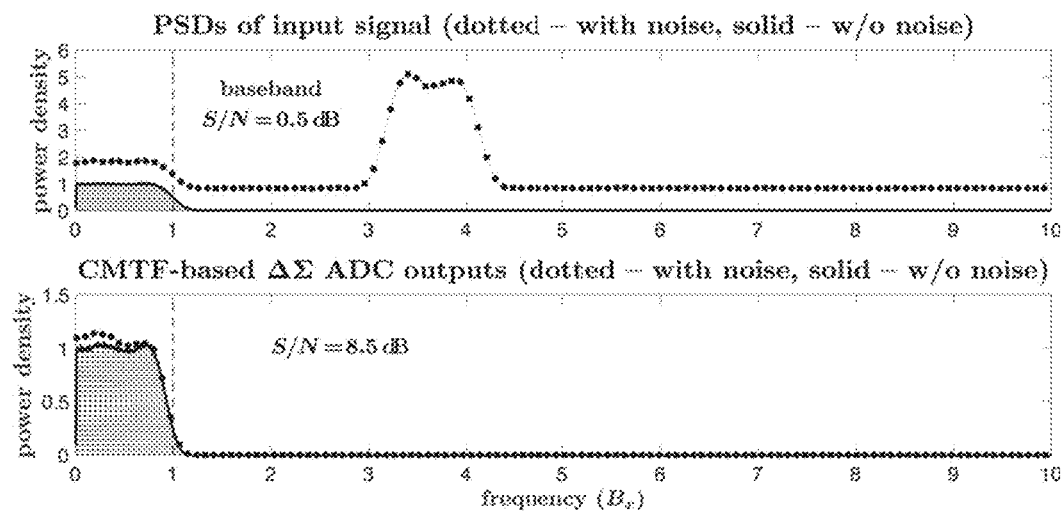

FIG. 34B. Reduction of the spectral density of impulsive noise in the signal baseband without affecting that of the signal of interest. (Illustration similar to FIG. 34A with additional interference in an adjacent channel.)

Figure 35:
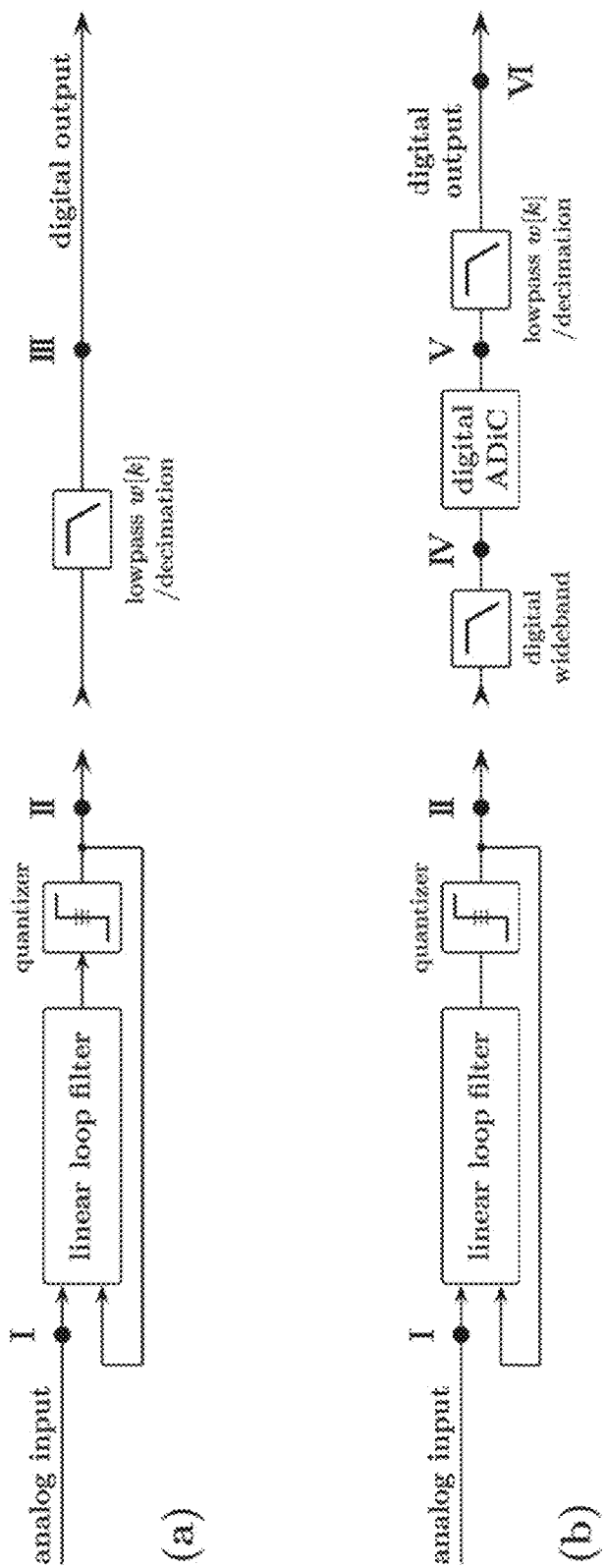

FIG. 35. Illustrative signal chains for a ΔΣ ADC with linear loop and decimation filters (panel (a)), and for a ΔΣ ADC with linear loop filter and ADiC-based digital filtering (panel (b)).

Figure 36:
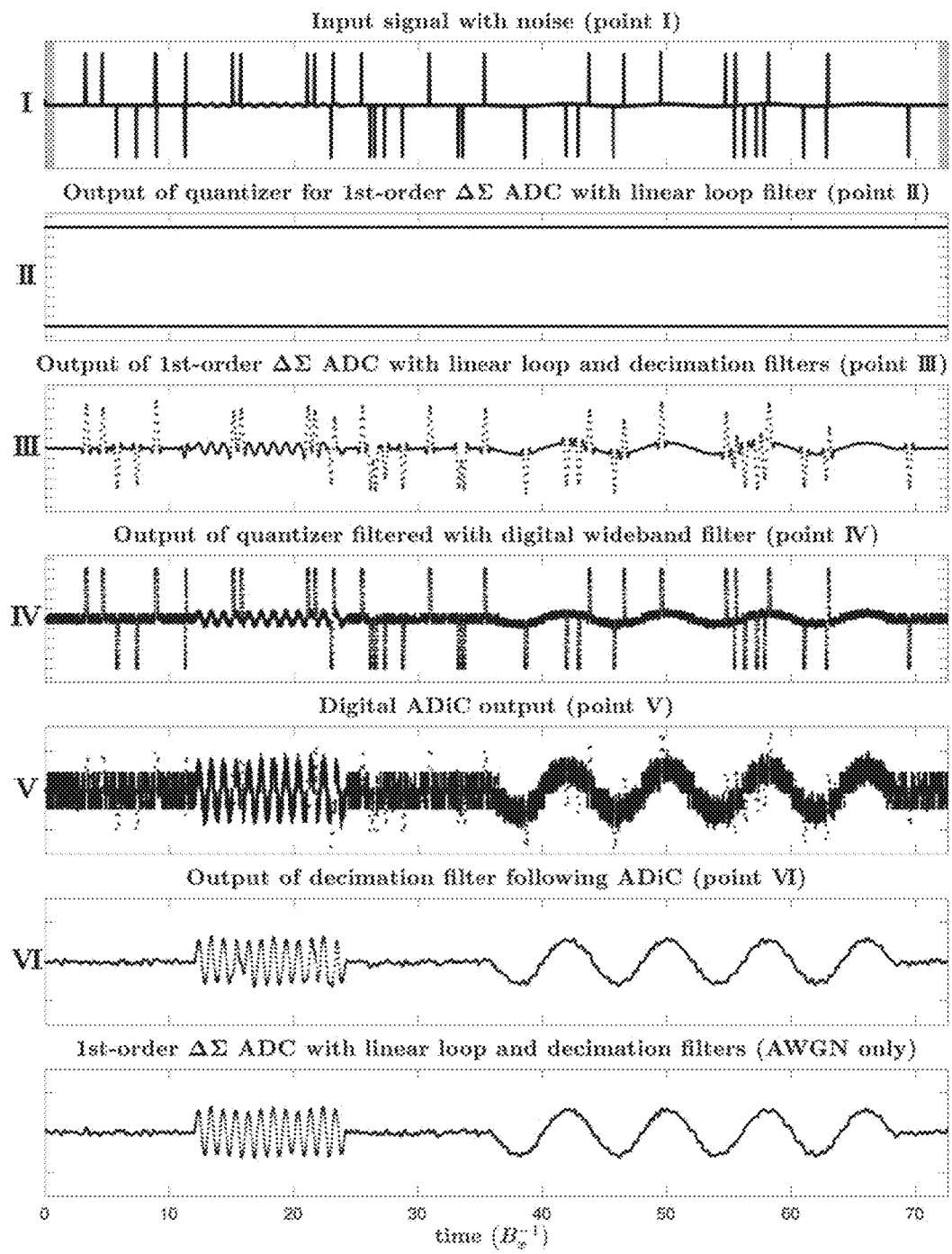

FIG. 36. Illustrative time-domain traces at points I through VI of FIG. 35, and the output of the ΔΣ ADC with linear loop and decimation filters for the signal affected by AWGN only (w/o impulsive noise).

Figure 37:
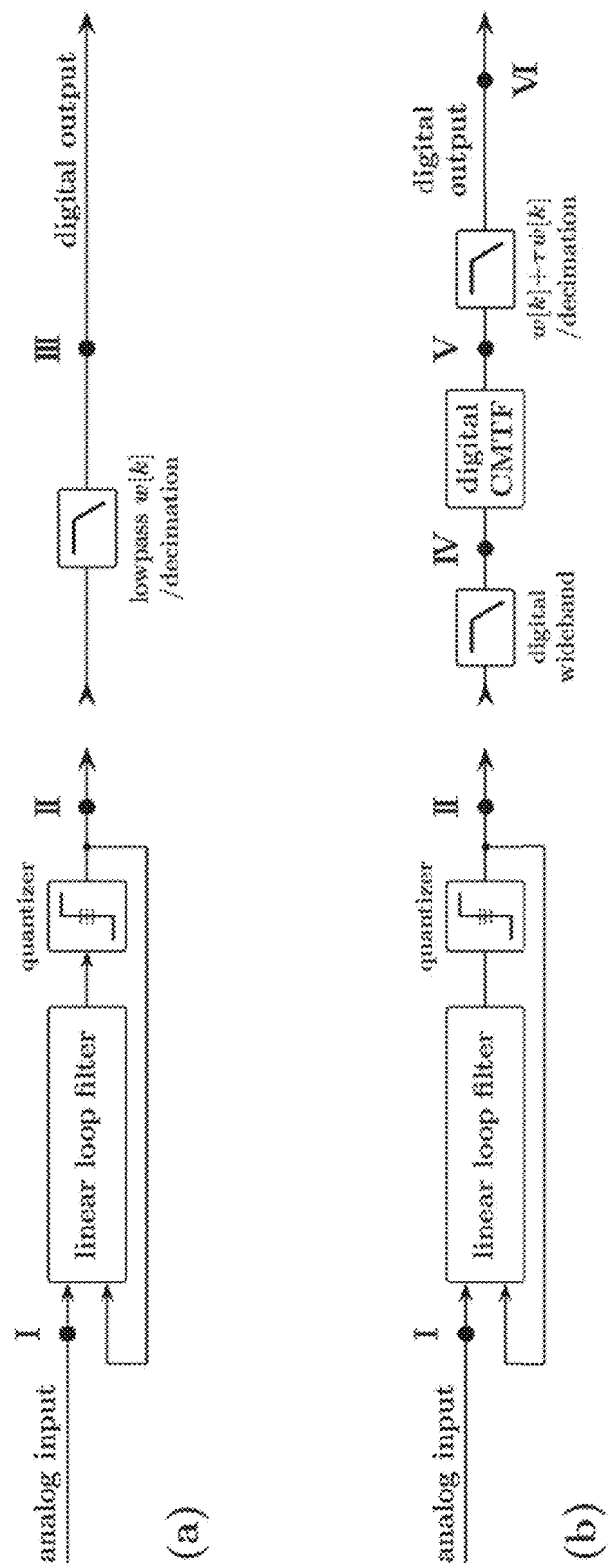

FIG. 37. Illustrative signal chains for a ΔΣ ADC with linear loop and decimation filters (panel (a)), and for a ΔΣ ADC with linear loop filter and CMTF-based digital filtering (panel (b)).

Figure 38:
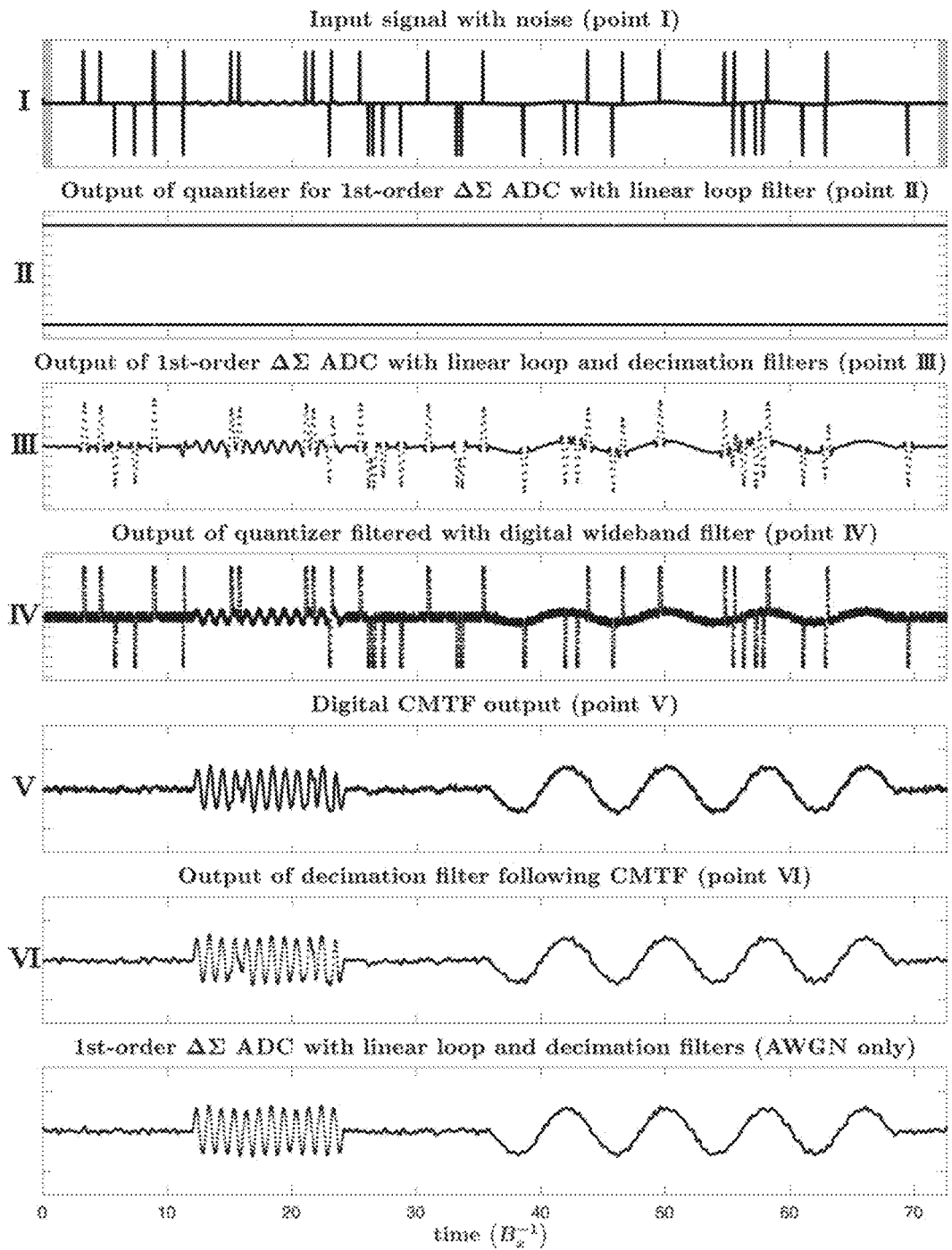

FIG. 38. Illustrative time-domain traces at points I through VI of FIG. 37, and the output of the ΔΣ ADC with linear loop and decimation filters for the signal affected by AWGN only (w/o impulsive noise).

Figure 39:
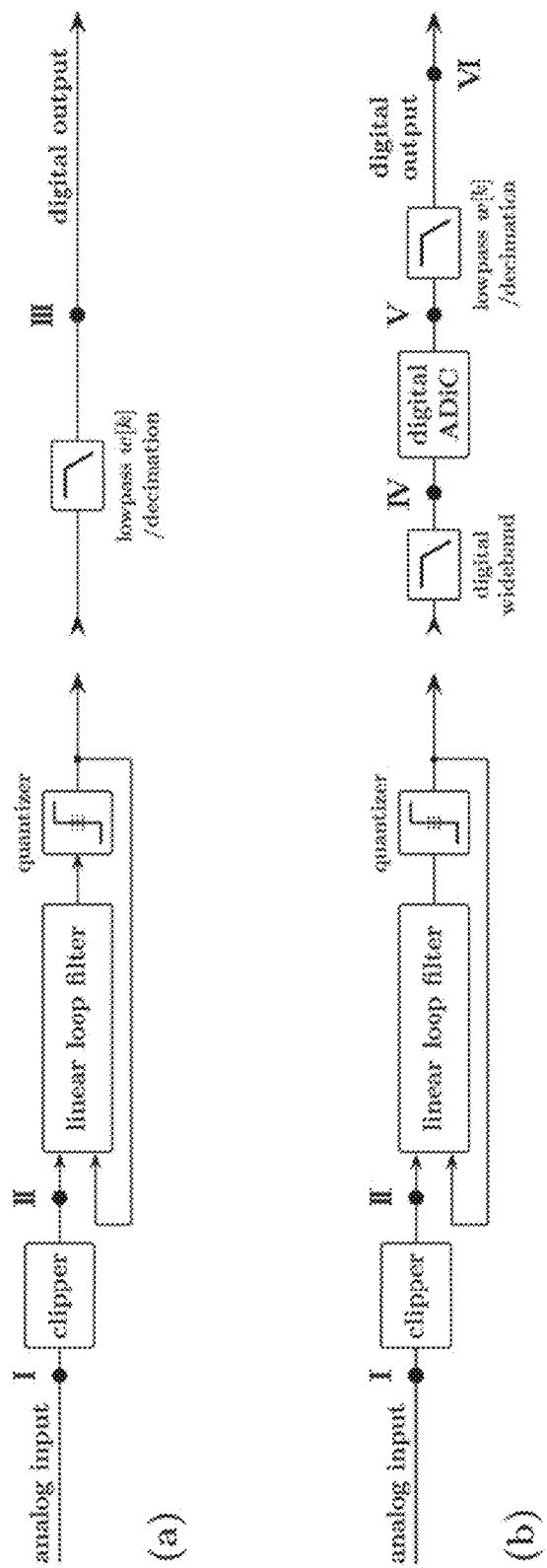

FIG. 39. Illustrative signal chains for a ΔΣ ADC with linear loop and decimation filters (panel (a)), and for a ΔΣ ADC with linear loop filter and ADiC-based digital filtering (panel (b)), with additional clipping of the analog input signal.

Figure 40:
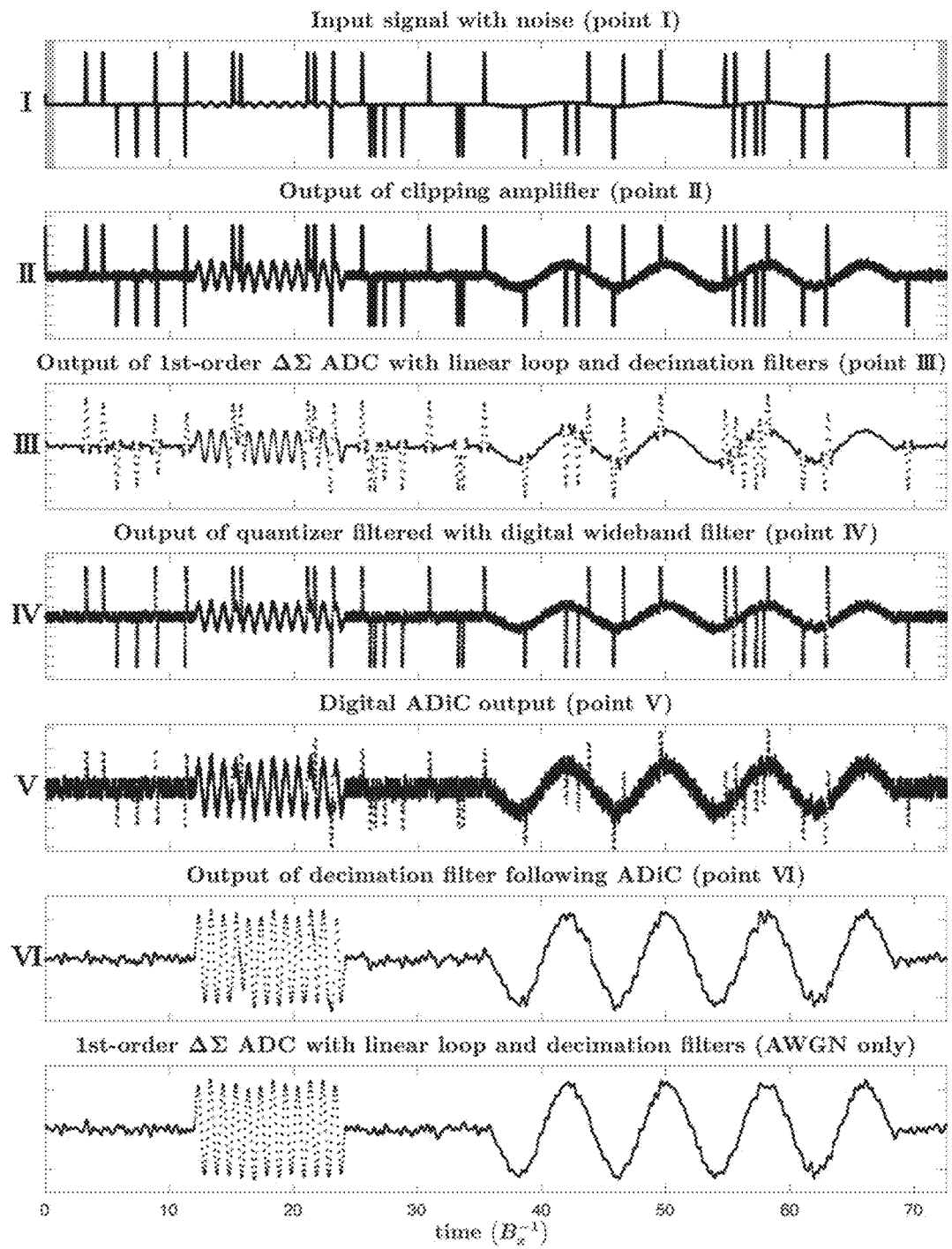

FIG. 40. Illustrative time-domain traces at points I through VI of FIG. 39, and the output of the ΔΣ ADC with linear loop and decimation filters for the signal affected by AWGN only (w/o impulsive noise).

Figure 41:
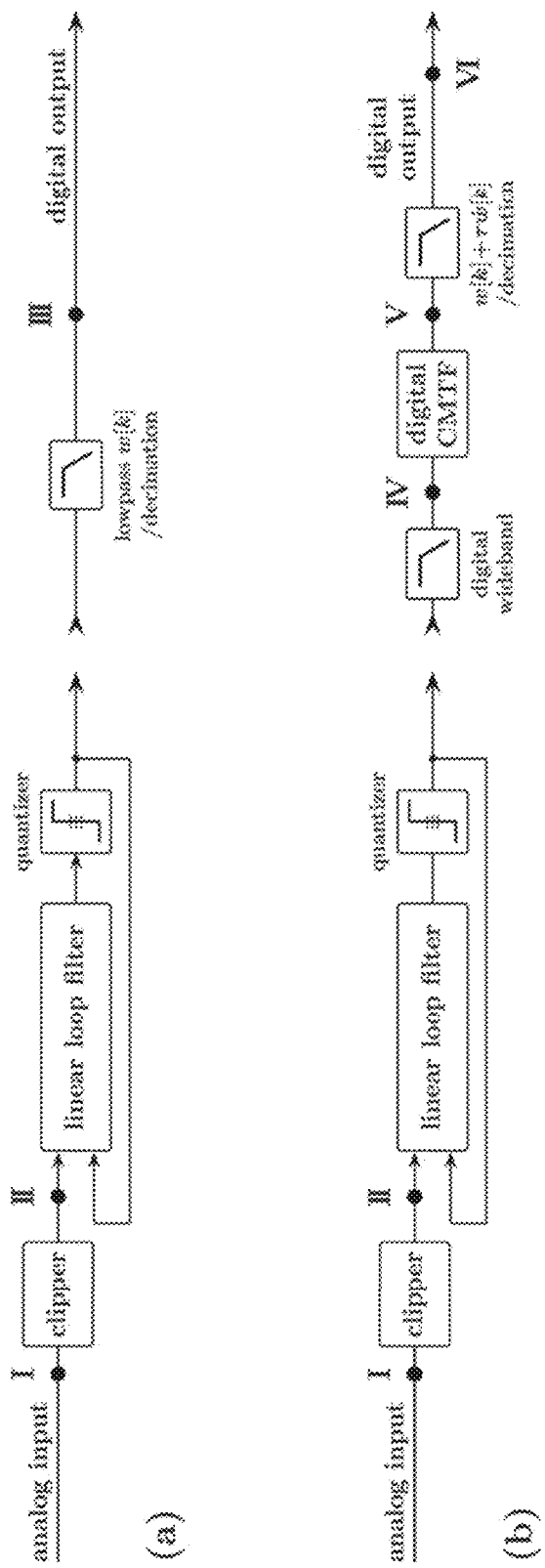

FIG. 41. Illustrative signal chains for a ΔΣ ADC with linear loop and decimation filters (panel (a)), and for a ΔΣ ADC with linear loop filter and CMTF-based digital filtering (panel (b)), with additional clipping of the analog input signal.

Figure 42:
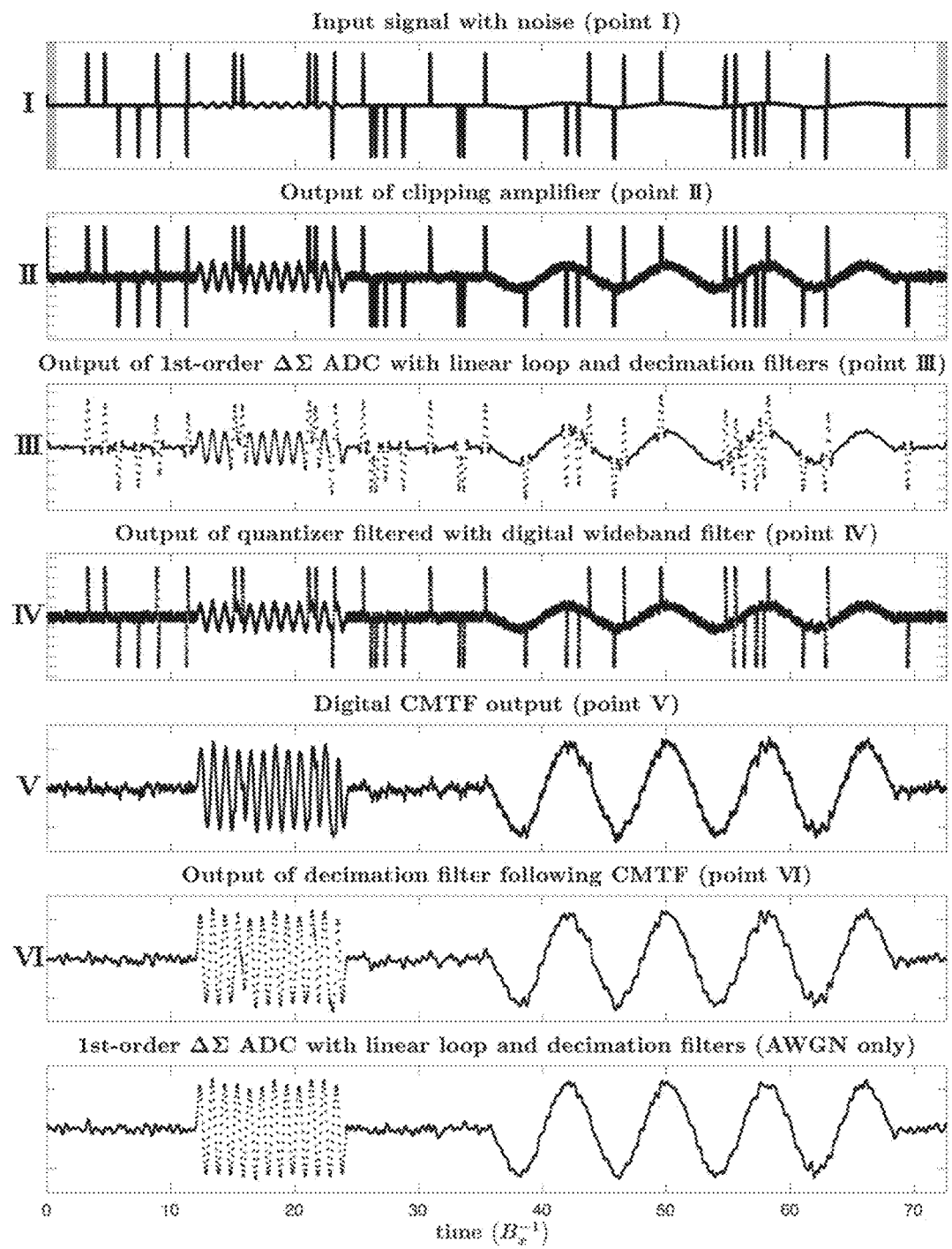

FIG. 42. Illustrative time-domain traces at points I through VI of FIG. 41, and the output of the ΔΣ ADC with linear loop and decimation filters for the signal affected by AWCN only (w/o impulsive noise).

Figure 43:
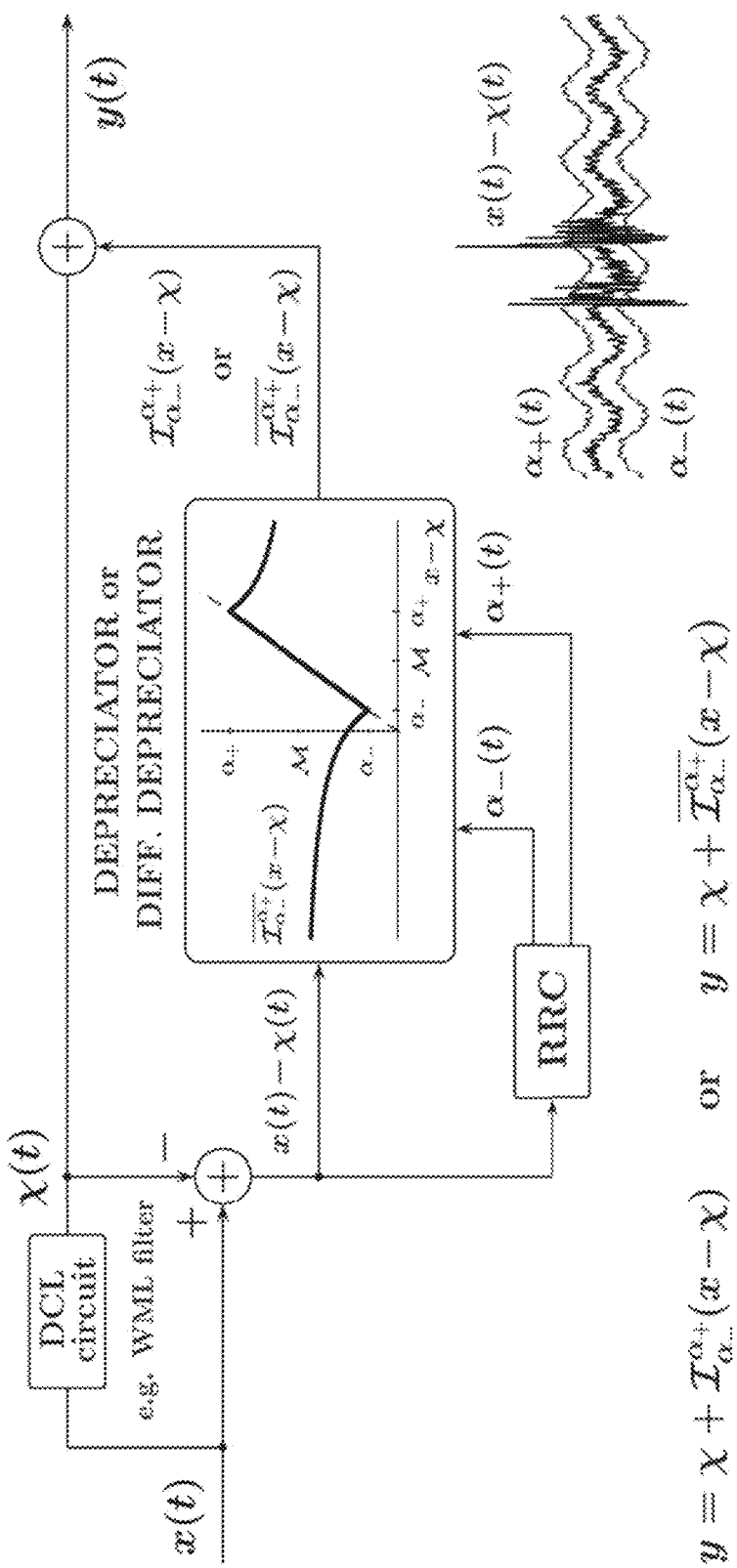

FIG. 43. Alternative ADiC structure.

Figure 44:
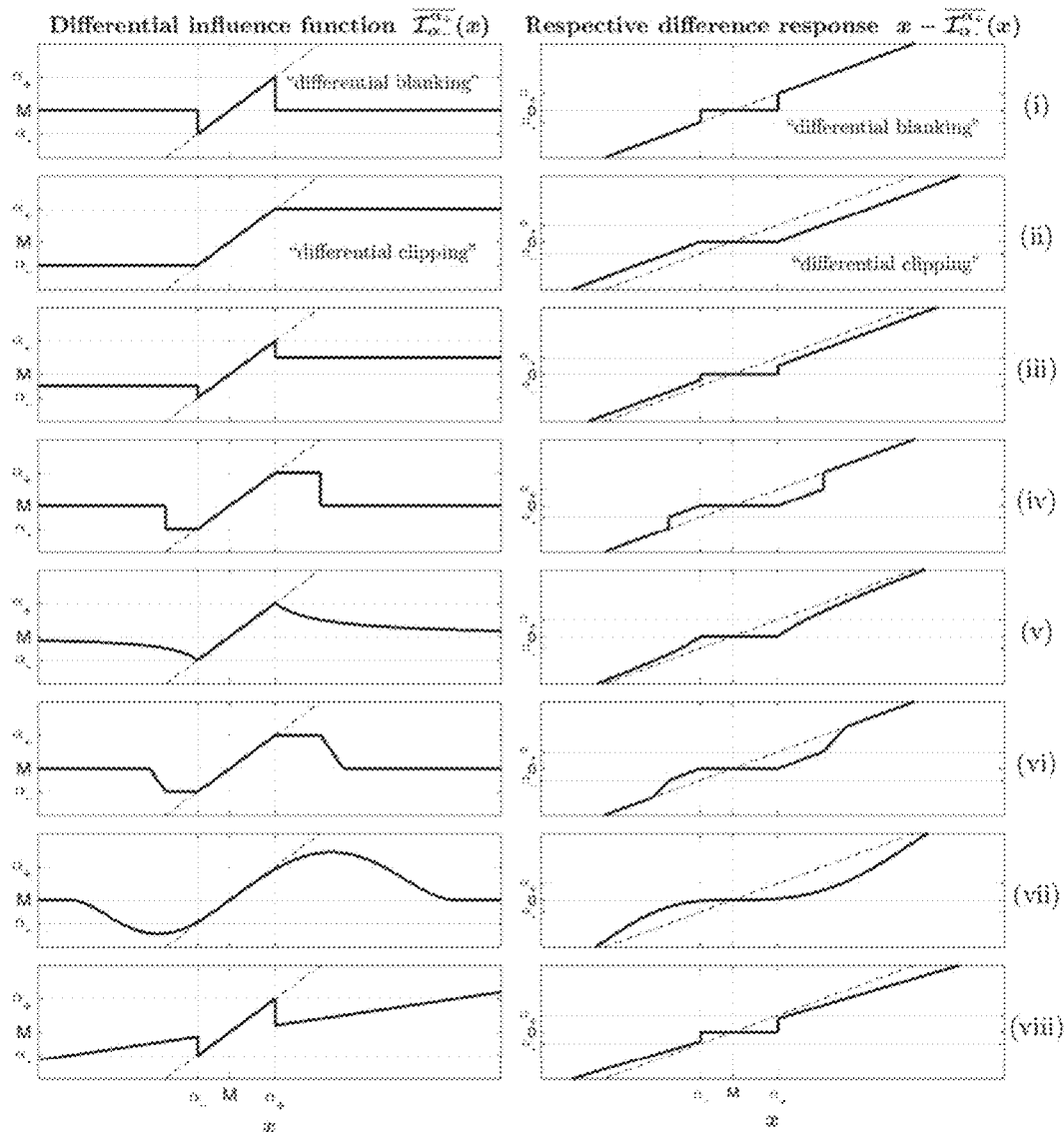

FIG. 44. Illustrative examples of differential influence functions and their respective difference responses.

Figure 45:
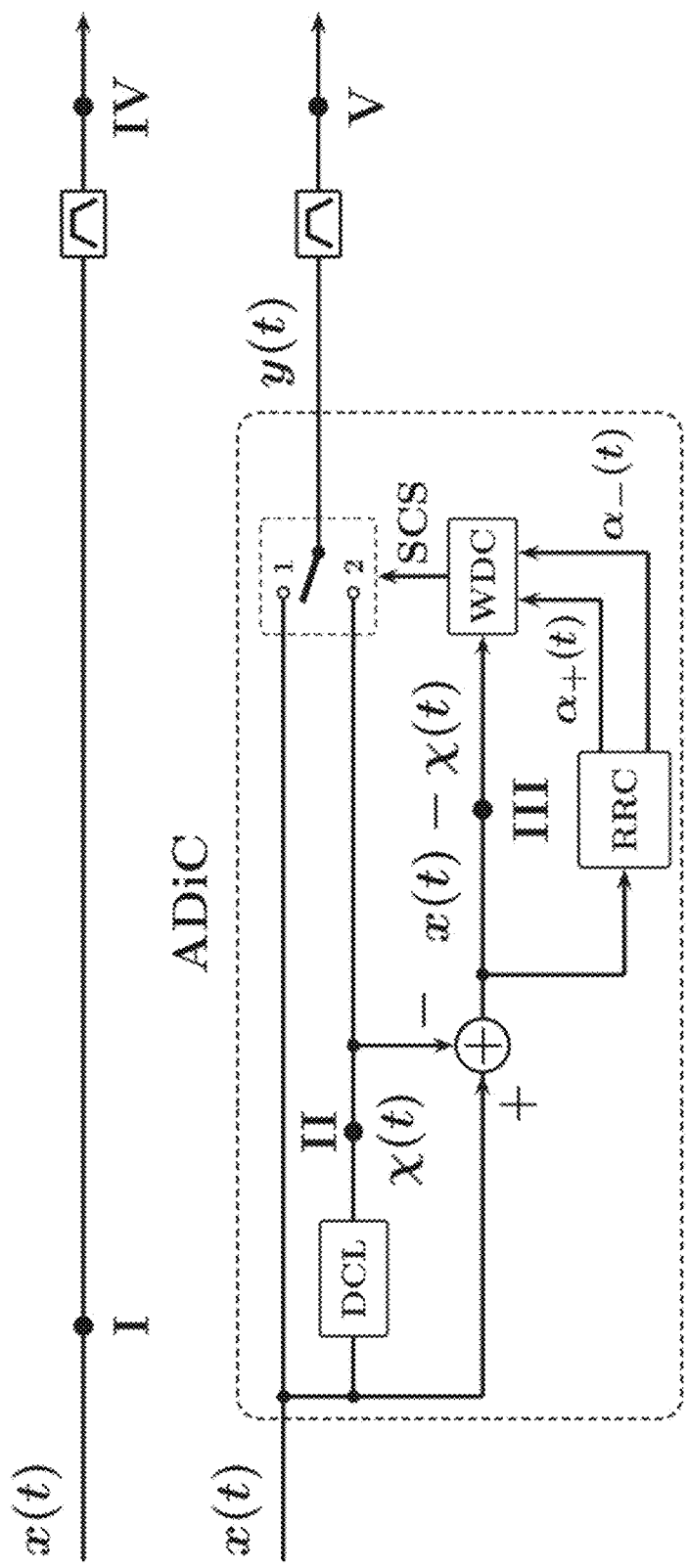

FIG. 45. Alternative ADiC structure with a boxcar depreciator.

Figure 46:
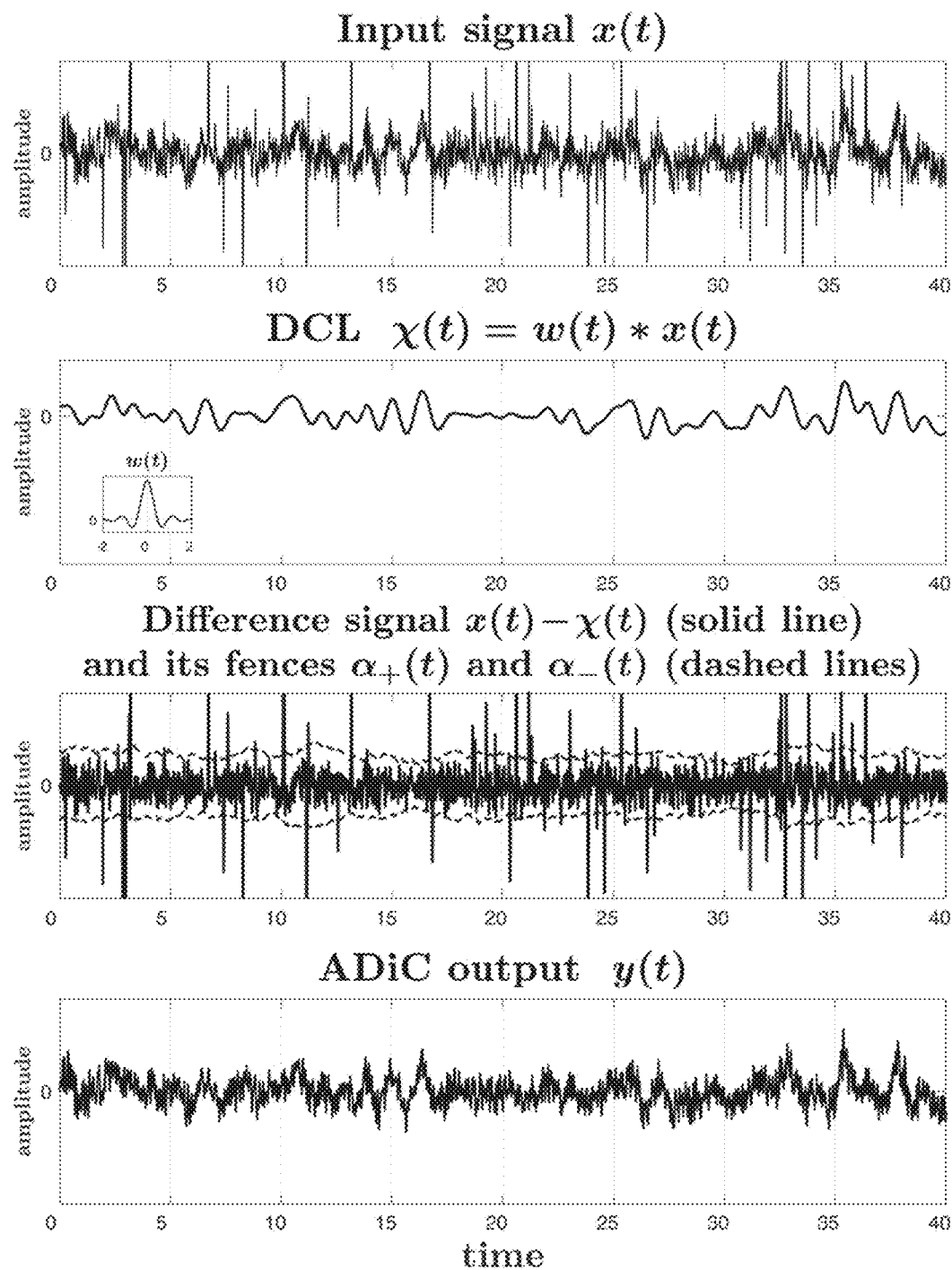

FIG. 46. Illustrative signal traces for the ADiC shown in FIG. 45 with the DCL established by a linear lowpass filter.

Figure 47:
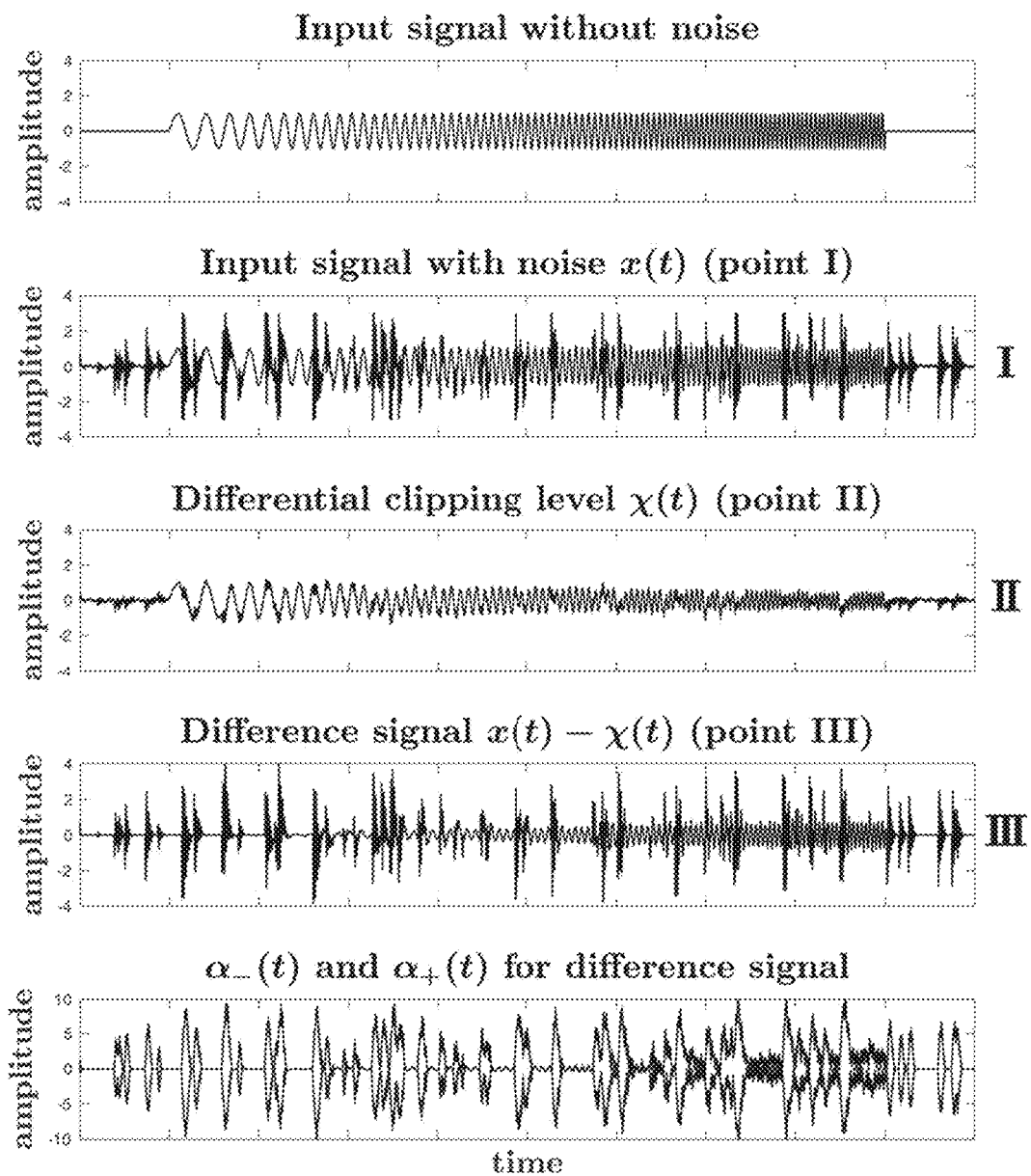

FIG. 47. Illustrative signal traces for the ADiC shown in FIG. 45 with the DCL established by a TTF.

Figure 48:
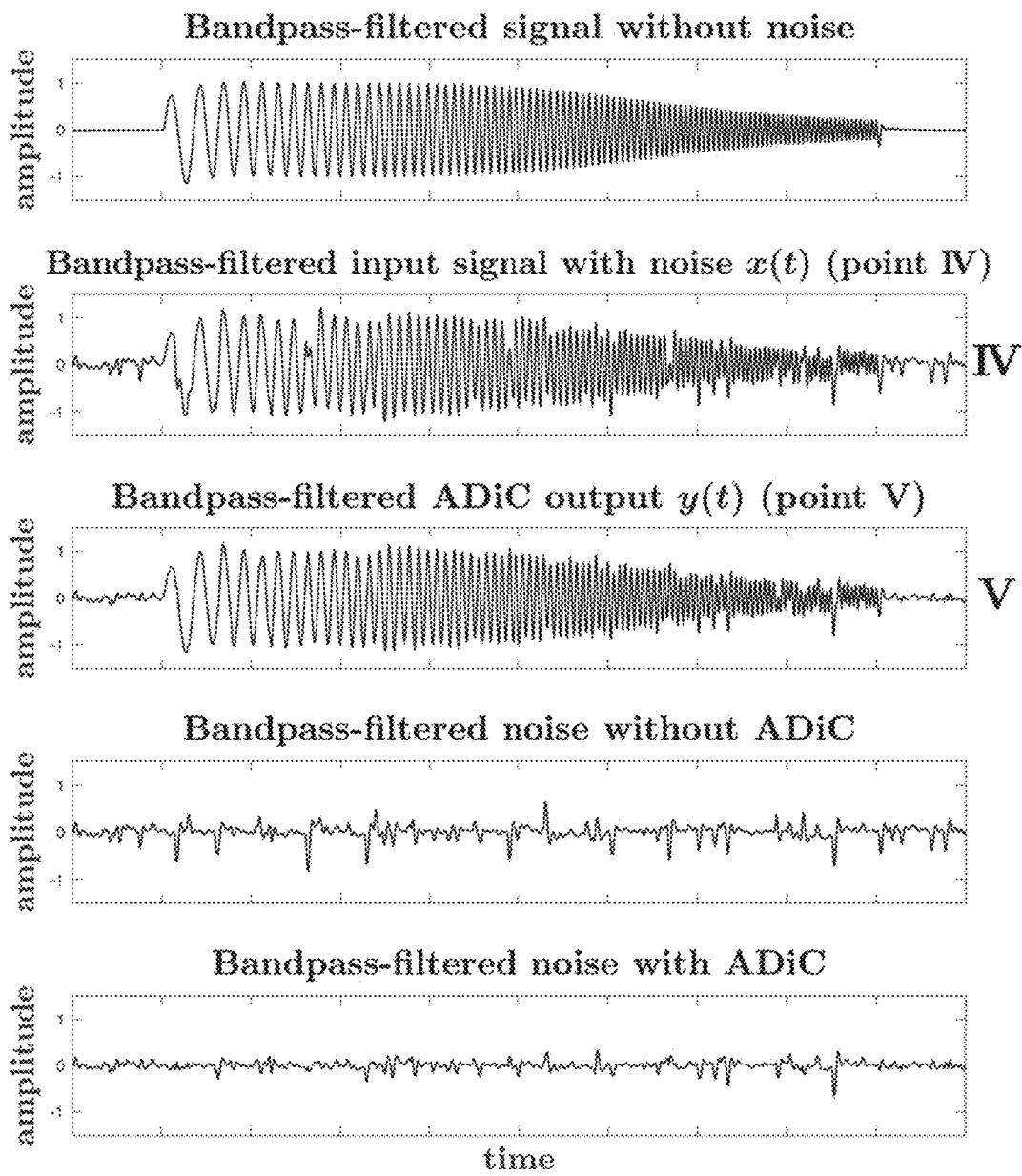

FIG. 48. Illustrative signal traces for the ADiC shown in FIG. 45 with the DCL established by a TTF (continued).

Figure 49:
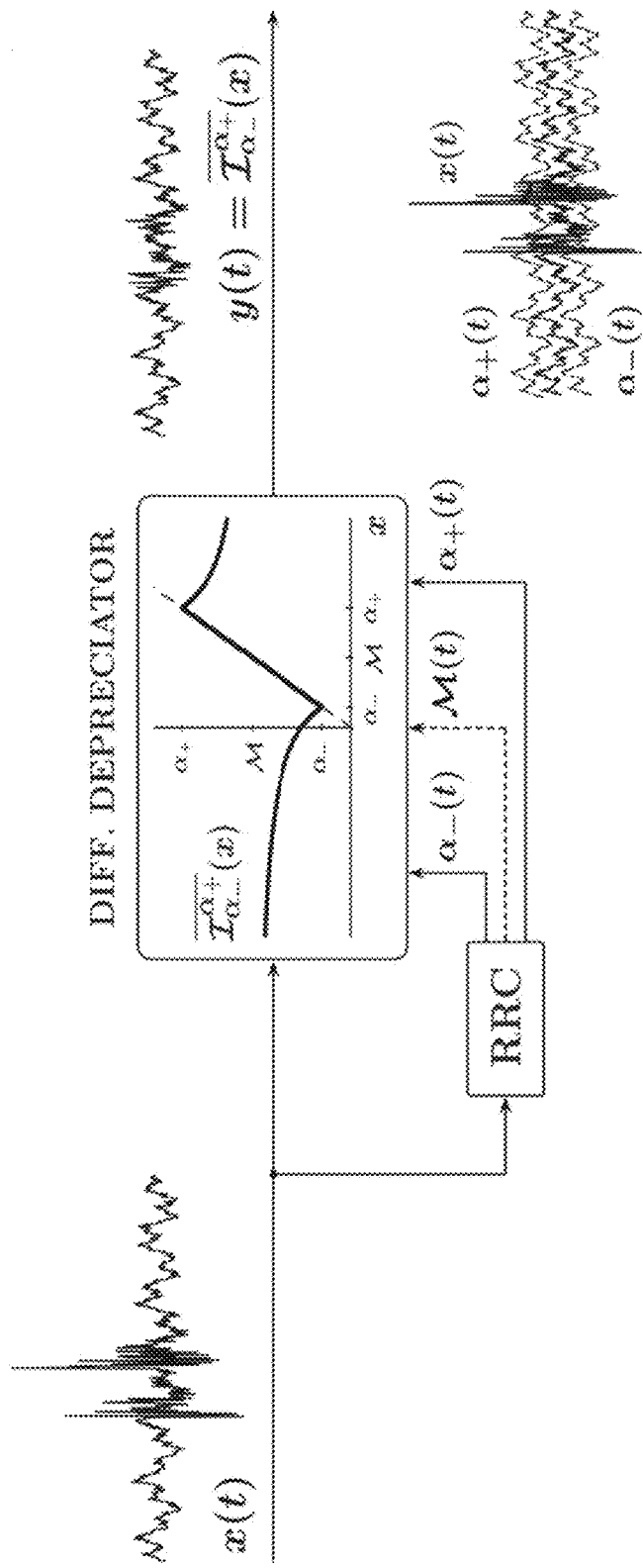

FIG. 49. Simplified ADiC structure.

Figure 50:
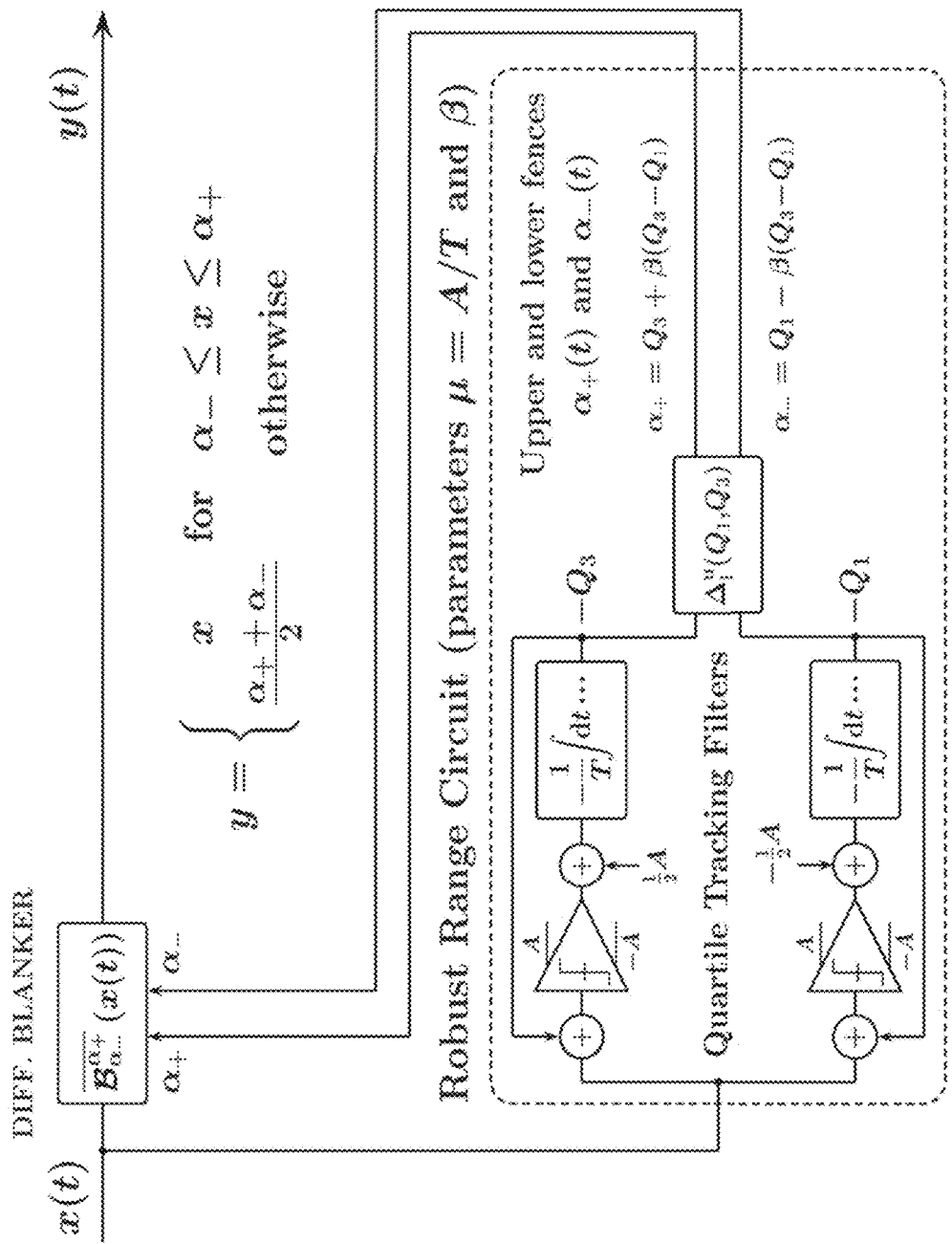

FIG. 50. Example of a simplified ADiC structure with a differential blanker as a depreciator.

Figure 51:
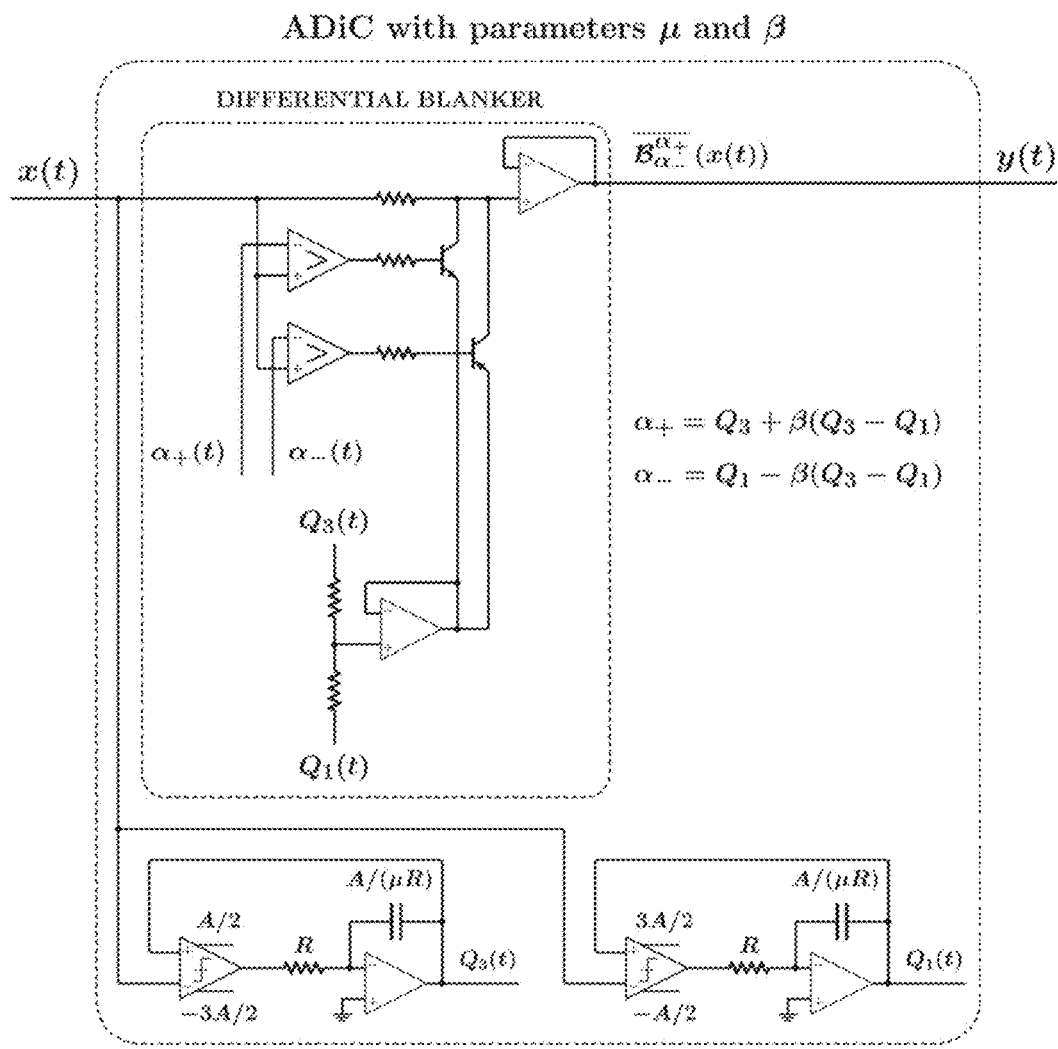

FIG. 51. Illustrative electronic circuit for the ADiC structure shown in FIG. 50.

Figure 52:
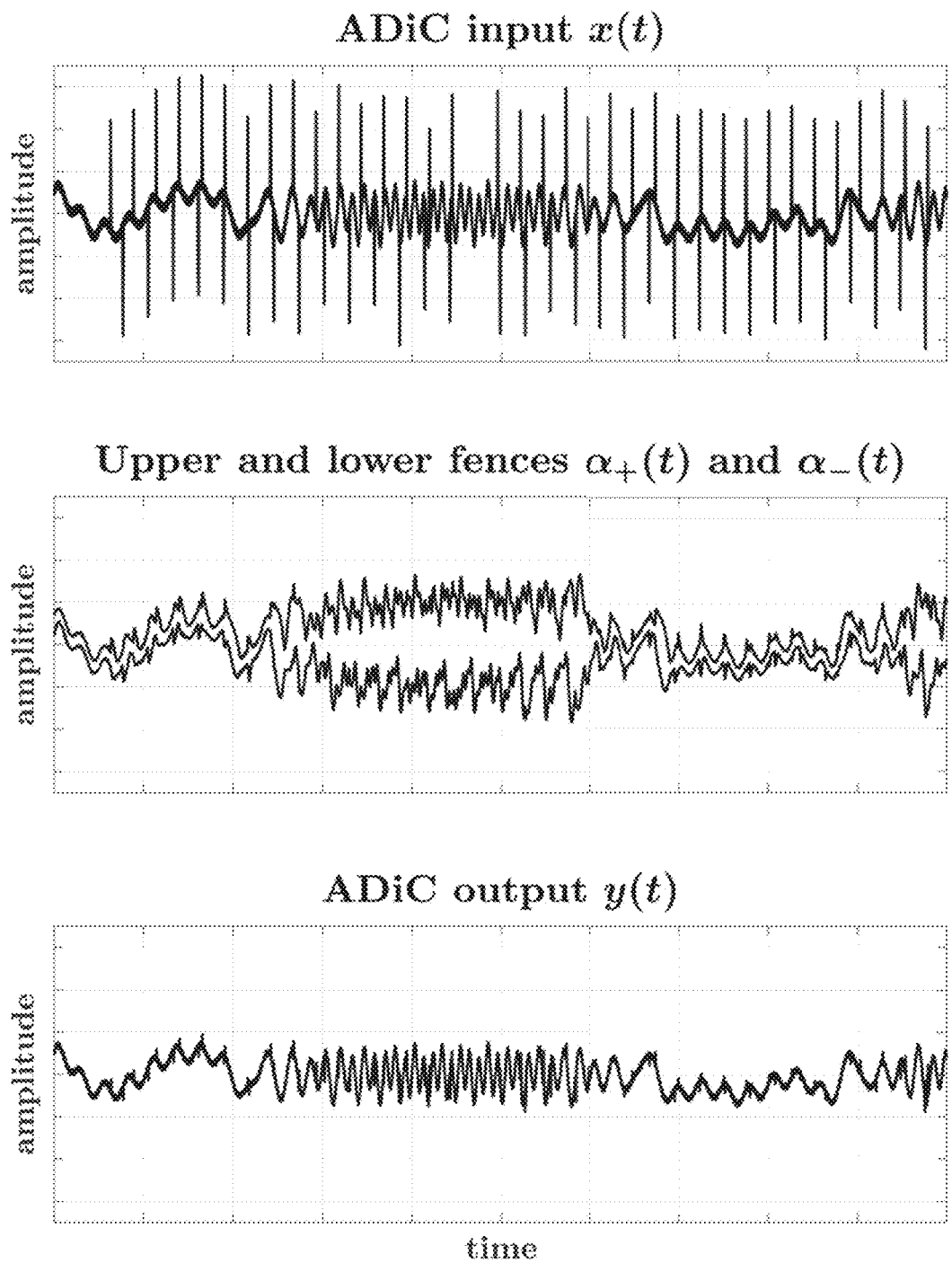

FIG. 52. Illustrative signal traces for the ADiC shown in FIG. 51 (LTspice simulation).

Figure 53:
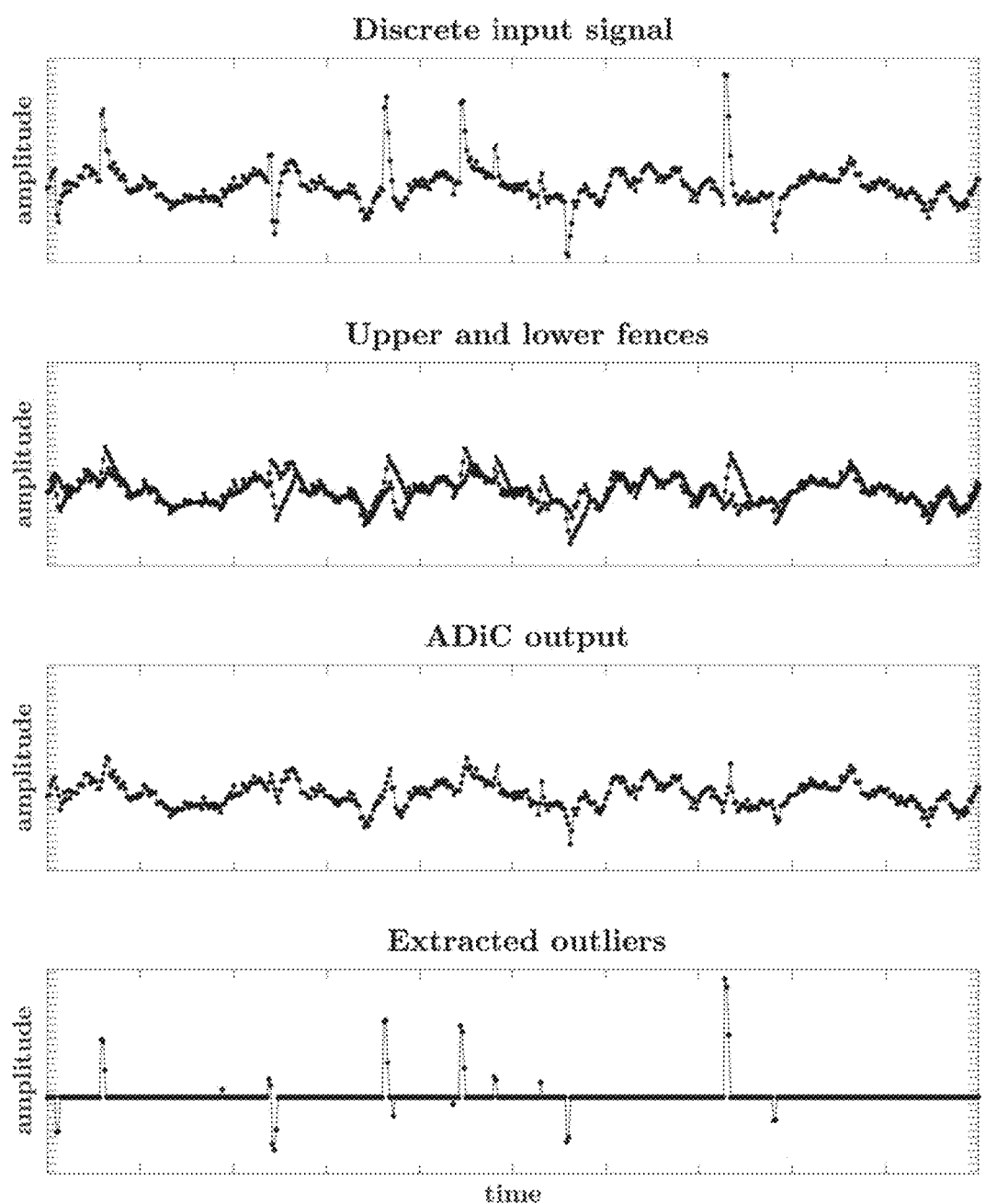

FIG. 53. Example of applying a numerical version of an ADiC described in Section 8 to the input signal used in FIG. 15.

Figure 54:
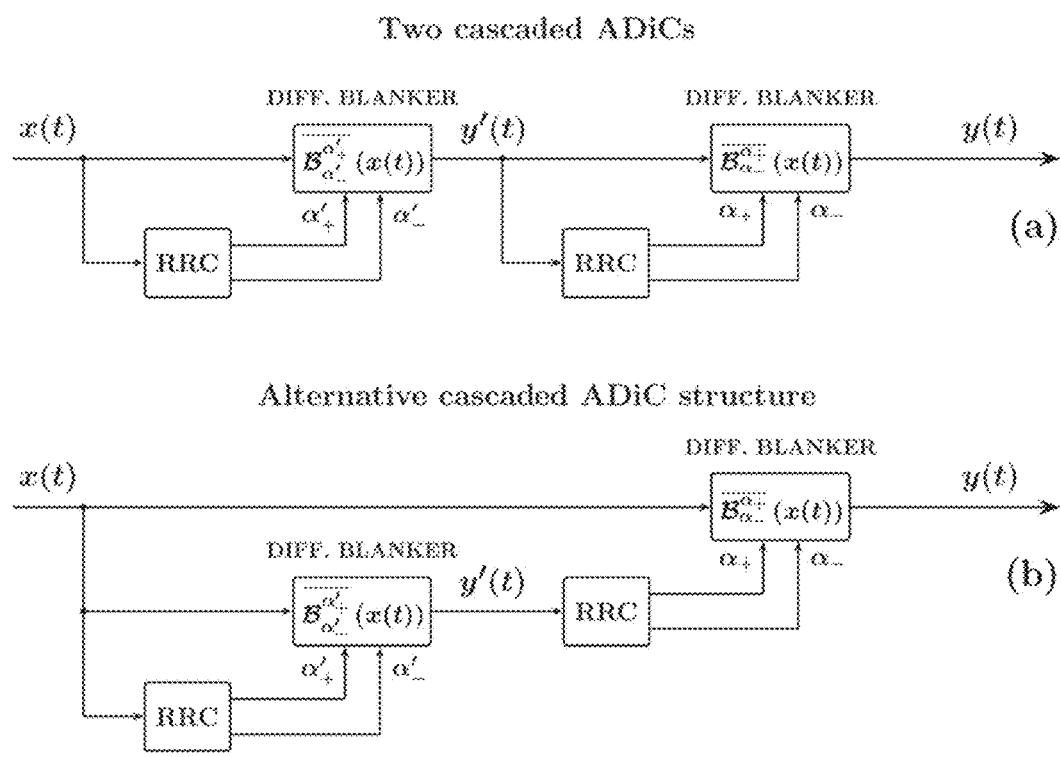

FIG. 54. Two cascaded ADiCs (panel (a)), and an alternative cascaded ADiC structure (panel (b)).

Figure 55:
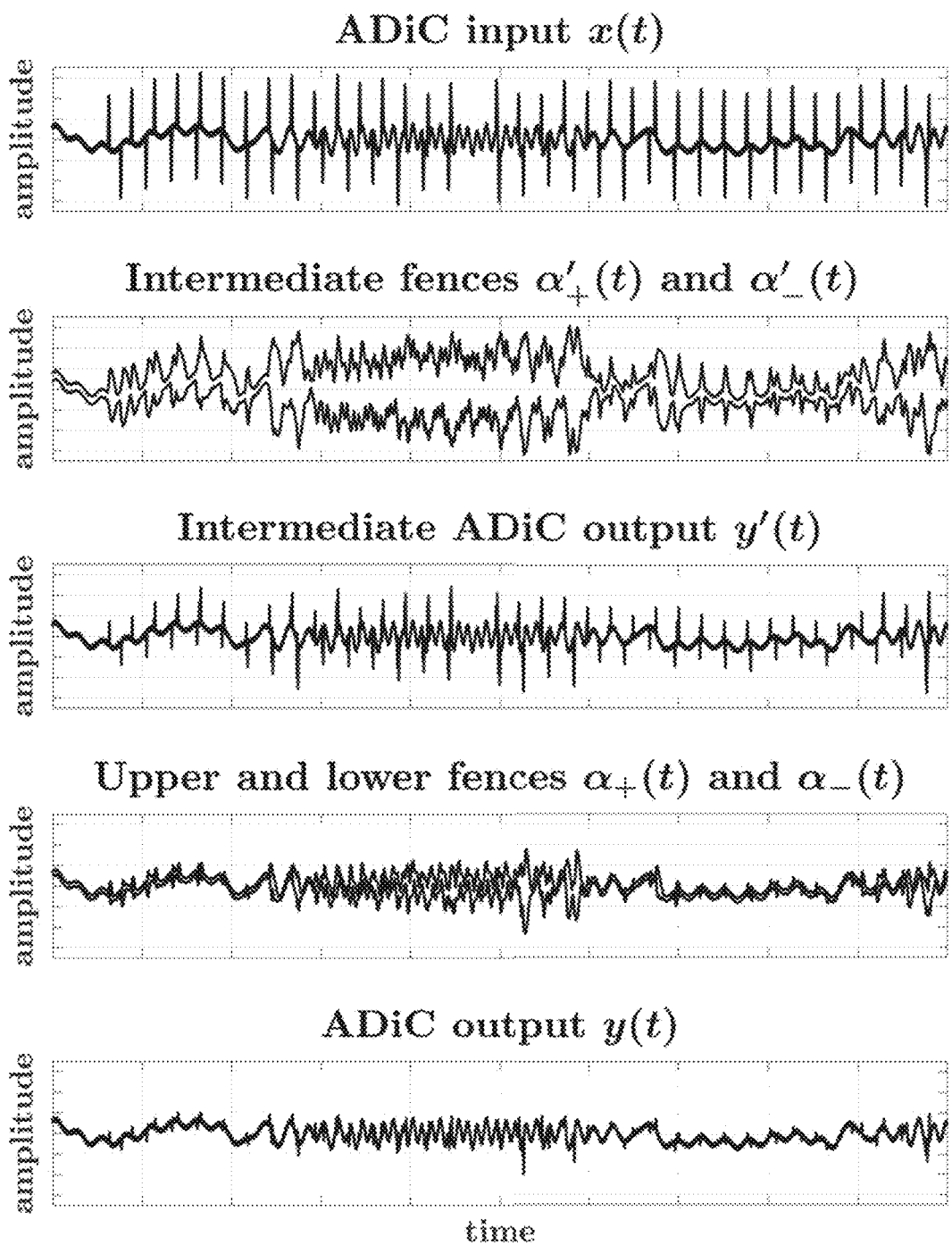

FIG. 55. Illustrative time-domain traces for the ADiC structures shown in FIG. 54.

Figure 56:
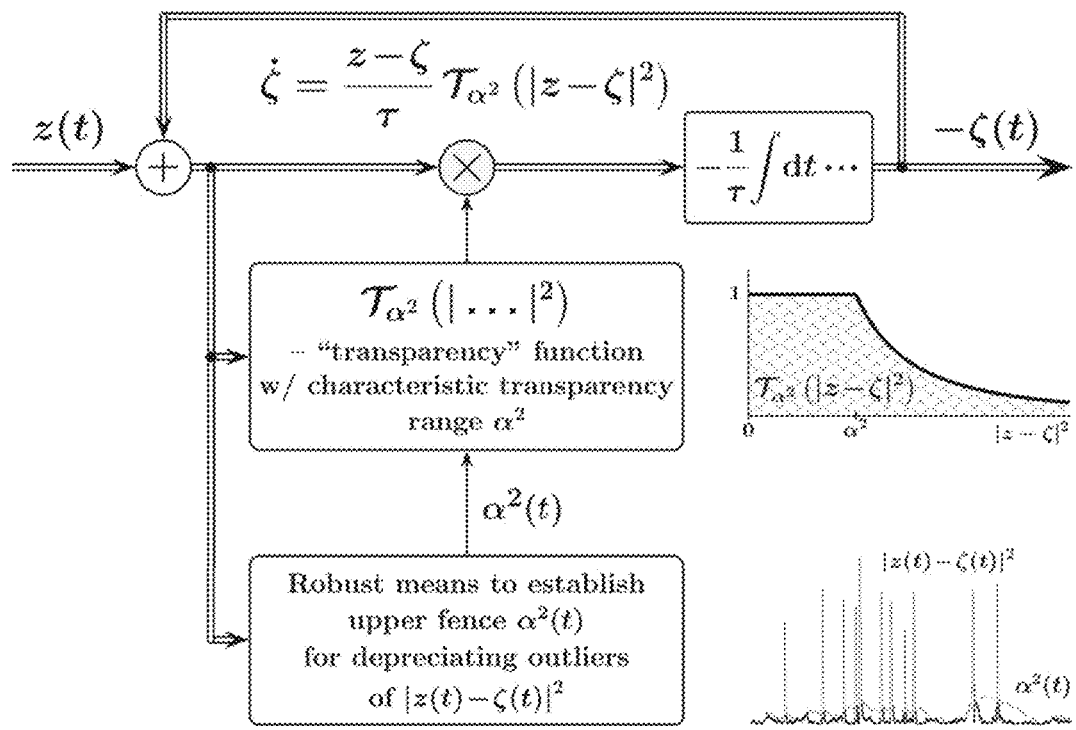

FIG. 56. Illustrative block diagram of a complex-valued CMTF.

Figure 57:
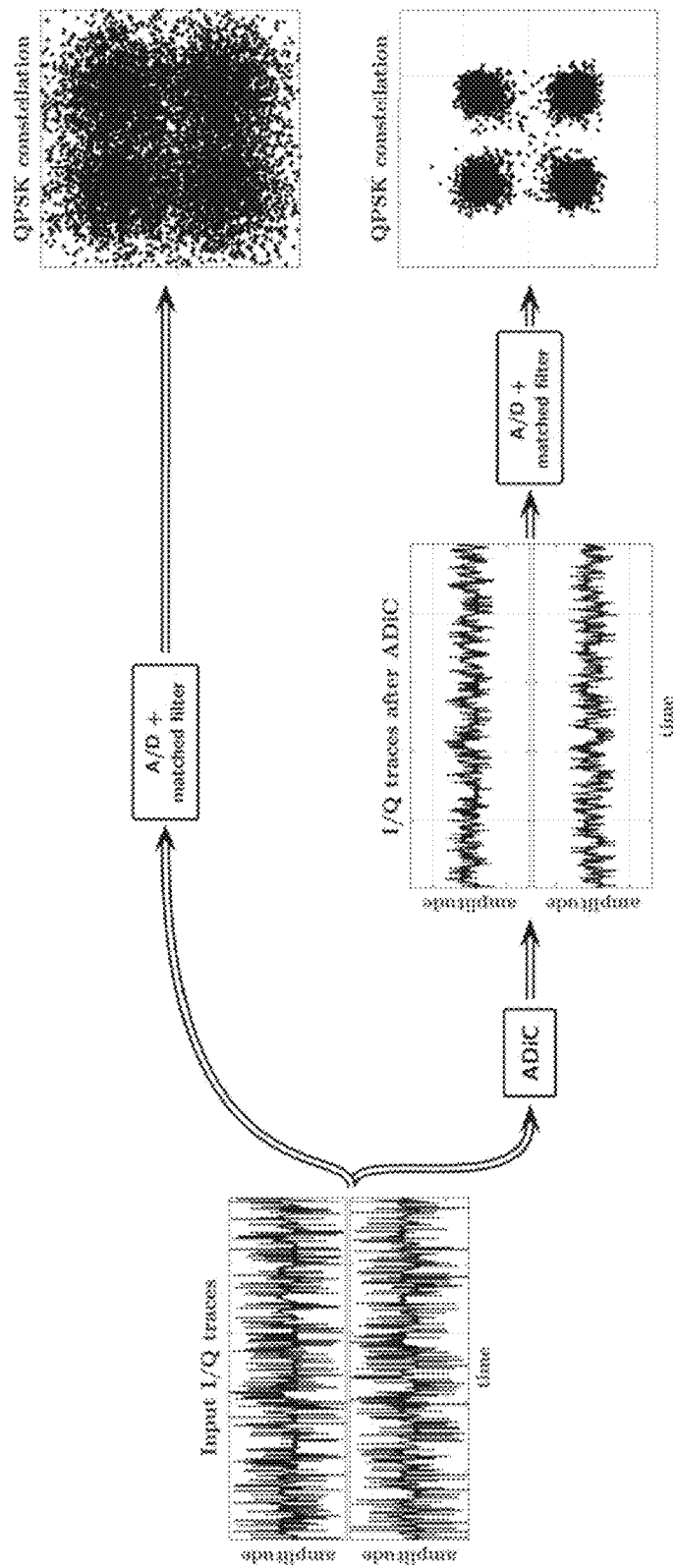

FIG. 57. Illustrative use of a complex-valued ADiC for interference mitigation in a quadrature receiver (QPSK-modulated signal).

Figure 58:
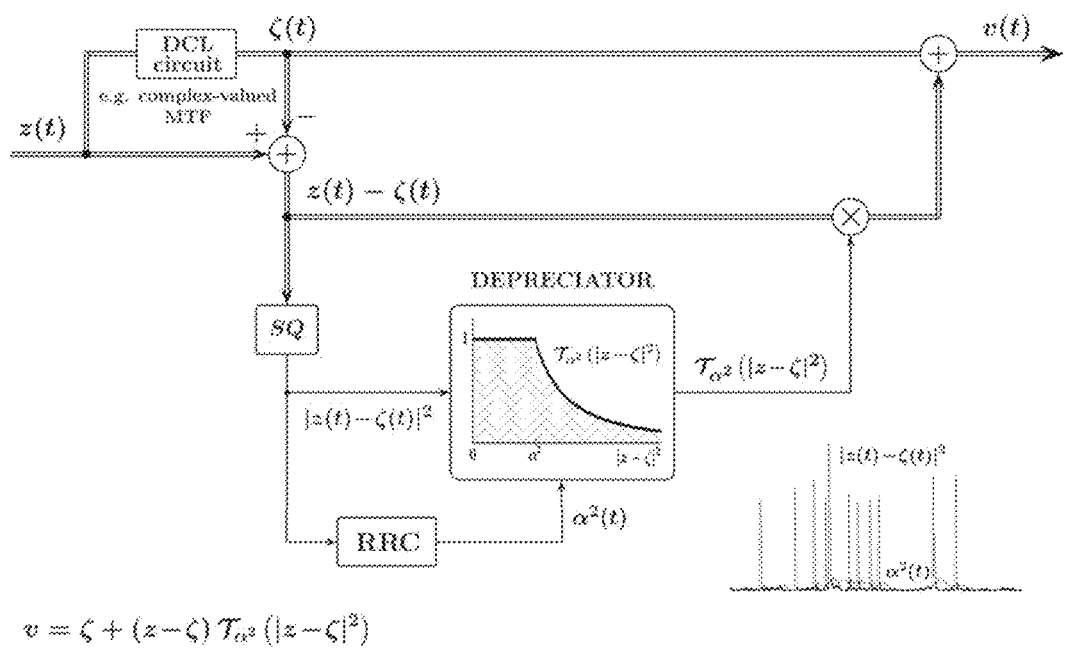

FIG. 58. Example of complex-valued ADiC structure.

Figure 59:
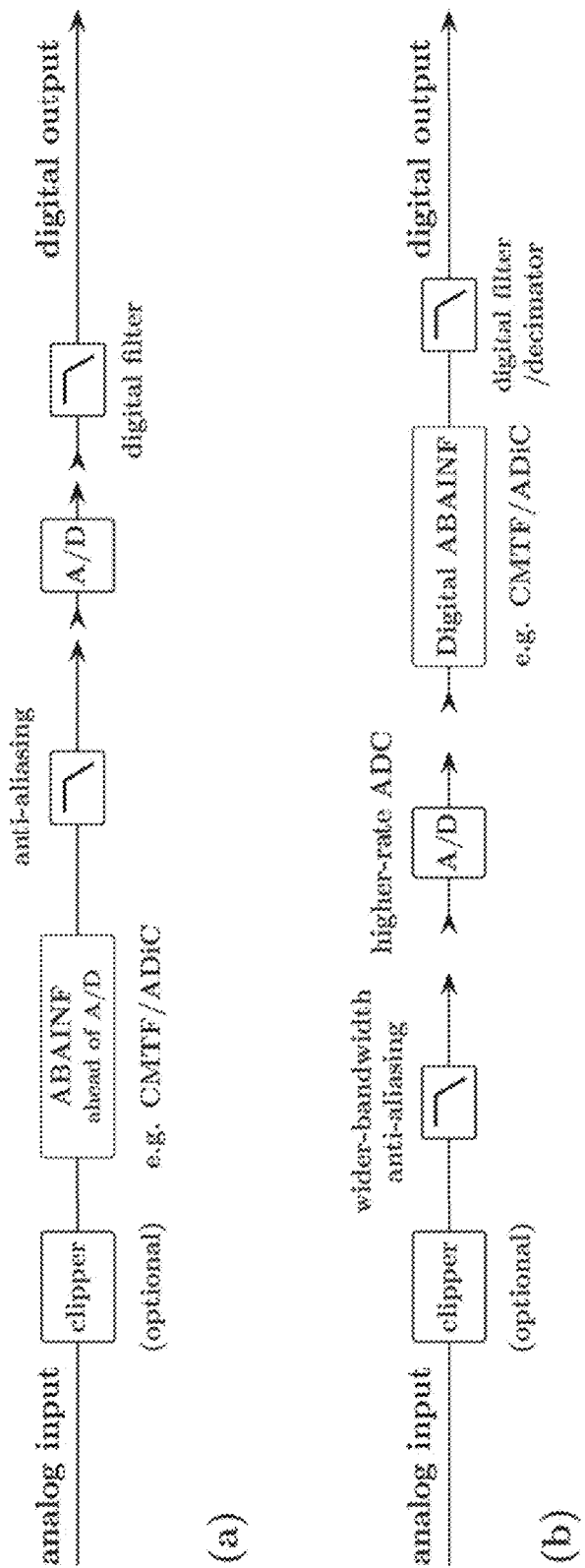

FIG. 59. Analog (panel (a)) and digital (panel (b)) ABAINF deployment for mitigation of non-Gaussian (e.g. outlier) noise in the process of analog-to-digital conversion.

Figure 60:
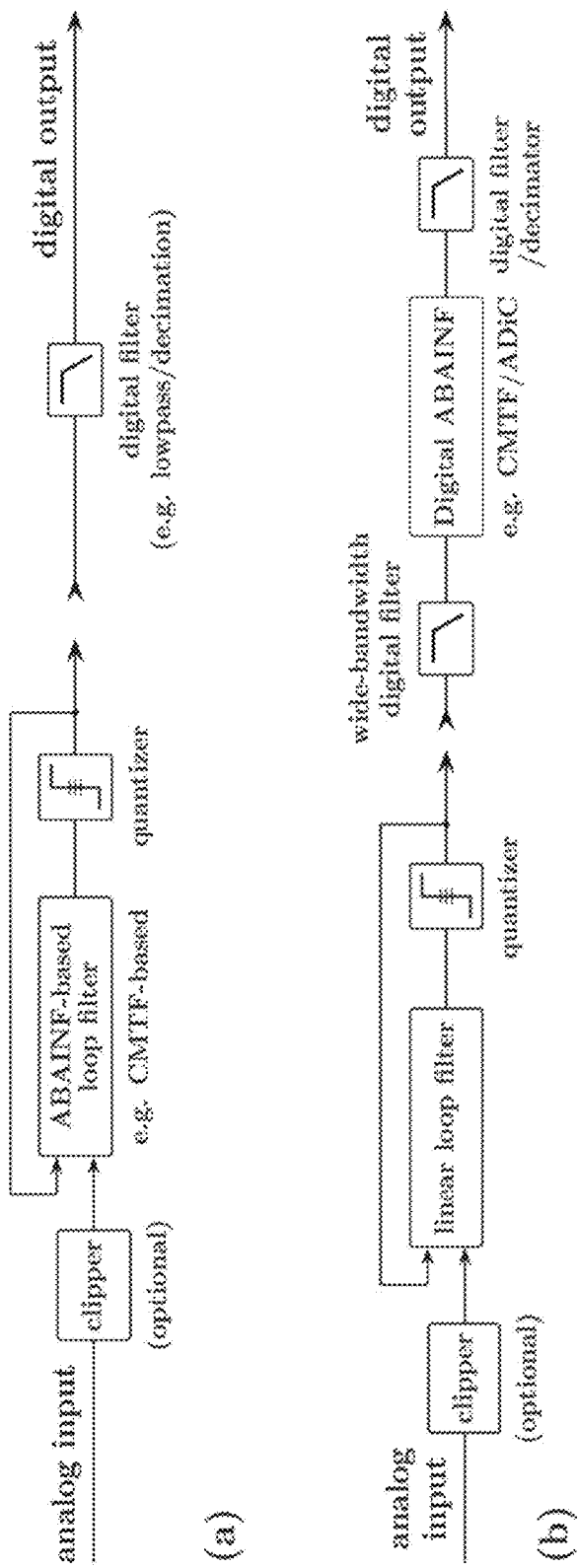

FIG. 60. Analog (panel (a)) and digital (panel (b)) ABAINF-based outlier filtering in $\Delta\Sigma$ ADCs.

Figure 61:
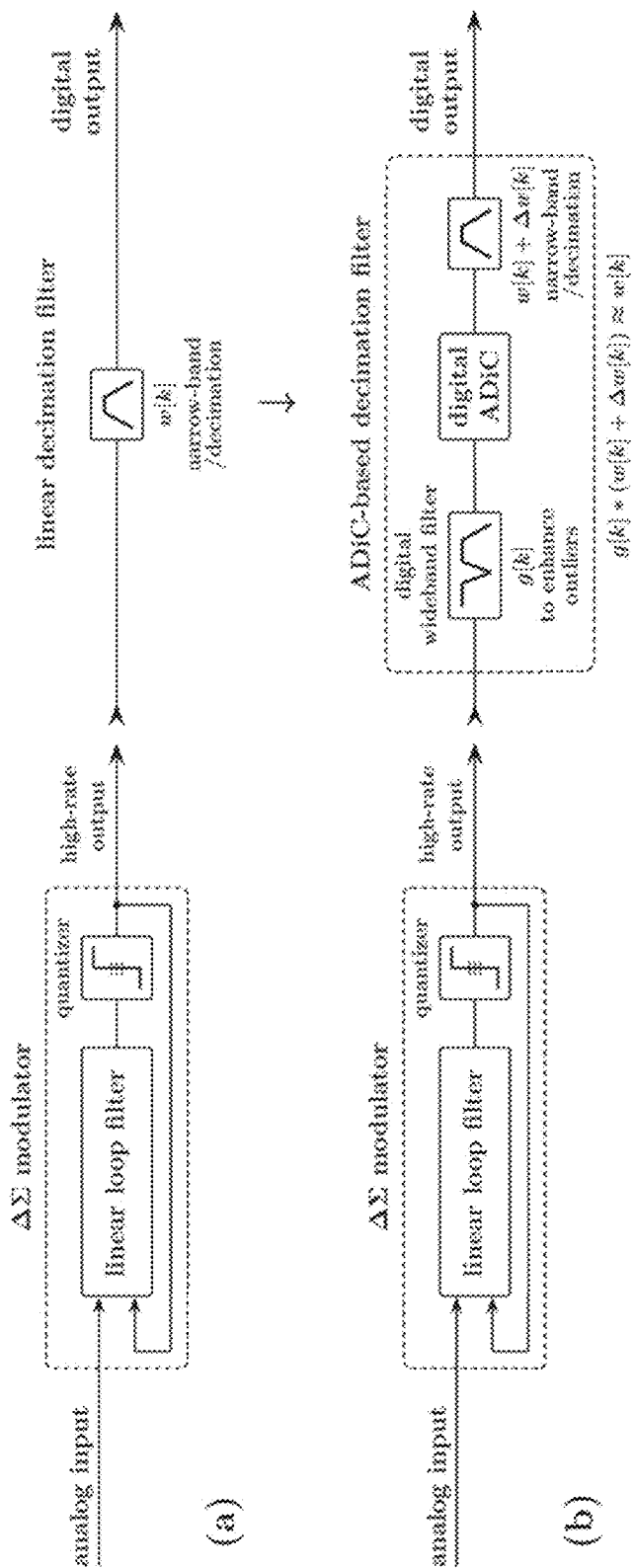

FIG. 61. Example of a $\Delta\Sigma$ ADC with an ADIC-based decimation filter for enhanced interference mitigation.

Figure 62:
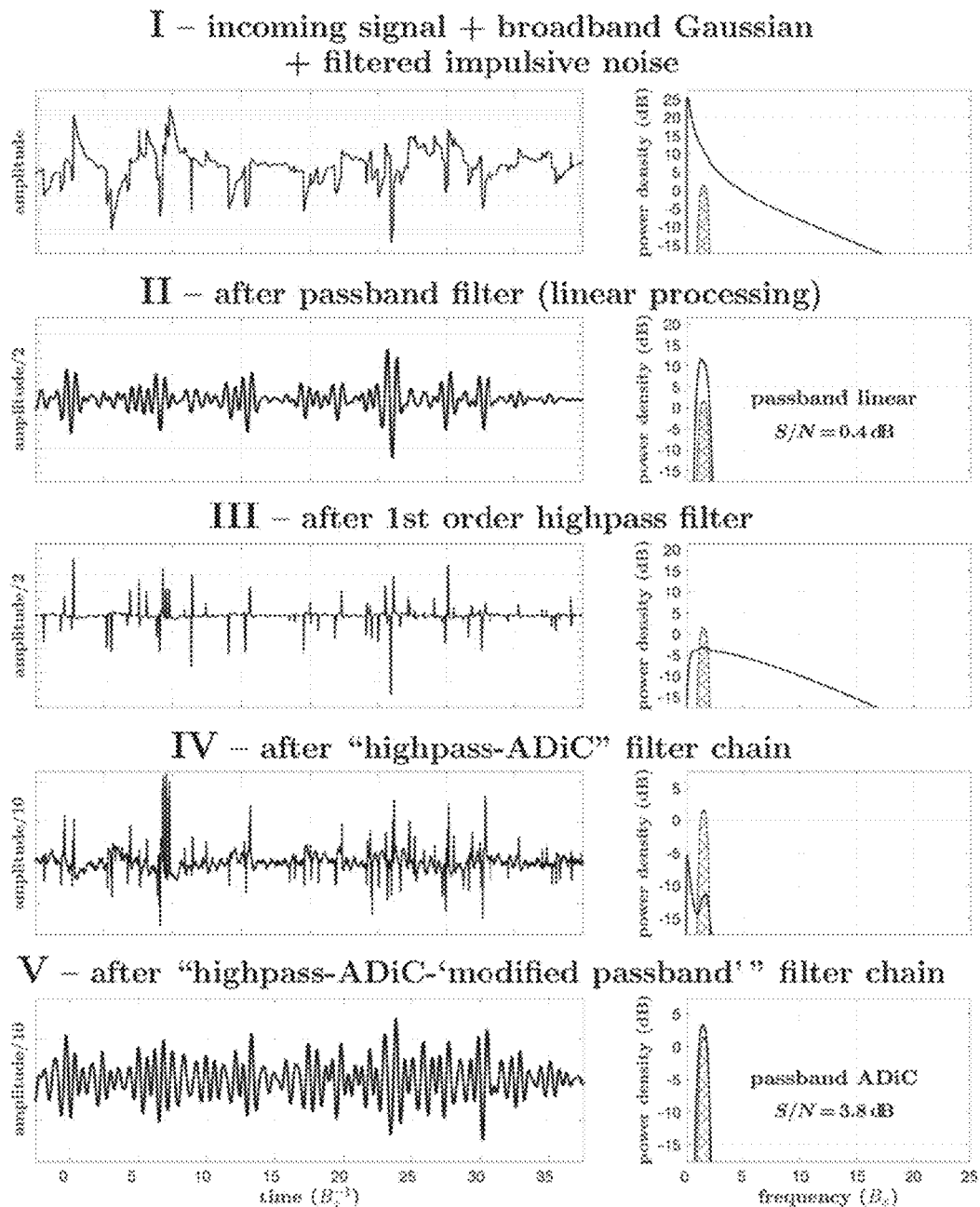

FIG. 62. Example of using a 1st order highpass filter prior to ADiC for enhanced interference mitigation.

Figure 63:
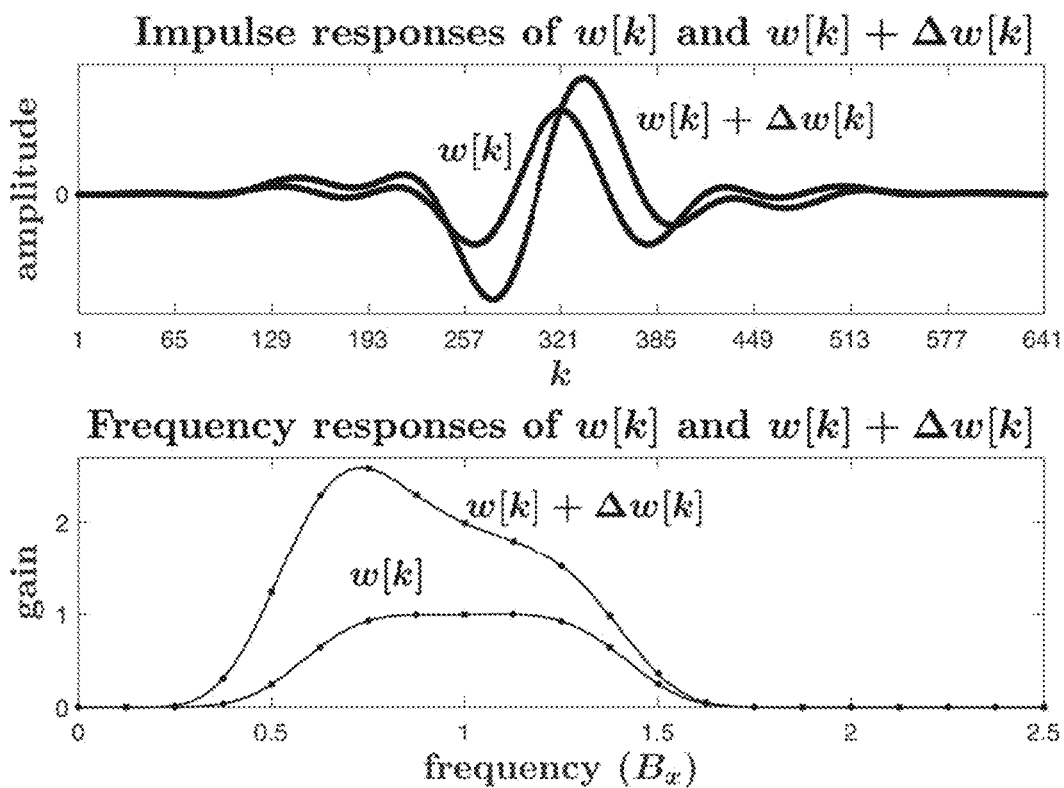

FIG. 63. Impulse and frequency responses of w[k] and w[k]+$\Delta$w[k] used in the example of FIG. 62.

Figure 64:
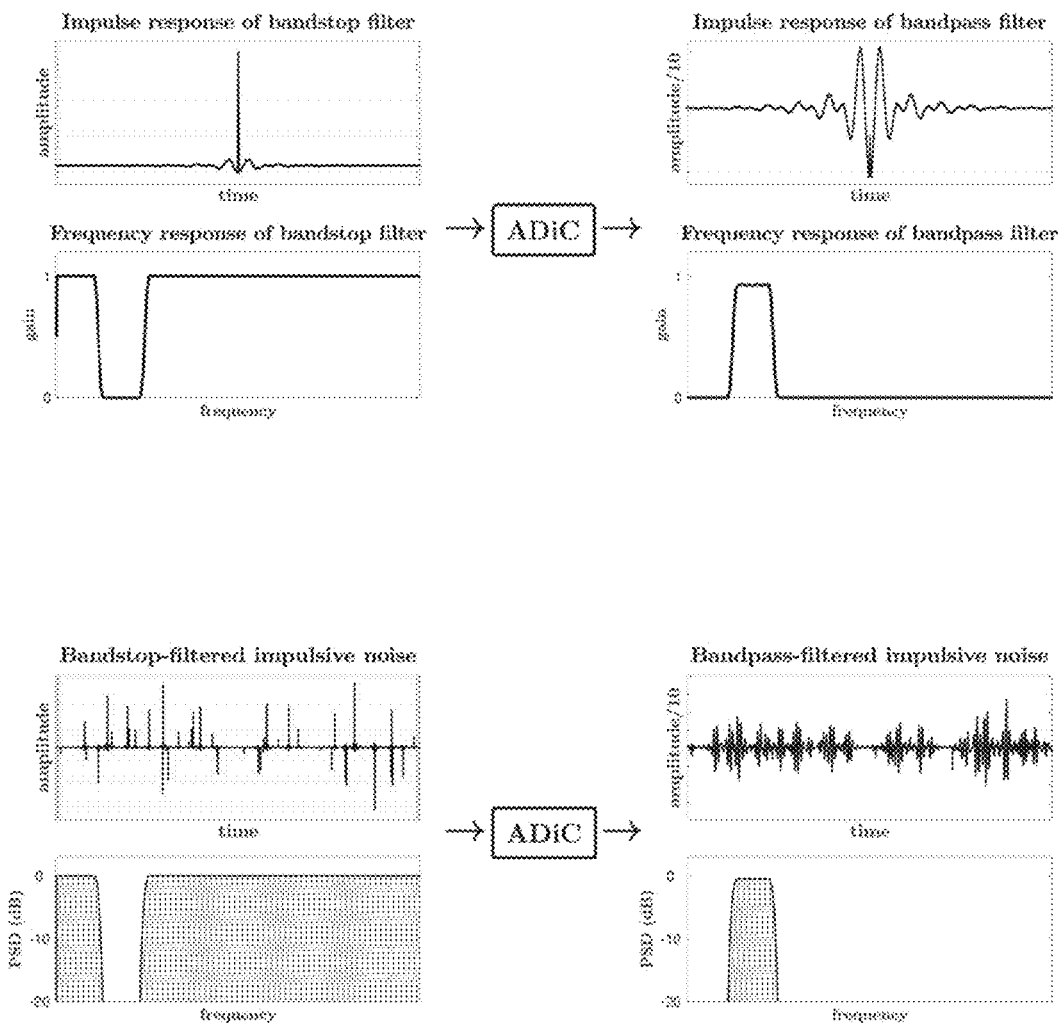

FIG. 64. Illustration of spectral reshaping of impulsive noise by an ADiC.

Figure 65:
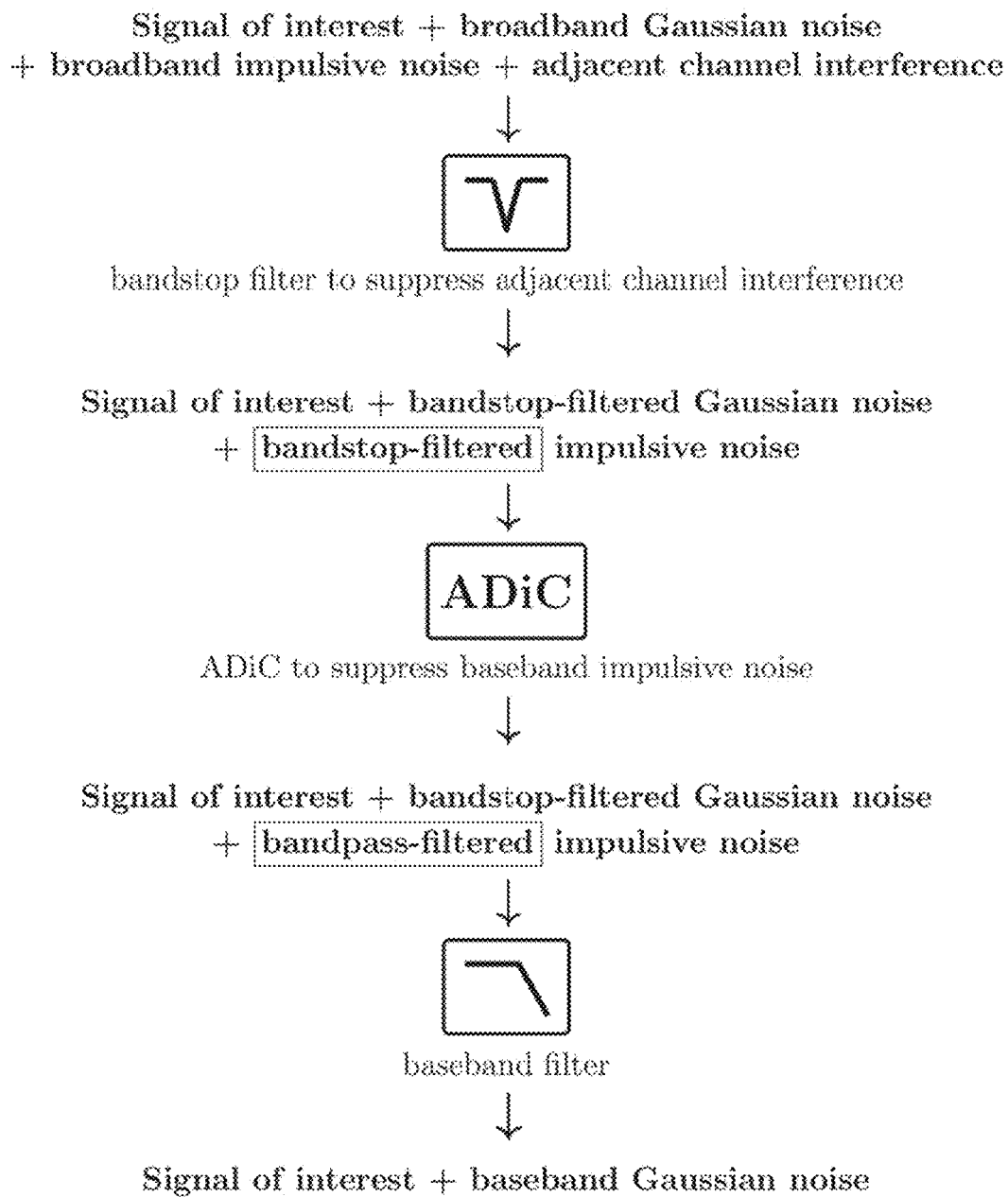

FIG. 65. Example of using ADiC-based filtering for mitigation of impulsive noise in the presence of strong adjacent channel interference.

Figure 66:
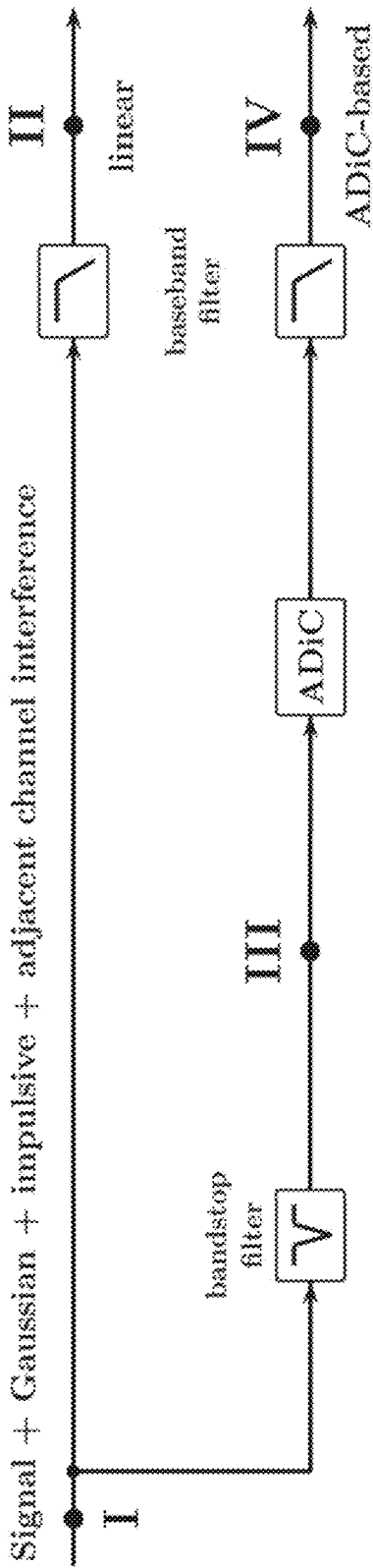

FIG. 66. Two signal processing chains for the example described in § 10.5.

Figure 67:
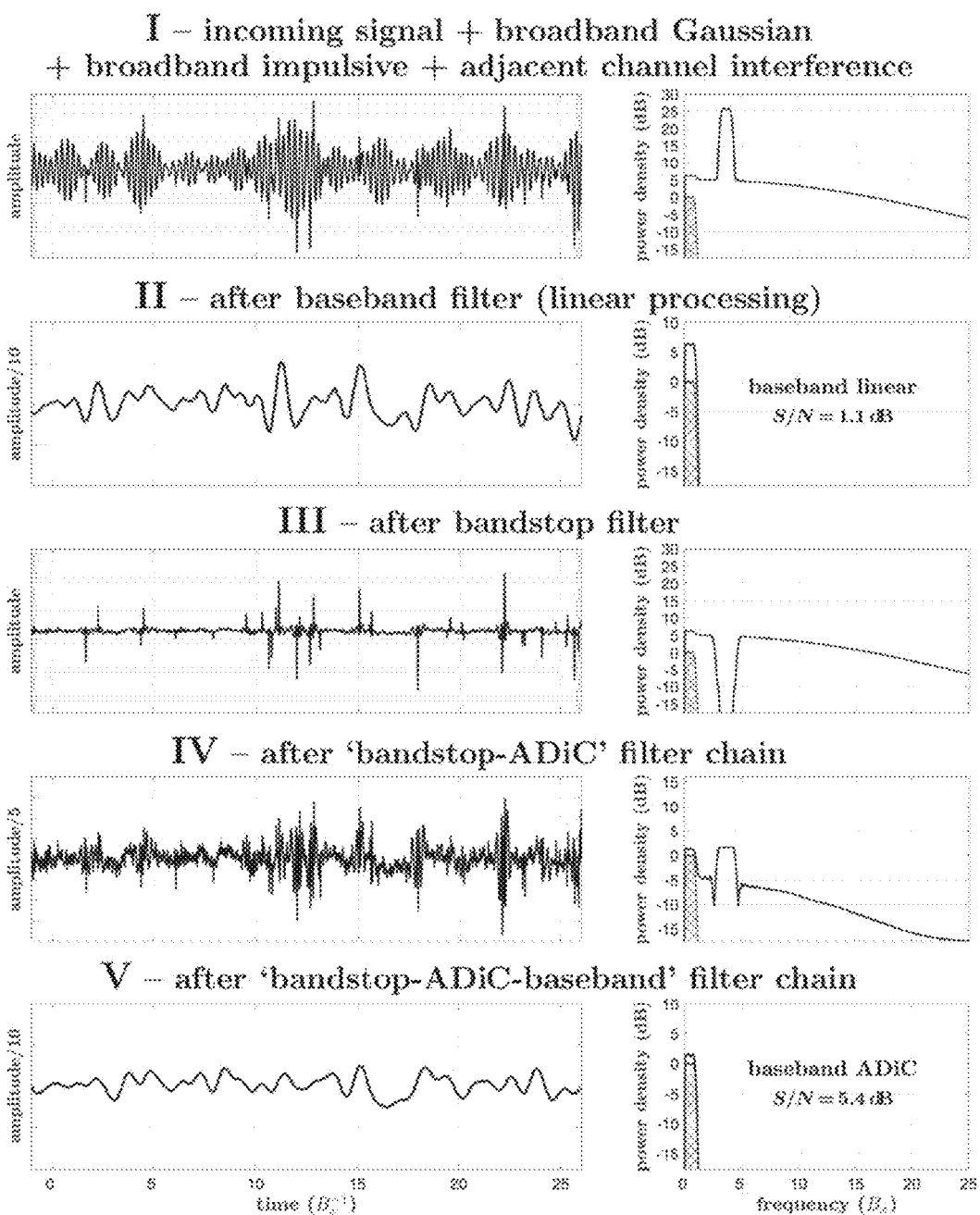

FIG. 67. Examples of the time-domain traces and the PSDs of the signals at points I, II, III, IV, and V in FIG. 66.

Figure 68:
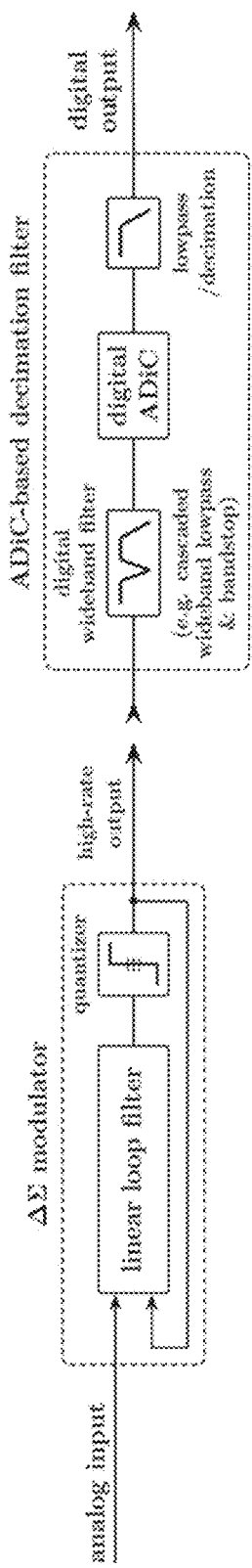

FIG. 68. Example of a $\Delta\Sigma$ ADC with an ADIC-based decimation filter for mitigation of wideband impulsive noise affecting the baseband signal of interest in the presence of a strong adjacent-channel interference.

Figure 69:
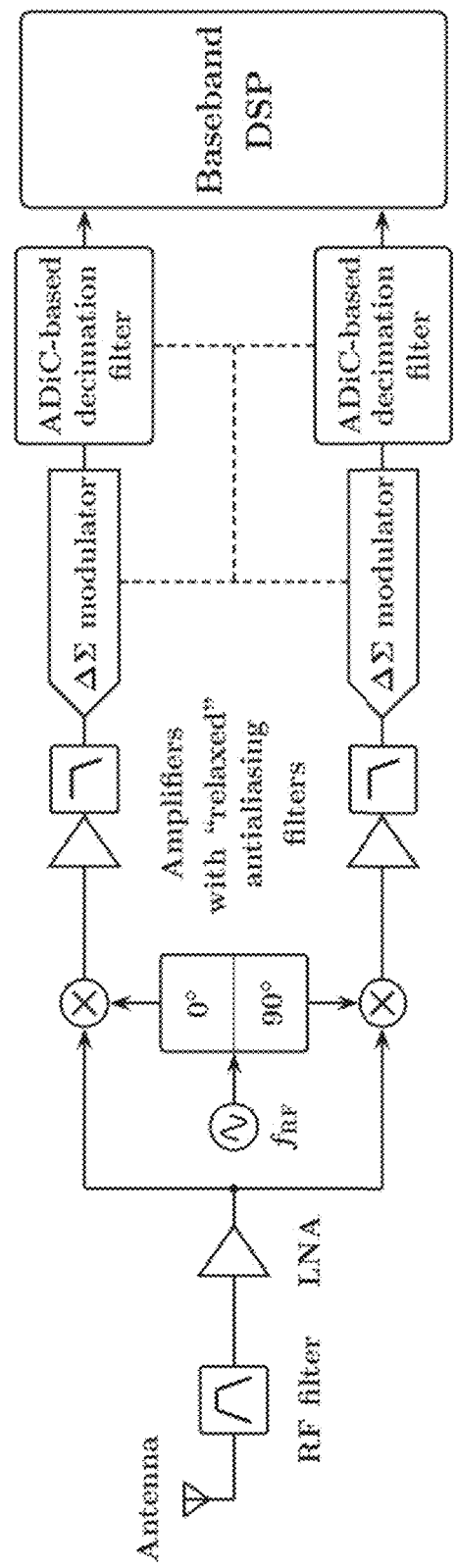

FIG. 69. Example of using ADiC-based filtering in direct conversion receiver architecture with quadrature baseband ADCs.

Figure 70:
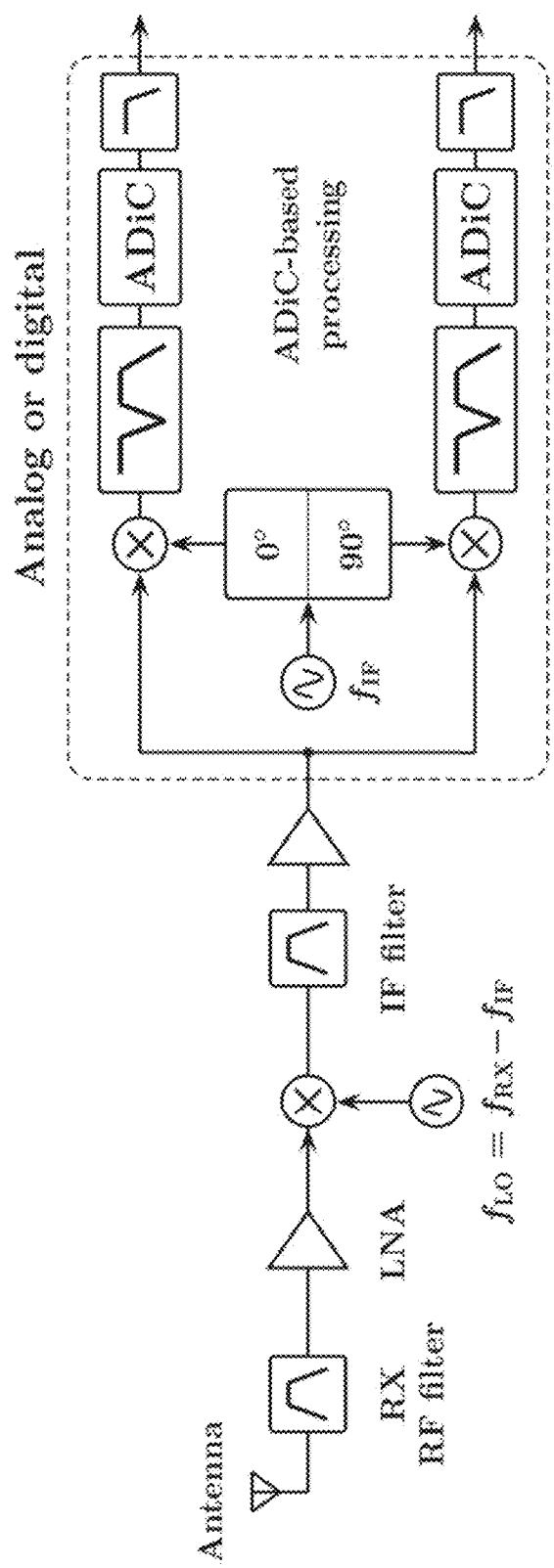

FIG. 70. Example of using ADiC-based filtering in superheterodyne receivers.

FIG. 71. Example of a conceptual schematic of a subcircuit for an OTA-based implementation of a depreciator with the transparency function given by equation (30) and depicted in FIG. 20.

Figure 72:
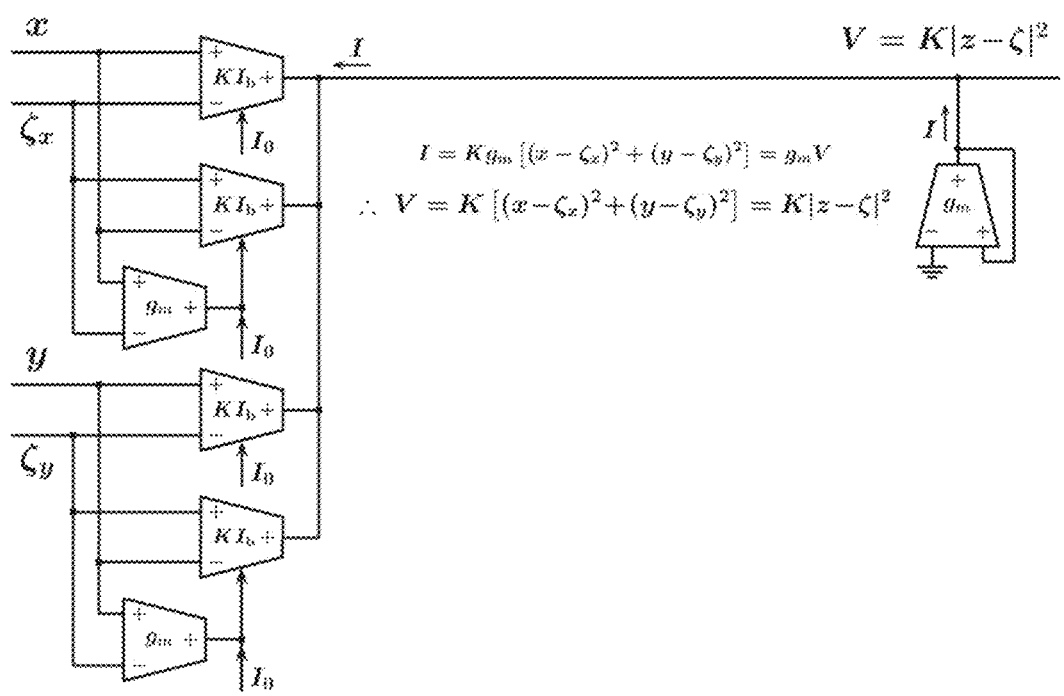

FIG. 72. Example of an OTA-based squaring circuit (e.g. "SQ" circuit in FIG. 58) for a complex-valued signal.

Figure 73:
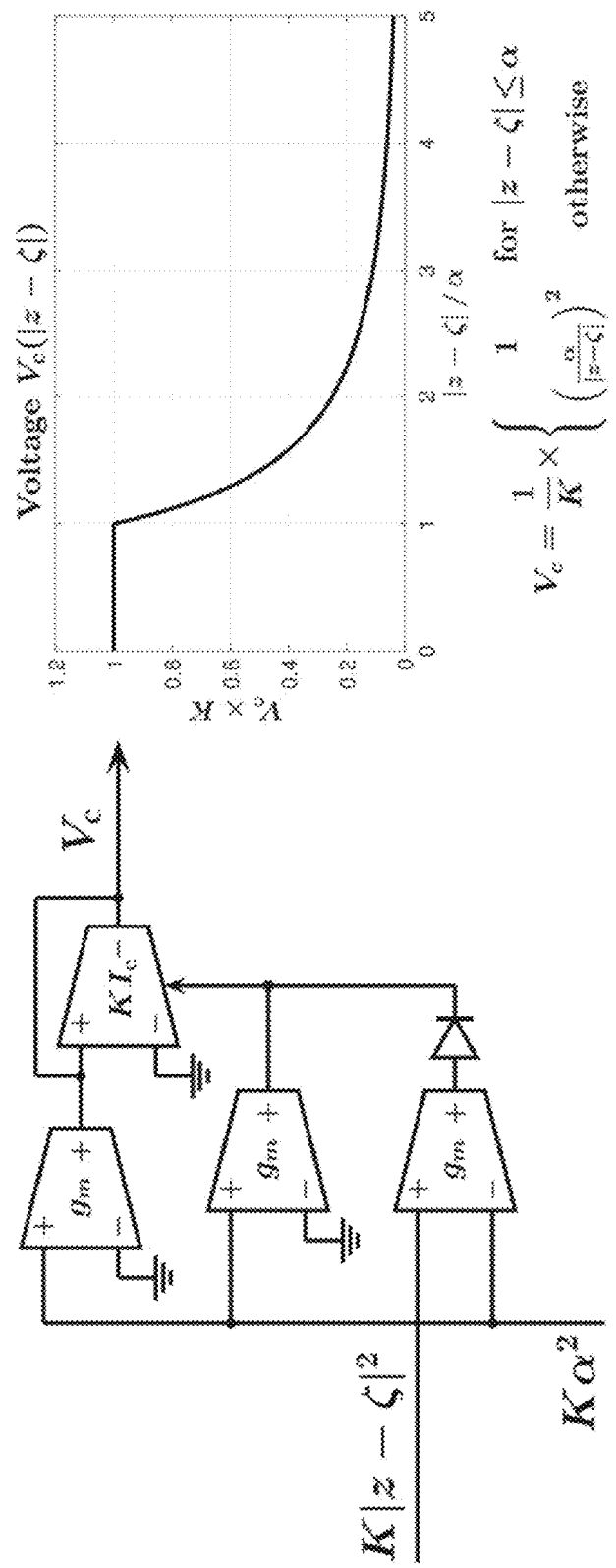

FIG. 73. Example of a conceptual schematic of a subcircuit for an OTA-based implementation of a depreciator with the transparency function depicted in FIGS. 56 and 58 and given by equation (62).

ABBREVIATIONS

ABAINF: Analog Blind Adaptive Intermittently Nonlinear Filter; A/D: Analog-to-Digital; ADC: Analog-to-Digital Converter (or Conversion); ADiC: Analog Differential Clipper; AFE: Analog Front End; AGC: Automatic Gain Control; ASIC: Application-Specific Integrated Circuit: ASSP: Application-Specific Standard Product; AWGN: Additive White Gaussian Noise; BAINF: Blind Adaptive Intermittently Nonlinear Filter; BER: Bit Error Rate, or Bit Error Ratio;

CDL: Canonical Differential Limiter; CDMA: Code Division Multiple Access; CMTF: Clipped Mean Tracking Filter; COTS: Commercial Off-The-Shelf; DCL: Differential Clipping Level; DELDC: Dual Edge Limit Detector Circuit; DSP: Digital Signal Processing/Processor; EMC: electromagnetic compatibility; EMI: electromagnetic interference; FIR: Finite Impulse Response; FPGA: Field Programmable Gate Array;

HSDPA: High Speed Downlink Packet Access; IC: Integrated Circuit; IF: Intermediate Frequency; I/Q: In-phase/Quadrature; IQR: interquartile range;

LNA: Low-Noise Amplifier; LO: Local Oscillator; MAD: Mean/Median Absolute Deviation; MATLAB: MATrix LABoratory (numerical computing environment and fourth-generation programming language developed by MathWorks); MCT: Measure of Central Tendency; MOS: Metal-Oxide-Semiconductor; MTF: Median Tracking Filter;

NDL: Nonlinear Differential Limiter; OOB: Out-Of-Band; ORB: Outlier-Removing Buffer; OTA: Operational Transconductance Amplifier;

PDF: Probability Density Function; PSD: Power Spectral Density;

QTF: Quartile (or Quantile) Tracking Filter;

RF: Radio Frequency; RFI: Radio Frequency Interference; RMS: Root Mean Square; RRC: Robust Range Circuit; RRC: Root Raised Cosine; RX: Receiver; SNR: Signal-to-Noise Ratio; SCS: Switch Control Signal; SPDT: Single Pole Double-Throw switch;

TTF: Trimean Tracking Filter; TX: Transmitter; UWB: Ultra-wideband;

WCC: Window Comparator Circuit; WDC: Window Detector Circuit; WMCT: Windowed Measure of Central Tendency; WML: Windowed Measure of Location;

VGA: Variable-Gain Amplifier;

DETAILED DESCRIPTION

As required, detailed embodiments of the present invention are disclosed herein. However, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

Moreover, except where otherwise expressly indicated, all numerical quantities in this description and in the claims are to be understood as modified by the word "about" in describing the broader scope of this invention. Practice within the numerical limits stated is generally preferred. Also, unless expressly stated to the contrary, the description of a group or class of components as suitable or preferred for a given purpose in connection with the invention implies that mixtures or combinations of any two or more members of the group or class may be equally suitable or preferred.

It should be understood that the word "analog", when used in reference to various embodiments of the invention, is used only as a descriptive language to convey the inventive ideas clearly, and is not limitative of the claimed invention. Specifically, the word "analog" mainly refers to using differential and/or integral equations (and thus such analog-domain operations as differentiation, antidifferentiation, and convolution) in describing various signal processing structures and topologies of the invention. In reference to numerical or digital implementations of the disclosed analog structures, it is to be understood that such numerical or digital implementations simply represent finite-difference approximations of the respective analog operations and thus may be accomplished in a variety of alternative ways.

For example, a "numerical derivative" of a quantity x(t) sampled at discrete time instances $t_k$ such that $t_{k+1}=t_k+dt$ should be understood as a finite difference expression approximating a. "true" derivative of x(t). One skilled in the art will recognize that there exist many such expressions and algorithms for estimating the derivative of a mathematical function or function subroutine using discrete sampled values of the function and perhaps other knowledge about the function. However, for sufficiently high sampling rates, for digital implementations of the analog structures described in this disclosure simple two-point numerical derivative expressions may be used. For example, a numerical derivative of $x(t_k)$ may be obtained using the following expressions:

$$\dot{x}(t_k) = \frac{x(t_{k+1}) - x(t_k)}{dt}, \quad (10)$$

$$\dot{x}(t_k) = \frac{x(t_k) - x(t_{k-1})}{dt}, \text{ or}$$

$$\dot{x}(t_k) = \frac{x(t_{k+1}) - x(t_{k-1})}{2dt}.$$

Further, the quantities proportional to numerical derivatives may be obtained using the following expressions:

$$\dot{x}(t_k) \propto x(t_{k+1}) - X(t_k),$$

$$\dot{x}(t_k) \propto x(t_k) - x(t_{k-1}), \text{ or}$$

$$\dot{x}(t_k) \propto x(t_{k+1}) - x(t_{k-1}). \quad (11)$$

The detailed description of the invention is organized as follows.

Section 1 ("Analog Intermittently Nonlinear Filters for Mitigation of Outlier Noise") outlines the general idea of employing intermittently nonlinear filters for mitigation of outlier (e.g. impulsive) noise, and thus improving the performance of a communications receiver in the presence of such noise. E.g., § 1.1 ("Motivation and simplified system model") describes a simplified diagram of improving receiver performance in the presence of impulsive interference.

Figure 4:
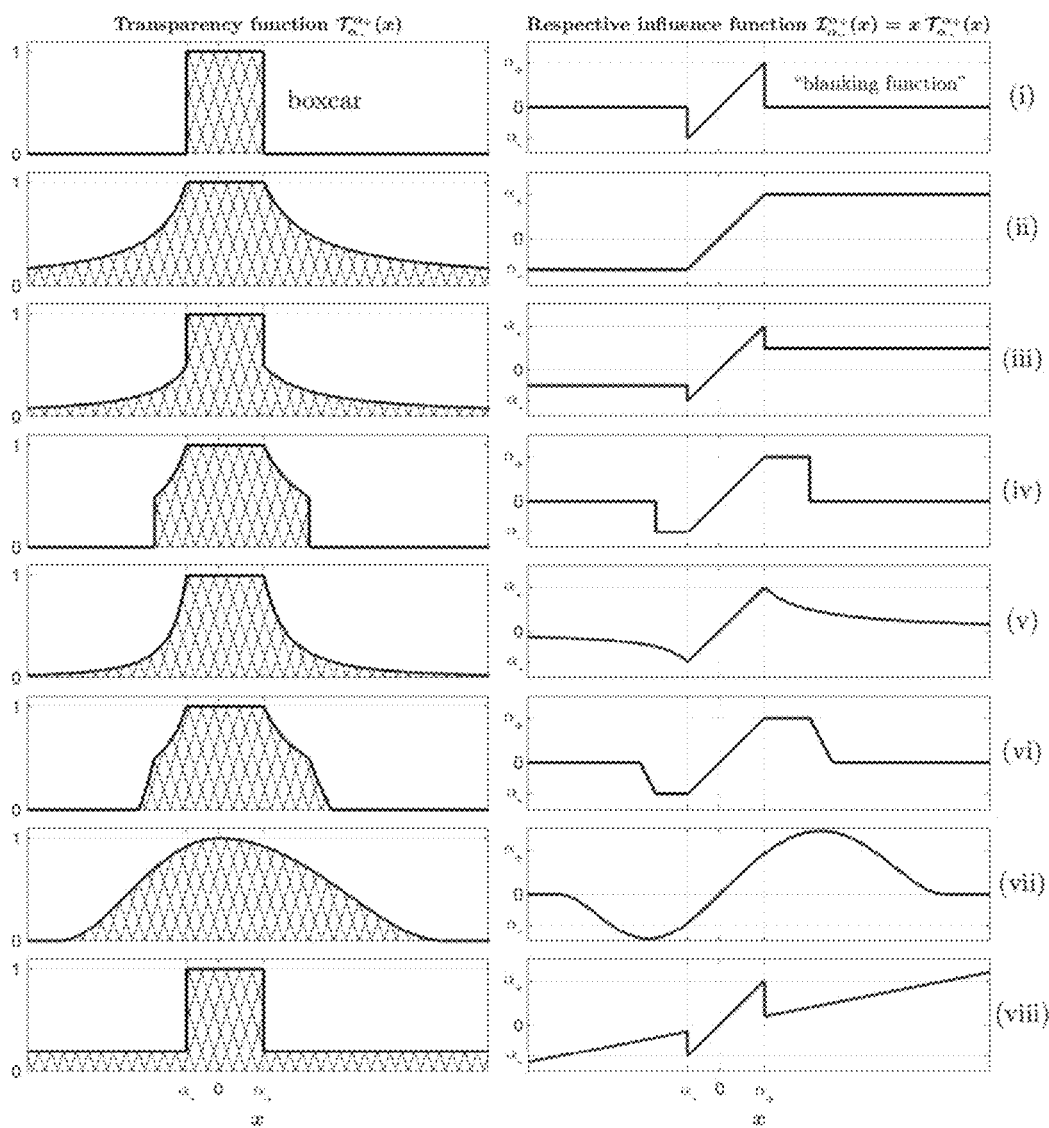
FIG. 4. Illustrative examples of the transparency functions and their respective influence functions.

Section 2 ("Analog Blind Adaptive Intermittently Nonlinear Filters (ABAINFs) with the desired behavior") introduces a practical approach to constructing analog nonlinear filters with the general behavior outlined in Section 1, and § 2.1 ("A particular ABAINF example") provides a particular ABAINF example. Another particular ABAINF example, with the influence function of a type shown in panel (iii) of FIG. 4, is given in § 2.2 ("Clipped Mean Tracking Filter (CMTF)"), and § 2.3 ("Illustrative CMTF circuit") provides a simplified illustration of implementing a CMTF by solving equation (17) in an electronic circuit. Further, § 2.4 ("Using CMTFs for separating impulsive (outlier) and non-impulsive signal components with overlapping frequency spectra: Analog Differential Clippers (ADiCs)") introduces an Analog Differential Clipper (ADiC), and § 2.5 ("Numerical implementations of ABAINFs/CMTFs/ADiCs") provides an example of a numerical ADiC algorithm and outlines its hardware implementation.

Section 3 ("Quantile tracking filters as robust means to establish the ABAINF transparency range(s)") introduces quantile tracking filters that may be employed as robust means to establish the ABAINF transparency range(s), with § 3.1 ("Median Tracking Filter") discussing the tracking filter for the 2nd quartile (median), and § 3.2 ("Quartile Tracking Filters") describing the tracking filters for the 1st and 3rd quartiles. Further, § 3.3 ("Numerical implementations of ABAINFs/CMTFs/ADiCs using quantile tracking filters as robust means to establish the transparency range") provides an illustration of using numerical implementations of quantile tracking filters as robust means to establish the transparency range in digital embodiments of ABAINFs/CMTFs/ADiCs, and § 3.4 ("Adaptive influence function design") comments on an adaptive approach to constructing ADiC influence functions.

Section 4 ("Adaptive intermittently nonlinear analog filters for mitigation of outlier noise in the process of analog-to-digital conversion") illustrates analog-domain mitigation of outlier noise in the process of analog-to-digital (A/D) conversion that may be performed by deploying an ABAINF (for example, a CMTF) ahead of an ADC.

While § 4 illustrates mitigation of outlier noise in the process of analog-to-digital conversion by ADiCs/CMTFs deployed ahead of an ADC, Section 5 ("ΔΣ ADC with CMTF-based loop filter") discusses incorporation of CMTF-based outlier noise filtering of the analog input signal into loop filters of ΔΣ analog-to-digital converters.

While § 5 describes CMTF-based outlier noise filtering of the analog input signal incorporated into loop filters of ΔΣ analog-to-digital converters, the high raw sampling rate (e.g. the flip-flop clock frequency) of a ΔΣ ADC (e.g. two to three orders of magnitude larger than the bandwidth of the signal of interest) may be used for effective ABAINF/CMTF/ADiC-based outlier filtering in the digital domain, following a ΔΣ modulator with a linear loop filter. This is discussed in Section 6 ("ΔΣ ADCs with linear loop filters and digital ADiC/CMTF filtering").

Section 7 ("ADiC variants") describes several alternative ADiC structures, and § 7.1 ("Robust filters") comments of various means to establish robust local measures of location (e.g. central tendency) that may be used to establish ADiC differential clipping levels. In particular, § 7.1.1 ("Trimean Tracking Filter (TTF)") describes a Trimean Tracking Filter (TTF) as one of such means.

Section 8 ("Simplified ADiC structure") and § 8.1 ("Cascaded ADiC structures") describe simplified ADiC structures that may be a preferred way to implement ADiC-based filtering due to their simplicity and robustness.

Section 9 ("ADiC-based filtering of complex-valued signals") discusses ADiC-based filtering of complex-valued signals.

Finally, Section 10 ("Explanatory comments and discussion") provides several comments on the disclosure given in Sections 1 through 9, with additional details discussed in § 10.1 ("Mitigation of non-Gaussian (e.g. outlier) noise in the process of analog-to-digital conversion: Analog and digital approaches"), § 10.2 ("Comments on ΔΣ modulators"), § 10.3 ("Comparators, discriminators, clippers, and limiters"), § 10.4 ("Windowed measures of location"), § 10.5 ("Mitigation of non-impulsive non-Gaussian noise"), and § 10.6 ("Concluding remarks").

1 Analog Intermittently Nonlinear Filters for Mitigation of Outlier Noise

In the simplified illustration that follows, our focus is not on providing precise definitions and rigorous proof of the statements and assumptions, but on outlining the general idea of employing intermittently nonlinear filters for mitigation of outlier (e.g. impulsive) noise, and thus improving the performance of a communications receiver in the presence of such noise.

1.1 Motivation and Simplified System Model

Let us assume that the input noise affecting a baseband signal of interest with unit power consists of two additive components: (i) a Gaussian component with the power $P_G$ in the signal passband, and (ii) an outlier (impulsive) component with the power $P_i$ in the signal passband. Thus if a linear antialiasing filter is used before the analog-to-digital conversion (ADC), the resulting signal-to-noise ratio (SNR) may be expressed as $(P_G+P_i)^{-1}$.

For simplicity, let us further assume that the outlier noise is white and consists of short (with the characteristic duration much smaller than the reciprocal of the bandwidth of the signal of interest) random pulses with the average inter-arrival times significantly larger than their duration, yet significantly smaller than the reciprocal of the signal bandwidth. When the bandwidth of such noise is reduced to within the baseband by linear filtering, its distribution would be well approximated by Gaussian [41]. Thus the observed noise in the baseband may be considered Gaussian, and we may use the Shannon formula [42] to calculate the channel capacity.

Let us now assume that we use a nonlinear antialiasing filter such that it behaves linearly, and affects the signal and noise proportionally, when the baseband power of the impulsive noise is smaller than a certain fraction of that of the Gaussian component, $P_i \le \varepsilon P_G$ ($\varepsilon \ge 0$) resulting in the SNR $(P_G+P_i)^{-1}$. However, when the baseband power of the impulsive noise increases beyond $\varepsilon P_G$, this filter maintains its linear behavior with respect to the signal and the Gaussian noise component, while limiting the amplitude of the outlier noise in such a way that the contribution of this noise into the baseband remains limited to $\varepsilon P_G < P_i$. Then the resulting baseband SNR would be $[(1+\varepsilon)P_G]^{-1} > (P_G+P_i)^{-1}$. We may view the observed noise in the baseband as Gaussian, and use the Shannon formula to calculate the limit on the channel capacity.

As one may see from this example, by disproportionately affecting high-amplitude outlier noise while otherwise preserving linear behavior, such nonlinear antialiasing filter would provide resistance to impulsive interference, limiting the effects of the latter, for small $\varepsilon$, to an insignificant fraction of the Gaussian noise. FIG. 2 illustrates this with a simplified diagram of improving receiver performance in the presence of impulsive interference by employing such analog nonlinear filter before the ADC. In this illustration, $\varepsilon = 0.2$.

Figure 3:
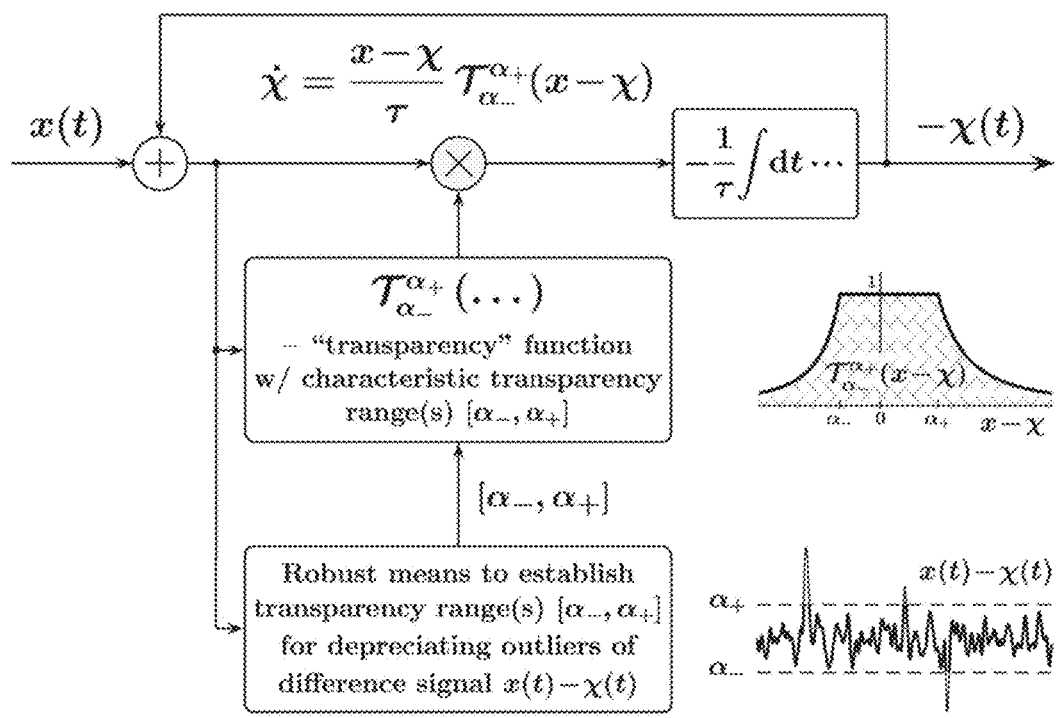
FIG. 3. Illustrative ABAINF block diagram.

2 Analog Blind Adaptive Intermittently Nonlinear Filters (ABAINFs) with the Desired Behavior The analog nonlinear filters with the behavior outlined in § 1.1 may be constructed using the approach shown in FIG. 3, which provides an illustrative block diagram of an Analog Blind Adaptive Intermittently Nonlinear Filter (ABAINF).

In FIG. 3, the influence function [43] $\mathcal{I}_{\alpha_-\ \alpha_-}^{\alpha_+\ \alpha_+}(x)$ is represented as $\mathcal{I}_{\alpha_-\ \alpha_-}^{\alpha_+\ \alpha_+}(x) = x \mathcal{T}_{\alpha_-\ \alpha_-}^{\alpha_+\ \alpha_+}(x)$, where $\mathcal{T}_{\alpha_-\ \alpha_-}^{\alpha_+\ \alpha_+}(x)$ is a transparency function with the characteristic transparency range $[\alpha_-,\alpha_+]$. We may require that $\mathcal{T}_{\alpha_-\ \alpha_-}^{\alpha_+\ \alpha_+}(x)$ is effectively (or approximately) unity for $\alpha_- \le x \le \alpha_+$, and that $\mathcal{T}_{\alpha_-\ \alpha_-}^{\alpha_+\ \alpha_+}(|x|)$ becomes smaller than unity (e.g. decays to zero) for x outside of the range $[\alpha_-,\alpha_+]$.

As one should be able to see in FIG. 3, a (nonlinear) differential equation relating the input x(t) to the output $\chi(t)$ of an ABAINF may be written as $$\frac{d}{dt}\chi = \frac{1}{\tau}\mathcal{I}_{\alpha_-}^{\alpha_+}(x-\chi) = \frac{x-\chi}{\tau}\mathcal{T}_{\alpha_-}^{\alpha_+}(x-\chi), \quad (12)$$

where $\tau$ is the ABAINF's time parameter (or time constant).

One skilled in the art will recognize that, according to equation (12), when the difference signal $x(t)-\chi(t)$ is within the transparency range $[\alpha_-,\alpha_+]$, the ABAINF would behave as a 1st order linear lowpass filter with the 3 dB corner frequency $1/(2\pi\tau)$, and, for a sufficiently large transparency range, the ABAINF would exhibit nonlinear behavior only intermittently, when the difference signal extends outside the transparency range.

If the transparency range $[\alpha_-,\alpha_+]$ is chosen in such a way that it excludes outliers of the difference signal $x(t)-\chi(t)$, then, since the transparency function $\mathcal{T}_{\alpha_-}^{\alpha_+}(x)$ decreases (e.g. decays to zero) for x outside of the range $[\alpha_-,\alpha_+]$, the contribution of such outliers to the output, $\chi(t)$ would be depreciated.

It may be important to note that outliers would be depreciated differentially, that is, based on the difference signal $x(t)-\chi(t)$ and not the input signal x(t).

The degree of depreciation of outliers based on their magnitude would depend on how rapidly the transparency function $\mathcal{T}_{\alpha_-}^{\alpha_+}(x)$ decreases (e.g. decays to zero) for x outside of the transparency range. For example, as follows from equation (12), once the transparency function decays to zero, the output. $\chi(t)$ would maintain a constant value until the difference signal $x(t)-\chi(t)$ returns to within non-zero values of the transparency function.

FIG. 4 provides several illustrative examples of the transparency functions and their respective influence functions.

Note that panel (viii) in FIG. 4 provides an example of unbounded influence function, when the respective transparency function may not decay to zero, $$\mathcal{I}_\alpha = x\mathcal{T}_\alpha(x) = x \times \begin{cases} 1 & \text{for } |x| \le \alpha \\ \varepsilon & \text{otherwise} \end{cases}, \quad (13)$$

where $\varepsilon \le 0$. Also note that for the particular influence function shown in panel (viii) of FIG. 4 the ABAINF's behavior outside the transparency range will be linear, albeit different from the behavior when the difference signal $x(t)-\chi(t)$ is within the transparency range $[\alpha_-,\alpha_+]$.

One skilled in the art will recognize that a transparency function with multiple transparency ranges may also be constructed as a product of (e.g. cascaded) transparency functions, wherein each transparency function is characterized by its respective transparency range.

2.1 A Particular ABAINF Example

As an example, let us consider a particular ABAINF with the influence function of a type shown in panel (iii) of FIG. 4, for a symmetrical transparency range $[\alpha_-,\alpha_+]=[-\alpha,\alpha]$:

$$\mathcal{I}_\alpha = x\mathcal{T}_\alpha(x) = x \times \begin{cases} 1 & \text{for } |x| \le \alpha \\ \frac{\mu\tau}{|x|} & \text{otherwise} \end{cases}, \quad (14)$$

where $\alpha \ge 0$ is the resolution parameter (with units "amplitude"), $\tau \ge 0$ is the time parameter (with units "time"), and $\mu \ge 0$ is the rate parameter (with units "amplitude per time").

For such an ABAINF, the relation between the input signal x(t) and the filtered output signal $\chi(t)$ may be expressed as $$\dot\chi = \frac{x-\chi}{\tau}\left[\theta(\alpha-|x-\chi|) + \frac{\mu\tau}{|x-\chi|}\theta(|x-\chi|-\alpha)\right], \quad (15)$$

where $\theta(x)$ is the Heaviside unit step function [30].

Note that when $|x-\chi| \le \alpha$ (e.g., in the limit $\alpha \to \infty$) equation (15) describes a 1st order analog linear lowpass filter (RC integrator) with the time constant $\tau$ (the 3 dB corner frequency $1/(2\pi\tau)$). When the magnitude of the difference signal $|x-\chi|$ exceeds the resolution parameter $\alpha$, however, the rate of change of the output would be limited to the rate parameter $\mu$ and would no longer depend on the magnitude of the incoming signal $x(t)$, providing a robust output (i.e. an output insensitive to outliers with a characteristic amplitude determined by the resolution parameter $\alpha$). Note that for a sufficiently large a this filter would exhibit nonlinear behavior only intermittently, in response to noise outliers, while otherwise acting as a 1st order linear lowpass filter.

Further note that for $\mu = \alpha/\tau$ equation (15) corresponds to the Canonical Differential Limiter (CDL) described in [9, 10, 24, 32], and in the limit $\alpha \to 0$ it corresponds to the Median Tracking Filter described in § 3.1.

However, an important distinction of this ABAINF from the nonlinear filters disclosed in [9, 10, 24, 32] would be that the resolution and the rate parameters are independent from each other. This may provide significant benefits in performance, ease of implementation, cost reduction, and in other areas, including those clarified and illustrated further in this disclosure.

2.2 Clipped Mean Tracking Filter (CMTF)

The blanking influence function shown in FIG. 4(i) would be another particular example of the ABAINF outlined in FIG. 3, where the transparency function may be represented as a boxcar function, $$\mathcal{T}_{\alpha_-}^{\alpha_+}{}^{\alpha_+}(x) = \theta(x-\alpha_-) - \theta(x-\alpha_+). \tag{16}$$

For this particular choice, the ABAINF may be represented by the following 1st order nonlinear differential equation:

$$\frac{d}{dt}\chi = \frac{1}{\tau}\mathcal{B}_{\alpha_-}^{\alpha_+}(x-\chi), \tag{17}$$

where the blanking function $\mathcal{B}_{\alpha_-}^{\alpha_+}(x)$ may be defined as $$\mathcal{B}_{\alpha_-}^{\alpha_+}(x) = \begin{cases} x & \text{for } \alpha_- \le x \le \alpha_+ \\ 0 & \text{otherwise} \end{cases}, \tag{18}$$

and where $[\alpha_-, \alpha_+]$ may be called the blanking range.

We shall call an ABAINF with such influence function a 1st order Clipped Mean Tracking Filter (CMTF).

A block diagram of a CMTF is shown in FIG. 5(a). In this figure, the blanker implements the blanking function $\mathcal{B}_{\alpha_-}^{\alpha_+}(x)$.

In a similar fashion, we may call a circuit implementing an influence function $\mathcal{I}_{\alpha_-}^{\alpha_+}{}^{\alpha_+}(x)$ a depreciator with characteristic depreciation (or transparency, or influence) range $[\alpha_-, \alpha_+]$.

Note that, for $b > 0$, $$b^{-1}\mathcal{I}_{\alpha_-}^{\alpha_+}(bx) = \mathcal{I}_{\frac{\alpha_-}{b}}^{\frac{\alpha_+}{b}}(x), \tag{19}$$

and thus, if the blanker with the range $[V_-, V_+]$ is preceded by a gain stage with the gain $G$ and followed by a gain stage with the gain $G^{-1}$, its apparent (or "equivalent") blanking range would be $[V_-, V_+]/G$, and would no longer be hardware limited. Thus control of transparency ranges of practical ABAINF implementations may be performed by automatic gain control (AGC) means. This may significantly simplify practical implementations of ABAINF circuits (e.g. by allowing constant hardware settings for the transparency ranges). This is illustrated in FIG. 5(b) for the CMTF circuit.

Figure 6:
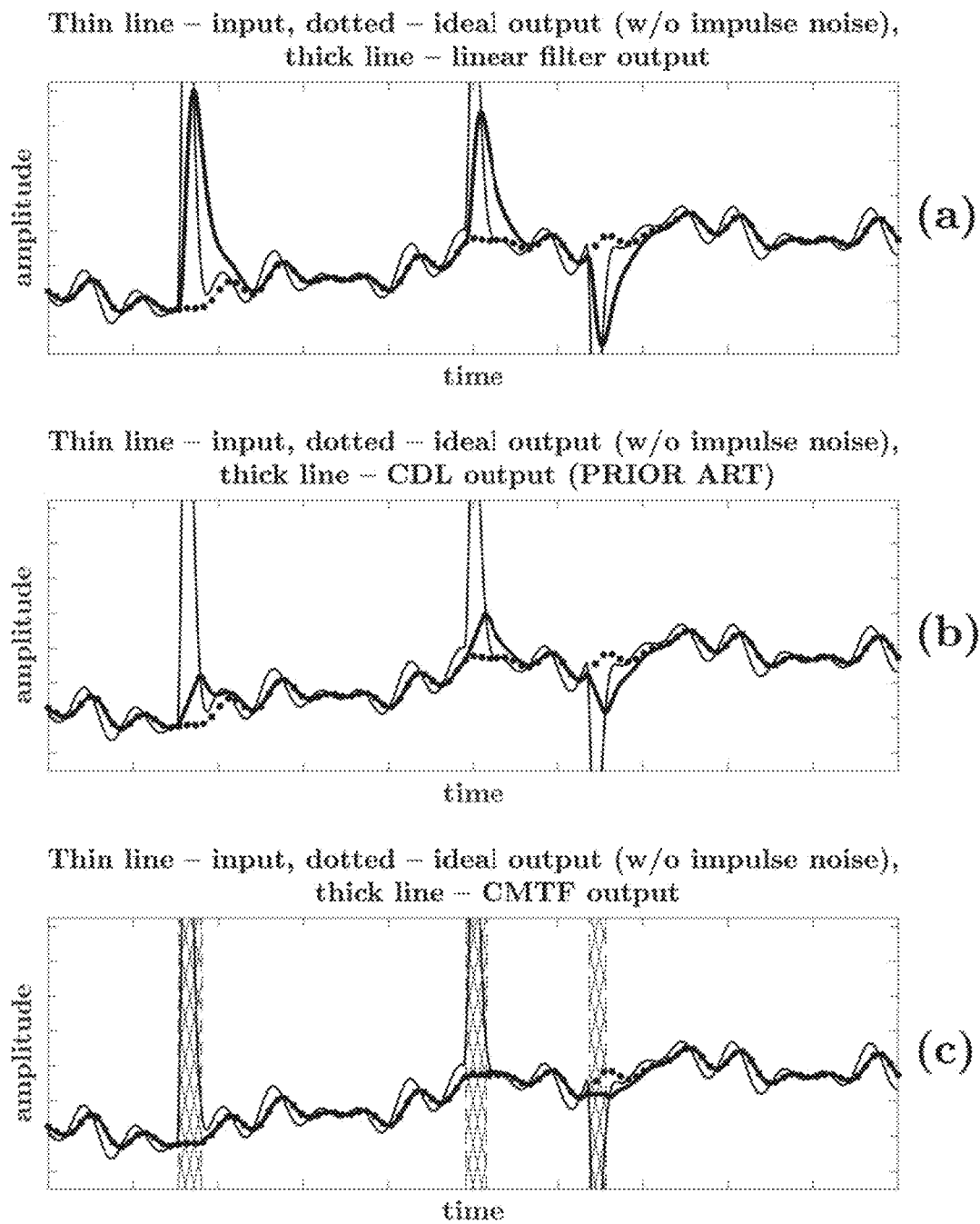
FIG. 6. Resistance of CMTF to outlier noise. The cross-hatched time intervals in panel (c) correspond to nonlinear CMTF behavior (zero rate of change).

FIG. 6 illustrates resistance of a CMTF (with a symmetrical blanking range $[-\alpha, \alpha]$) to outlier noise, in comparison with a 1st order linear lowpass filter with the same time constant. (panel (a)), and with the CDL with the resolution parameter $\alpha$ and $\tau_0 = \tau$ (panel (b)). The cross-hatched time intervals in the lower panel (panel (c)) correspond to nonlinear CMTF behavior (zero rate of change of the output). Note that the clipping (i.e. zero rate of change of the CMTF output) is performed differentially, based on the magnitude of the difference signal $x(t) - \chi(t)$ and not that of the input signal $x(t)$.

Figure 7:
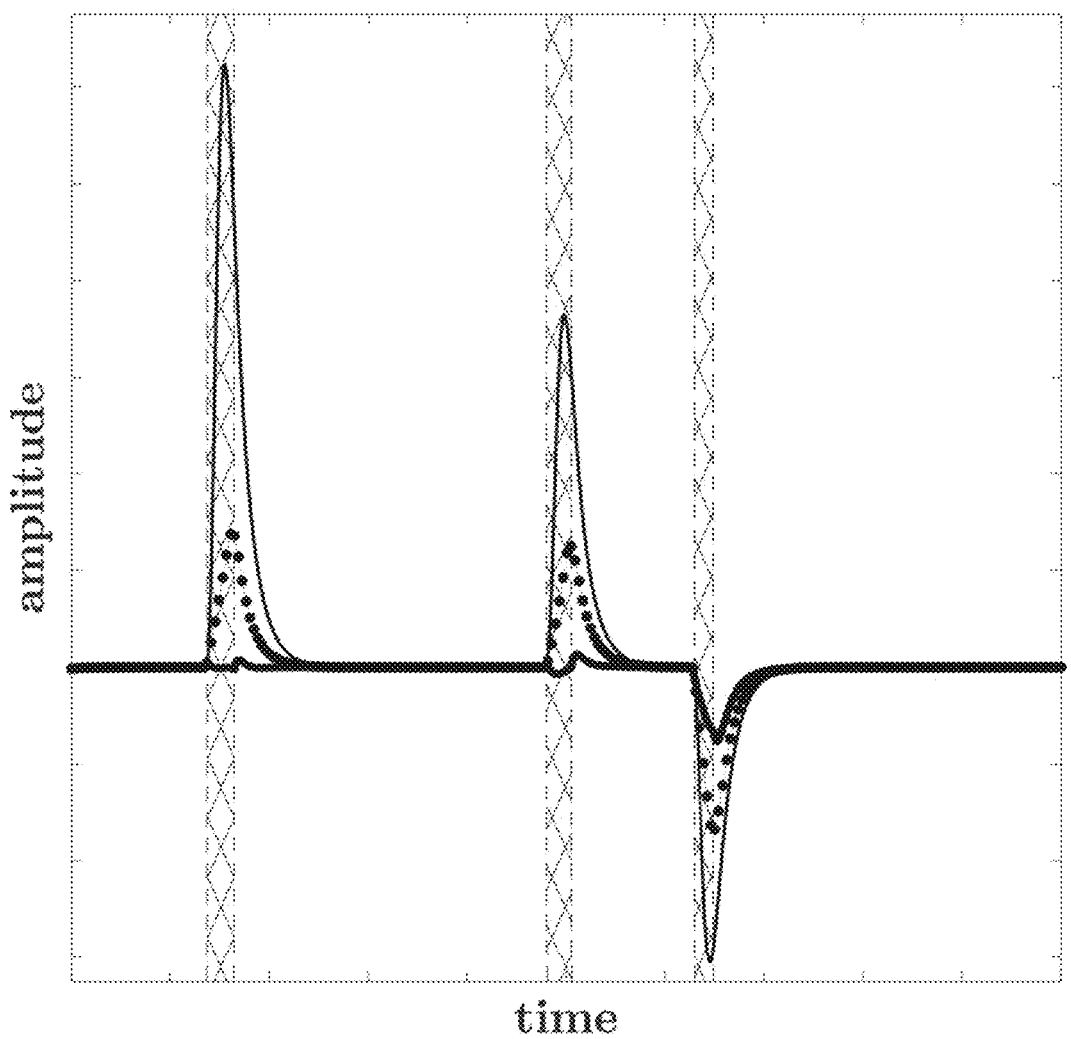
FIG. 7. Illustration of differences in the error signal for the example of FIG. 6. The cross-hatched time intervals indicate nonlinear CMTF behavior (zero rate of change).

We may call the difference between a filter output when the input signal is affected by impulsive noise and an "ideal" output (in the absence of impulsive noise) an "error signal". Then the smaller the error signal, the better the impulsive noise suppression. FIG. 7 illustrates differences in the error signal for the example of FIG. 6. The cross-hatched time intervals indicate nonlinear CMTF behavior (zero rate of change).

2.3 Illustrative CMTF Circuit

Figure 8:
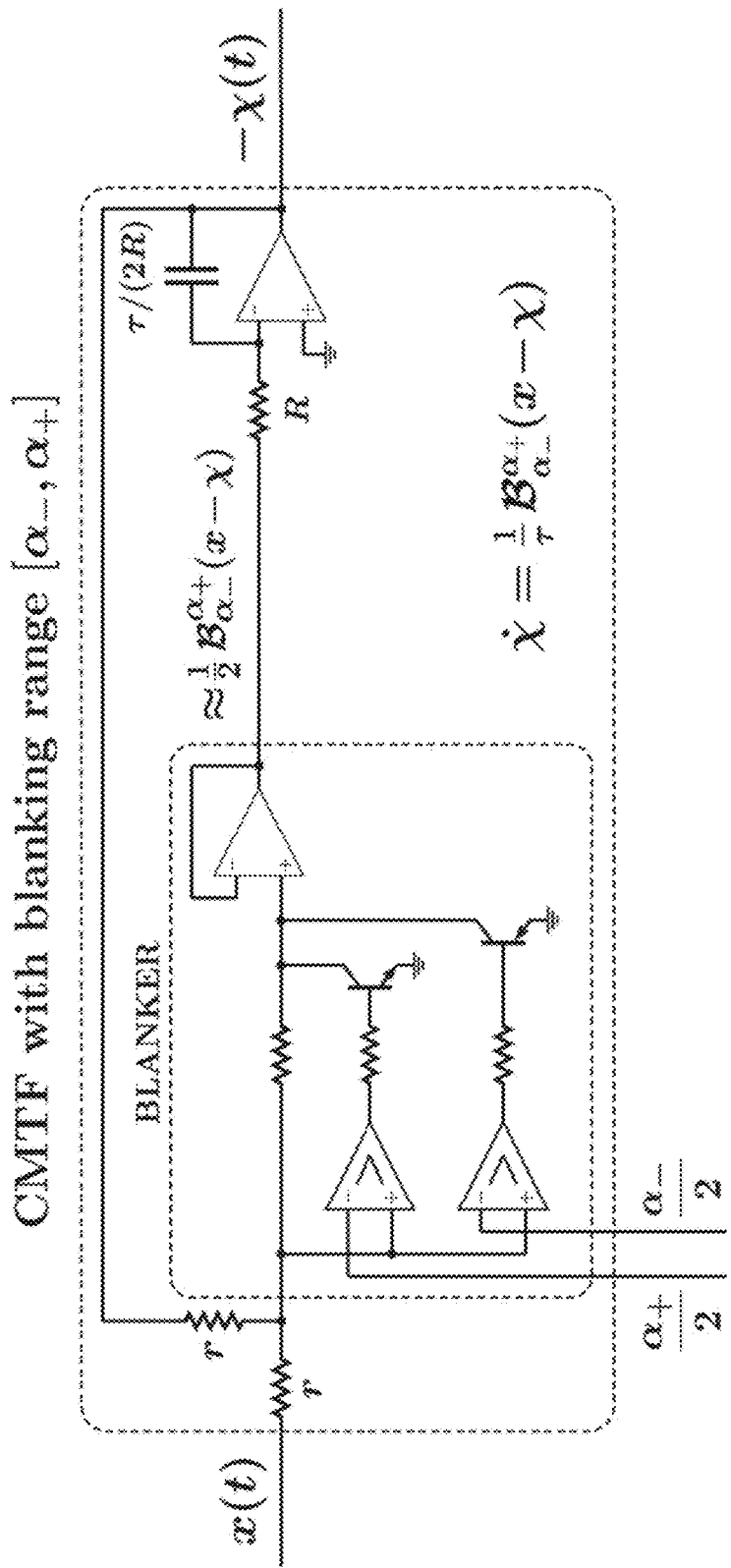
FIG. 8. Simplified illustrated schematic of CMTF circuit implementation.

FIG. 8 provides a simplified illustration of implementing a CMTF by solving equation (17) in an electronic circuit.

Figure 9:
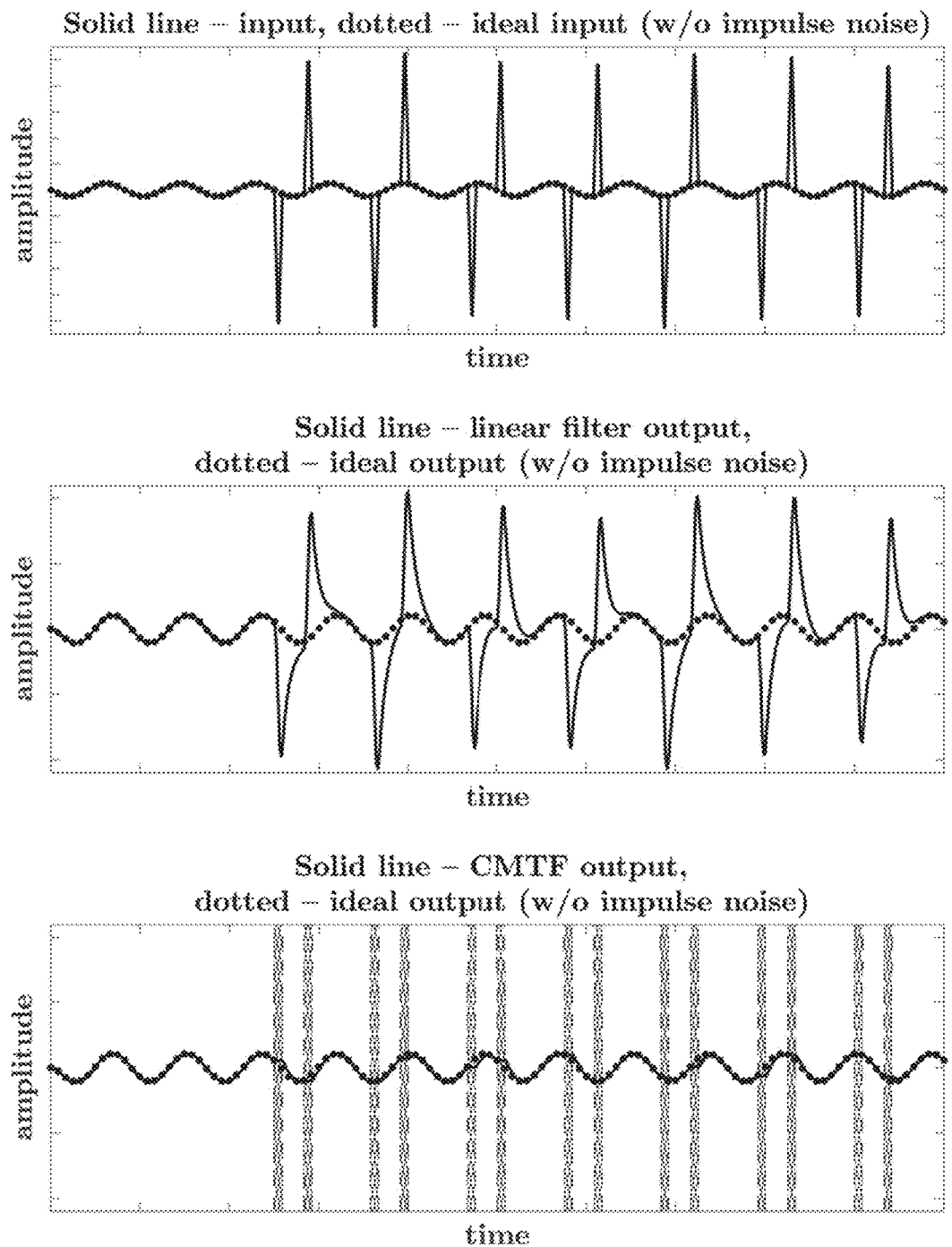
FIG. 9. Resistance of the CMTF circuit of FIG. 8 to outlier noise. The cross-hatched time intervals in the lower panel correspond to nonlinear CMTF behavior.

FIG. 9 provides an illustration of resistance of the CMTF circuit of FIG. 8 to outlier noise. The cross-hatched time intervals in the lower panel correspond to nonlinear CMTF behavior.

While FIG. 8 illustrates implementation of a CMTF in an electronic circuit comprising discrete components, one skilled in the art will recognize that the intended electronic functionality may be implemented by discrete components mounted on a printed circuit board, or by a combination of integrated circuits, or by an application-specific integrated circuit (ASIC). Further, one skilled in the art will recognize that a variety of alternative circuit topologies may be developed and/or used to implement the intended electronic functionality.

2.4 Using CMTFs for Separating Impulsive (Outlier) and Non-Impulsive Signal Components with Overlapping Frequency Spectra: Analog Differential Clippers (ADiCs)

In some applications it may be desirable to separate impulsive (outlier) and non-impulsive signal components with overlapping frequency spectra in time domain.

Examples of such applications would include radiation detection applications, and/or dual function systems (e.g. using radar as signal of opportunity for wireless communications and/or vice versa).

Such separation may be achieved by using sums and/or differences of the input and the output of a CMTF and its various intermediate signals. This is illustrated in FIG. 10.

In this figure, the difference between the input to the CMTF integrator (signal $\tau\dot\chi(t)$ at point III) and the CMTF output may be designated as a prime output of an Analog Differential Clipper (ADiC) and may be considered to be a non-impulsive ("background") component extracted from the input signal. Further, the signal across the blanker (i.e. the difference between the blanker input x(t)−χ(t) and the blanker output τχ̇(t)) may be designated as an auxiliary output of an ADiC and may be considered to be an impulsive (outlier) component extracted from the input signal.

Figure 11:
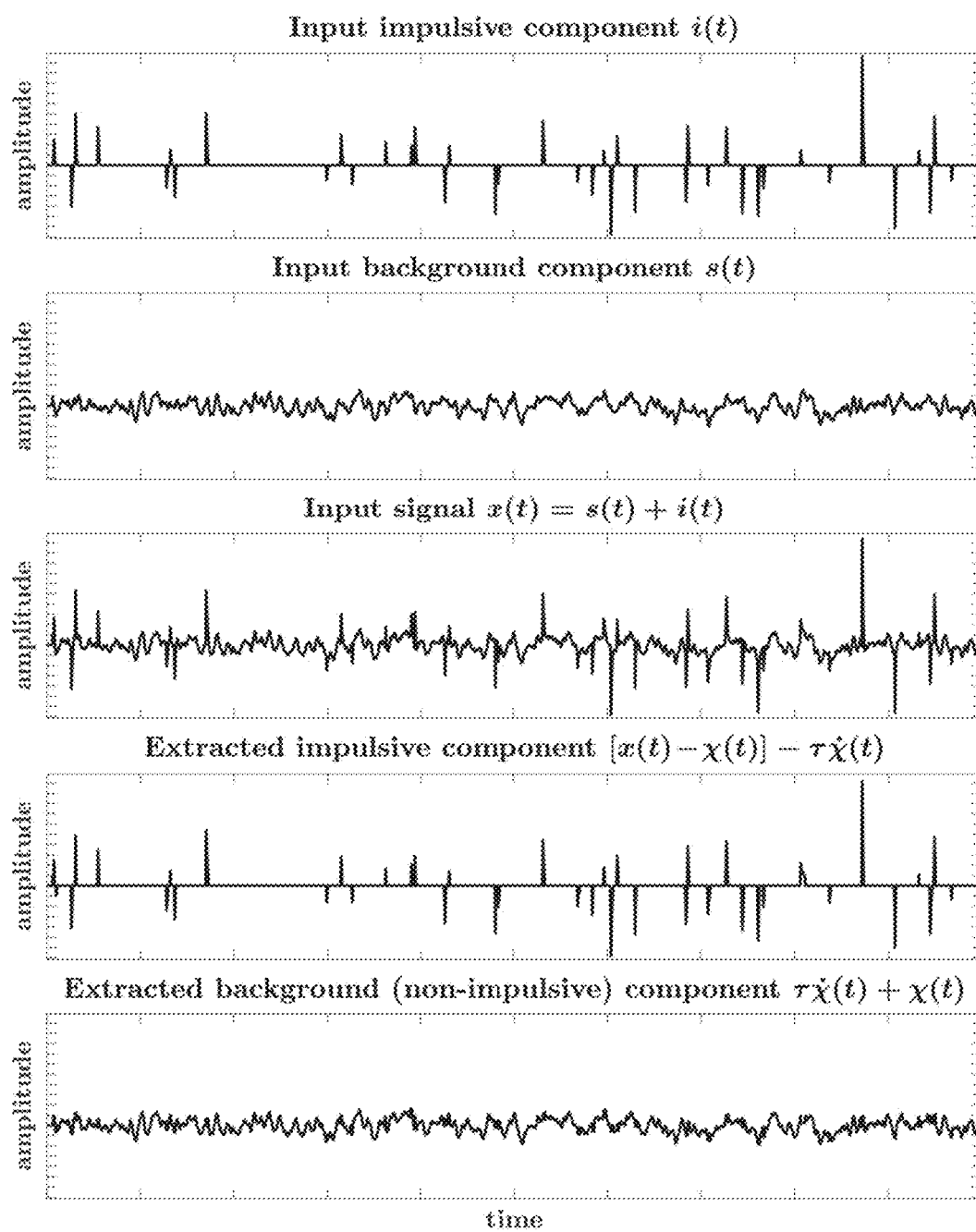
FIG. 11. Illustration of using CMTF with appropriate blanking range for separating impulsive and non-impulsive ("background") signal components.

FIG. 11 illustrates using a CMTF with an appropriately chosen blanking range for separating impulsive and non-impulsive ("background") signal components. Note that the sum of the prime and the auxiliary ADiC outputs would be effectively identical to the input signal, and thus the separation of impulsive and non-impulsive components may be achieved without reducing signal's bandwidth.

Figure 12:
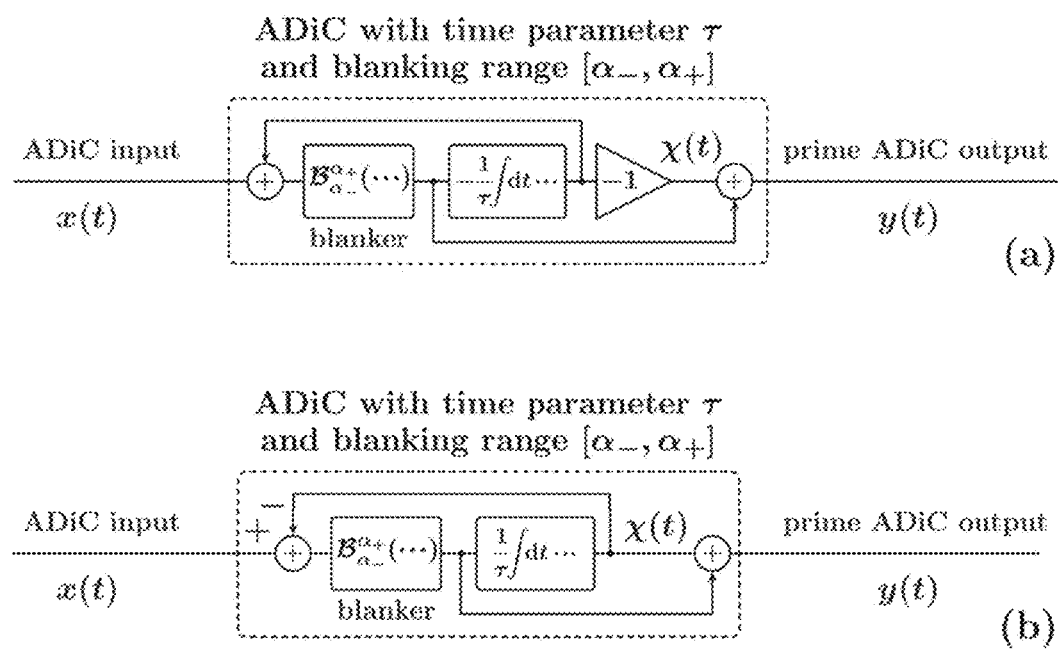
FIG. 12. Illustrative block diagrams of an ADiC with time parameter τ and blanking range $[\alpha_-,\alpha_+]$.

FIG. 12 provides illustrative block diagrams of an ADiC with time parameter τ and blanking range $[\alpha_-,\alpha_+]$. In the figure, x(t) is the ADiC input, and y(t) is the ("prime") ADiC output. We may call the "intermediate" signal χ(t) (the CMTF output) the Differential Clipping Level, and the blanker input is the "difference signal" x(t)−χ(t). The blanker output equals to its input if it falls within the blanking range $[\alpha_-,\alpha_+]$. Otherwise, this output is zero.

For a robust (i.e insensitive to outliers) blanking range $[\alpha_-,\alpha_+]$ around the difference signal, the portion of the difference signal that protrudes from this range may be identified as an outlier. As may be seen in FIG. 12, when the blanker's output is zero (that is, an outlier is encountered), χ(t) would be maintained at its previous level. As the result, in the ADiC's output the outliers would be replaced by the Differential Clipping Level χ(t), otherwise the signal would not be affected.

FIG. 13 provides a simplified illustrative electronic circuit diagram of using a CMTF/ADiC with an appropriately chosen blanking range $[\alpha_-,\alpha_+]$ for separating incoming signal x(t) into impulsive i(t) and non-impulsive s(t) ("background") signal components, and FIG. 14 provides an illustration of such separation by the circuit of FIG. 13.

Note that while a blanker used in the ADiC shown in FIG. 12, a depreciator described by a different transparency function (e.g. one of those shown in FIG. 4) may be used. In such a case, the ADiC output may be given by the following equation:

$$\begin{cases} y(t) = \chi(t) + \tau \dot{\chi}(t) \\ \dot{\chi}(t) = \frac{1}{\tau}\mathcal{T}_{\alpha_-}^{\alpha_+}(x(t) - \chi(t)) \end{cases} \quad (20)$$

As may be seen from equation (20), when the difference signal x(t)−χ(t) is within the transparency range $[\alpha_-,\alpha_+]$, then the ADiC output y(t) equals to its input x(t) (y(t)=χ(t)+[x(t)−χ(t)]=x(t)). However, when the difference signal is outside the transparency range (i.e an outlier is detected), the value of the transparency function is smaller then zero (for example, it is ε<1) and thus $\mathcal{T}_{\alpha_-}^{\alpha_+}(x(t)-\chi(t))=\varepsilon[x(t)-\chi(t)]$ and the outlier is depreciated (e.g. in the ADiC output the outlier is replaced by y(t)=χ(t)+ε[x(t)−χ(t)]).

2.5 Numerical Implementations of ABAINFs/CMTFs/ADiCs

Even though an ABAINF is an analog filter by definition, it may be easily implemented digitally, for example, in a Field Programmable Gate Array (FPGA) or software. A digital ABAINF would require very little memory and would be typically inexpensive computationally, which would make it suitable for real-time implementations.

An example of a numerical algorithm implementing a finite-difference version of a CMTF/ADiC may be given by the following MATLAB function:

```
function [chi,prime,aux]=CMTF_ADiC(x,t,tau,alpha_p,alpha_m)
  chi=zeros(size(x));
  aux=zeros(size(x));
  prime=zeros(size(x));
  dt=diff(t);
  chi(1)=x(1);
  B=0;
  for i=2:length(x);
    dX=x(i)−chi(i−1);
    if dX>alpha_p(i−1)
      B=0;
    elseif dX<alpha_m(i−1)
      B=0;
    else
      B=dX;
    end
    chi(i)=chi(i−1)+B/(tau+dt(i−1))*dt(i−1);  % numerical antiderivative
    prime(i)=B+chi(i−1);
    aux(i)=dX−B;
  end
return
```

In this example, "x" is the input signal, "t" is the time array, "tau" is the CMTF's time constant, "alpha_p" and "alpha_m" are the upper and the lower, respectively, blanking values, "chi" is the CMTF's output, "aux" is the extracted impulsive component (auxiliary ADiC output), and "prime" is the extracted non-impulsive ("background") component (prime ADiC output).

Note that we retain, for convenience, the abbreviations "ABAINF" and/or "ADiC" for finite-difference (digital) ABAINF and/or ADiC implementations.

FIG. 15 provides an illustration of separation of a discrete input signal "x" into an impulsive component "aux" and a non-impulsive ("background") component "prime" using the above MATLAB function with appropriately chosen blanking values "alpha_p" and "alpha_m".

A digital signal processing apparatus performing an ABAINF filtering function transforming an input signal into an output filtered signal would comprise an influence function characterized by a transparency range and operable to receive an influence function input and to produce an influence function output, and an integrator function characterized by an integration time constant and operable to receive an integrator input and to produce an integrator output, wherein said integrator output is proportional to a numerical antiderivative of said integrator input.

A hardware implementation of a digital ABAINF/CMTF/ADiC filtering function may be achieved by various means including, but not limited to, general-purpose and specialized microprocessors (DSPs), microcontrollers, FPGAs, ASICs. and ASSPs. A digital or a mixed-signal processing unit performing such a filtering function may also perform a variety of other similar and/or different functions.

3 Quantile Tracking Filters as Robust Means to Establish the ABAINF Transparency Range(s)

Let y(t) be a quasi-stationary signal with a finite interquartile range (IQR), characterized by an average crossing rate $\langle f \rangle$ of the threshold equal to some quantile q, 0<q<1, of y(t). (See [33, 34] for discussion of quantiles of continuous signals, and [44, 45] for discussion of threshold crossing rates.) Let us further consider the signal $Q_q(t)$ related to y(t) by the following differential equation:

$$\frac{d}{dt}Q_q = \frac{A}{T}[\text{sgn}(y - Q_q) + 2q - 1], \quad (21)$$

where A is a parameter with the same units as y and $Q_q$, and T is a constant with the units of time. According to equation (21), $Q_q(t)$ is a piecewise-linear signal consisting of alternating segments with positive (2qA/T) and negative (2(q-1)A/T) slopes. Note that $Q_q(t) \approx$ const for a sufficiently small A/T (e.g., much smaller than the product of the IQR and the average crossing rate $\langle f \rangle$ of y(t) and its qth quantile), and a steady-state solution of equation (21) can be written implicitly as $$\overline{\theta(Q_q - y)} \approx q, \quad (22)$$

where $\theta(x)$ is the Heaviside unit step function [30] and the overline denotes averaging over some time interval $\Delta T \gg \langle f \rangle^{-1}$. Thus $Q_q$ would approximate the qth quantile of y(t) [33, 34] in the time interval $\Delta T$.

We may call an apparatus (e.g. an electronic circuit) effectively implementing equation (21) a Quantile Tracking Filter.

Despite its simplicity, a circuit implementing equation (21) may provide robust means to establish the ABAINF transparency range(s) as a linear combination of various quantiles of the difference signal (e.g. its 1st and 3rd quartiles and/or the median). We will call such a circuit for q=½ a Median Tracking Filter (MTF), and for q=¼ and/or q=¾—a Quartile Tracking Filter (QTF).

FIG. 16 provides an illustrative block diagram of a circuit implementing equation (21) and thus tracking a qth quantile of y(t). As one may see in the figure, the difference between the input y(t) and the quantile output $Q_q(t)$ forms the input to an analog comparator which implements the function A sgn(y(t)−$Q_q$(t)). In reference to FIG. 16, we may call the term (2q−1)A added to the integrator input as the "quantile setting signal". A sum of the comparator output and the quantile setting signal forms the input of an integrator characterized by the time constant T, and the output of the integrator forms the quantile output $Q_q(t)$.

3.1 Median Tracking Filter

Let x(t) be a quasi-stationary signal characterized by an average crossing rate $\langle f \rangle$ of the threshold equal to the second quartile (median) of x(t). Let us further consider the signal $Q_2(t)$ related to x(t) by the following differential equation:

$$\frac{d}{dt}Q_2 = \frac{A}{T}\text{sgn}(x - Q_2), \quad (23)$$

where A is a constant with the same units as x and $Q_2$, and T is a constant with the units of time. According to equation (23), $Q_2(t)$ is a piecewise-linear signal consisting of alternating segments with positive (A/T) and negative (−A/T) slopes. Note that $Q_2(t) \approx$ const for a sufficiently small A/T (e.g., much smaller than the product of the interquartile range and the average crossing rate $\langle f \rangle$ of x(t) and its second quartile), and a steady-state solution of equation (23) may be written implicitly as $$\overline{\theta(Q_2 - x)} \approx \frac{1}{2}, \quad (24)$$

where the overline denotes averaging over some time interval $\Delta T \gg \langle f \rangle^{-1}$. Thus $Q_2$ approximates the second quartile of x(t) in the time interval $\Delta T$, and equation (23) describes a Median Tracking Filter (MTF). FIG. 17 illustrates the MTF's convergence to the steady state for different initial conditions.

3.2 Quartile Tracking Filters

Let y(t) be a quasi-stationary signal with a finite interquartile range (IQR), characterized by an average crossing rate $\langle f \rangle$ of the threshold equal to the third quartile of y(t). Let us further consider the signal $Q_3(t)$ related to y(t) by the following differential equation:

$$\frac{d}{dt}Q_3 = \frac{A}{T}\left[\text{sgn}(y - Q_3) + \frac{1}{2}\right], \quad (25)$$

where A is a constant (with the same units as y and $Q_3$), and T is a constant with the units of time. According to equation (25), $Q_3(t)$ is a piecewise-linear signal consisting of alternating segments with positive (3A/(2T)) and negative (−A/(2T)) slopes. Note that $Q_3(t) \approx$ const for a sufficiently small A/T (e.g., much smaller than the product of the IQR and the average crossing rate $\langle f \rangle$ of y(t) and its third quartile), and a steady-state solution of equation (25) may be written implicitly as $$\overline{\theta(Q_3 - y)} \approx \frac{3}{4}, \quad (26)$$

where the overline denotes averaging over some time interval $\Delta T \gg \langle f \rangle^{-1}$. Thus $Q_3$ approximates the third quartile of y(t) [33, 34] in the time interval $\Delta T$.

Similarly, for $$\frac{d}{dt}Q_1 = \frac{A}{T}\left[\text{sgn}(y - Q_1) - \frac{1}{2}\right] \quad (27)$$

a steady-state solution may be written as $$\overline{\theta(Q_1 - y)} \approx \frac{1}{4}, \quad (28)$$

and thus $Q_1$ would approximate the first quartile of y(t) in the time interval $\Delta T$.

FIG. 18 illustrates the QTFs' convergence to the steady state for different initial conditions.

One skilled in the art will recognize that (1) similar tracking filters may be constructed for other quantiles (such as, for example, terciles, quintiles, sextiles, and so on), and (2) a robust range $[\alpha_-,\alpha_+]$ that excludes outliers may be constructed in various ways, as, for example, a linear combination of various quantiles.

3.3 Numerical Implementations of ABAINFs/CMTFs/ADiCs Using Quantile Tracking Filters as Robust Means to Establish the Transparency Range For example, an ABAINF/CMTF/ADiC with an adaptive (possibly asymmetric) transparency range $[\alpha_-,\alpha_+]$ may be designed as follows. To ensure that the values of the difference signal $x(t)-\chi(t)$ that lie outside of $[\alpha_-,\alpha_+]$ are outliers, one may identify $[\alpha_-,\alpha_+]$ with Tukey's range [46], a linear combination of the 1st ($Q_1$) and the 3rd ($Q_3$) quartiles of the difference signal:

$$[\alpha_-,\alpha_+]=[Q_1-\beta(Q_3-Q_1),Q_3+\beta(Q_3-Q_1)], \quad (29)$$

where $\beta$ is a coefficient of order unity (e.g. $\beta=1.5$).

An example of a numerical algorithm implementing a finite-difference version of a CMTF/ADiC with the blanking range computed as Tukey's range of the difference signal using digital QTFs may be given by the MATLAB function "CMTF_ADiC_alpha" below.

In this example, the CMTF/ADiC filtering function further comprises a means of tracking the range of the difference signal that effectively excludes outliers of the difference signal, and wherein said means comprises a QTF estimating a quartile of the difference signal:

```
function [chi,prime,aux,alpha_p,alpha_m]=CMTF_ADi-
C_alpha(x,t,tau,beta,mu)
    chi=zeros(size(x));
    aux=zeros(size(x));
    prime=zeros(size(x));
    alpha_p=zeros(size(x));
    alpha_m=zeros(size(x));
    dt=diff(t);
    chi(1)=x(1);
    Q1=x(1);
    Q3=x(1);
    B=0;
    for i=2:length(x);
    dX=x(i)-chi(i-1);
    %
    ----------------------------------------------------------------
    % Update 1st and 3rd quartile values:
    Q1=Q1+mu*(sign(dX-Q1)-0.5)*dt(i-1); % numerical
        antiderivative
    Q3=Q3+mu*(sign(dX-Q3)+0.5)*dt(i-1); % numerical
        antiderivative
    % ----------------------------------------------------------------
    % Calculate blanking range:
    alpha_p(i)=Q3+beta*(Q3-Q1);
    alpha_m(i)=Q1-beta*(Q3-Q1);
    %
    ----------------------------------------------------------------
    if dX>alpha_p(i)
        B=0;
    elseif dX<alpha_m(i)
        B=0;
    else
        B=dX;
    end
    chi(i)=chi(i-1)+B/(tau+dt(i-1))*dt(i-1); % numerical
        antiderivative
    prime(i)=B+chi(i-1);
    aux(i)=dX-B;
    end
return
```

FIG. 19 provides an illustration of separation of discrete input signal "x" into impulsive component "aux" and non-impulsive ("background") component "prime" using the above MATLAB function of § 3.3 with the blanking range computed as Tukey's range using digital QTFs. The upper and lower limits of the blanking range are shown by the dashed lines in panel (b).

Since outputs of analog QTFs are piecewise-linear signals consisting of alternating segments with positive and negative slopes, a care should be taken in finite difference implementations of QTFs when $y(n)-Q_q(n-1)$ is outside of the interval hA $[2(q-1), 2q]/T$, where h is the time step. For example, in such a case one may set $Q_q(n)=y(n)$, as illustrated in the example below.

```
function [xADiC,xCMTF,residual,alpha_p,alpha_m]=ADi-
C_IQRscaling(x,dt,tau,beta,mu)
    Ntau=(1+floor(tau/dt));
    xADiC=zeros(size(x));    xCMTF=zeros(size(x));
    residual=zeros(size(x));
    alpha_p=zeros(size(x)); alpha_m=zeros(size(x));
    gamma=mu*dt;
    xADiC(1)=x(1); xCMTF(1)=x(1);
    Balphapm=0;
    Q1=x(1); Q3=x(1);
    for i=2:length(x);
    dX=x(i)-xCMTF(i-1);
    %
    ----------------------------------------------------------------
    % Update 1st and 3rd quartile values:
    dX3=dX-Q3;
    if dX3>-gamma/2 & dX3<3*gamma/2
        Q3=dX;
    else
        Q3=Q3+gamma*(sign(dX3)+0.5);
    end
    dX1=dX-Q1;
    if dX1>-3*gamma/2 & dX1<gamma/2
        Q1=dX;
    else
        Q1=Q1+gamma*(sign(dX1)-0.5);
    end
    %
    ----------------------------------------------------------------
    % Calculate blanking range:
    alpha_p(i)=Q3+beta*(Q3-Q1);
    alpha_m(i)=Q1-beta*(Q3-Q1);
    %
    ----------------------------------------------------------------
    M=(Q3+Q1)/2;
    R=(1+2*beta)*(Q3-Q1)/2;
    if dX>alpha_p(i)+1e-12
        Balphapm=dX*(R/(dX-M))^2
    elseif dX<alpha_m(i)-1e-12
        Balphapm=dX*(R/(dX-M))^2;
    else
        Balphapm=dX;
    end
    xCMTF(i)=xCMTF(i-1)+Balphapm/Ntau;
    xADiC(i)=Balphapm+xCMTF(i-1);
    residual(i)=dX-Balphapm;
    end
return
```

Note that in this example the following transparency function is used:

$$\mathcal{T}_{\alpha_-}^{\alpha_+}(x) = \begin{cases} 1 & \text{for } \alpha_- \leq x \leq \alpha_+ \\ \left(\dfrac{\mathcal{R}}{x-\mathcal{M}}\right)^2 & \text{otherwise} \end{cases}, \quad (30)$$

where $$\mathcal{R} = \frac{\alpha_+ - \alpha_-}{2}$$

and $$\mathcal{M} = \frac{\alpha_+ + \alpha_-}{2}.$$

This transparency function is illustrated in FIG. 20.

3.4 Adaptive Influence Function Design

The influence function choice determines the structure of the local nonlinearity imposed on the input signal. If the distribution of the non-Gaussian technogenic noise is known, then one may invoke the classic locally most powerful (LMP) test [47] to detect and mitigate the noise. The LMP test involves the use of local nonlinearity whose optimal choice corresponds to $$g_{lo}(n) = -\frac{f'(n)}{f(n)},$$

where $f(n)$ represents the technogenic noise density function and $f'(n)$ is its derivative. While the LMP test and the local nonlinearity is typically applied in the discrete time domain, the present invention enables the use of this idea to guide the design of influence functions in the analog domain. Additionally, non-stationarity in the noise distribution may motivate an online adaptive strategy to design influence functions.

Such adaptive online influence function design strategy may explore the methodology disclosed herein. In order to estimate the influence function, one may need to estimate both the density and its derivative of the noise. Since the difference signal $x(t)-\chi(t)$ of an ABAINF would effectively represent the non-Gaussian noise affecting the signal of interest, one may use a bank of N quantile tracking filters described in § 3 to determine the sample quantiles ($Q_1$, $Q_2$, ..., $Q_N$) of the difference signal. Then one may use a non-parametric regression technique such as, for example, a local polynomial kernel regression strategy to simultaneously estimate (1) the time-dependent amplitude distribution function $\Phi(D,t)$ of the difference signal, (2) its density function $\phi(D,t)$, and (3) the derivative of the density function $\partial\phi(D,t)/\partial D$.

4 Adaptive Intermittently Nonlinear Analog Filters for Mitigation of Outlier Noise in the Process of Analog-to-Digital Conversion Let us now illustrate analog-domain mitigation of outlier noise in the process of analog-to-digital (A/D) conversion that may be performed by deploying an ABAINF (for example, a CMTF) ahead of an ADC.

An illustrative principal block diagram of an adaptive CMTF for mitigation of outlier noise disclosed herein is shown in FIG. 21. Without loss of generality, here it may be assumed that the output ranges of the active components (e.g. the active filters, integrators, and comparators), as well as the input range of the analog-to-digital converter (A/D), are limited to a certain finite range, e.g., to the power supply range $\pm V_c$.

The time constant $\tau$ may be such that $1/(2\pi\tau)$ is similar to the corner frequency of the anti-aliasing filter (e.g., approximately twice the bandwidth of the signal of interest $B_x$), and the time constant T should be two to three orders of magnitude larger than $B_x^{-1}$. The purpose of the front-end lowpass filter would be to sufficiently limit the input noise power. However, its bandwidth may remain sufficiently wide (i.e. $\gamma \gg 1$) so that the impulsive noise is not excessively broadened.

Without loss of generality, we may further assume that the gain K is constant (and is largely determined by the value of the parameter $\gamma$, e.g., as $K \sim \sqrt{\gamma}$), and the gains G and g are adjusted (e.g. using automatic gain control) in order to well utilize the available output ranges of the active components, and the input range of the A/D. For example, G and g may be chosen to ensure that the average absolute value of the output signal (i.e., observed at point IV) is approximately $V_c/5$, and the average value of $Q_2^*(t)$ is approximately constant and is smaller than $V_c$.

4.1 CMTF Block

For the Clipped Mean Tracking Filter (CMTF) block shown in FIG. 21, the input $x(t)$ and the output $\chi(t)$ signals may be related by the following 1st order nonlinear differential equation:

$$\frac{d}{dt}\chi = \frac{1}{\tau}\mathcal{B}_{\frac{V_c}{g}}(x-\chi), \quad (31)$$

where the symmetrical blanking function $\mathcal{B}_\alpha(x)$ may be defined as $$\mathcal{B}_\alpha(x) = \begin{cases} x & \text{for } |x| \leq \alpha \\ 0 & \text{otherwise} \end{cases}, \quad (32)$$

and where the parameter $\alpha$ is the blanking value.

Note that for the blanking values such that $|x(t)-\chi(t)| \leq V_c/g$ for all t, equation (31) describes a 1st order linear lowpass filter with the corner frequency $1/(2\pi\tau)$, and the filter shown in FIG. 21 operates in a linear regime (see FIG. 22). However, when the values of the difference signal $x(t)-\chi(t)$ are outside of the interval $[-V_c/g, V_c/g]$, the rate of change of $\chi(t)$ is zero and no longer depends on the magnitude of $x(t)-\chi(t)$. Thus, if the values of the difference signal that lie outside of the interval $[-V_c/g, V_c/g]$ are outliers, the output $x(t)$ would be insensitive to further increase in the amplitude of such outliers. FIG. 6 illustrates resistance of a CMTF to outlier noise, in comparison with a 1st order linear lowpass filter with the same time constant. The shaded time intervals correspond to nonlinear CMTF behavior (zero rate of change). Note that the clipping (i.e. zero rate of change of the CMTF output) is performed differentially, based on the magnitude of the difference signal |x−χ| and not that of the input signal x.

In the filter shown in FIG. 21 the range $[-V_c/g, V_c/g]$ that excludes outliers is obtained as Tukey's lunge [46] for a symmetrical distribution, with V/g given by $$\frac{V_c}{g} = (1 + 2\beta)Q_2^*, \qquad (33)$$

where $Q_2^*$ is the 2nd quartile (median) of the absolute value of the difference signal |x(t)−χ(t)|, and where β is a coefficient of order unity (e.g. β=3). While in this example we use Tukey's range, various alternative approaches to establishing a robust interval $[-V_c/g, V_c/g]$ may be employed.

In FIG. 21, the MTF circuit receiving the absolute value of the blanker input and producing the MTF output, together with a means to maintain said MTF output at approximately constant value (e.g. using automatic gain control) and the gain stages preceding and following the blanker, establish a blanking range that effectively excludes outliers of the blanker input.

It would be important to note that, as illustrated in panel I of FIG. 22, in the linear regime the CMTF would operate as a 1st order linear lowpass filter with the corner frequency 1/(2πτ). It would exhibit nonlinear behavior only intermittently, in response to outliers in the difference signal, thus avoiding the detrimental effects, such as instabilities and intermodulation distortions, often associated with nonlinear filtering.

4.2 Baseband Filter

In the absence of the CMTF in the signal processing chain, the baseband filter following the A/D would have the impulse response w[k] that may be viewed as a digitally sampled continuous-time impulse response w(t) (see panel II of FIG. 22). As one may see in FIG. 21, the impulse response of this filter may be modified by adding the term τẇ[k], where the dot over the variable denotes its time derivative, and where ẇ[k] may be viewed as a digitally sampled continuous-time function ẇ(t). This added term would compensate for the insertion of a 1st order linear lowpass filter in the signal chain, as illustrated in FIG. 22.

Indeed, from the differential equation for a 1st order lowpass filter it would follow that $h_\tau^* (w+\tau\dot{w}) = w$, where the asterisk denotes convolution and where $h_\tau(t)$ is the impulse response of the 1st order linear lowpass filter with the corner frequency 1/(2πτ). Thus, provided that τ is sufficiently small (e.g., $T \lesssim 1/(2\pi B_{aa})$, where $B_{aa}$ is the nominal bandwidth of the anti-aliasing filter), the signal chains shown in panels I and II of FIG. 22 would be effectively equivalent. The impulse and frequency responses of w[k] (a root-raised-cosine filter with the roll-off factor ¼, bandwidth $5B_x/4$, and the sampling rate $8B_x$) and w[k]+τẇ[k] (with τ=1/(4π$B_x$)) used in the subsequent examples of this section are shown in FIG. 23.

4.3 Comparative Performance Examples

4.3.1 Simulation Parameters

To emulate the analog signals in the simulated examples presented below, the digitisation rate was chosen to be significantly higher (by about two orders of magnitude) than the A/D sampling rate.

The signal of interest is a Gaussian baseband signal in the nominal frequency rage [0, $B_x$]. It is generated as a broadband white Gaussian noise filtered with a root-raised-cosine filter with the roll-off factor ¼ and the bandwidth $5B_x/4$.

The noise affecting the signal of interest is a sum of an Additive White Gaussian Noise (AWGN) background component and white impulsive noise i(t). In order to demonstrate the applicability of the proposed approach to establishing a robust interval $[-V_c/g, V_c/g]$ for asymmetrical distributions, the impulsive noise is modelled as asymmetrical (unipolar) Poisson shot noise:

$$i(t) = |\nu(t)| \sum_{k=1}^{\infty} \delta(t - t_k), \qquad (34)$$

where ν(t) is AWGN noise, $t_k$ is the k-th arrival time of a Poisson point process with the rate parameter λ, and δ(x) is the Dirac δ-function [31]. In the examples below, $\lambda = 2B_x$.

The A/D sampling rate is $8B_x$ (that assumes a factor of 4 oversampling of the signal of interest), the A/D resolution is 12 bits, and the anti-aliasing filter is a 2nd order Butterworth lowpass filter with the corner frequency $2B_x$. Further, the range of the comparators in the QTFs is $\pm A = \pm V_c$, the time constants of the integrators are $T = 1/(4\pi B_x)$ and $T = 100/B_x$. The impulse responses of the baseband filters w[k] and w[k]++τẇ[k] are shown in the upper panel of FIG. 23.

The front-end lowpass filter is a 2nd order Bessel with the cutoff frequency γ/(2πτ). The value of the parameter γ is chosen as γ=16, and the gain of the anti-aliasing filter is $K = \sqrt{\gamma} = 4$. The gains G and g are chosen to ensure that the average absolute value of the output signal (i.e., observed at point IV in FIG. 21 and at point (c) in FIG. 22) is approximately $V_c/5$, and $$Q_2^*(t) \approx \frac{V_c}{1 + 2\beta} = const.$$

4.3.2 Comparative Channel Capacities

For the simulation parameters described above, FIG. 24 compares the simulated channel capacities (calculated from the baseband SNRs using the Shannon formula [42]) for various signal+noise compositions, for the linear signal processing chain shown in panel II of FIG. 22 (solid curves) and the CMTF-based chain of FIG. 21 with β=3 (dotted curves).

As one may see in FIG. 24 (and compare with the simplified diagram of FIG. 2), for a sufficiently large β both linear and the CMTF-based chains provide effectively equivalent performance when the AWGN dominates over the impulsive noise. However, the CMTF-based chains are insensitive to further increase in the impulsive noise when the latter becomes comparable or dominates over the thermal (Gaussian) noise, thus providing resistance to impulsive interference.

Further, the dashed curves in FIG. 24 show the simulated channel capacities for the CMTF-based chain of FIG. 21 (with β=3) when additional interference in an adjacent channel is added, as would be a reasonably common practical scenario. The passband of this interference is approximately $[3B_x, 4B_x]$, and the total power is approximately 4 times (6 dB) larger that that of the signal of interest. As one may see in FIG. 24, such interference increases the apparent blanking value needed to maintain effectively linear CMTF behaviour in the absence of the outliers, reducing the effectiveness of the impulsive noise suppression (more noticeably for higher AWGN SNRs).

It may be instructive to illustrate and compare the changes in the signal's time and frequency domain properties, and in its amplitude distributions, while it propagates through the signal processing chains, linear (points (a), (b), and (c) in panel II of FIG. 22), and the CMTF-based (points I through IV, and point V, in FIG. 21). Such an illustration is provided in FIG. 25. In the figure, the dashed lines (and the respective cross-hatched areas) correspond to the "ideal" signal of interest (without noise and adjacent channel interference), and the solid lines correspond to the signal+noise+interference mixtures. The leftmost panels show the time domain traces, the rightmost panels show the power spectral densities (PSDs), and the middle panels show the amplitude densities. The baseband power of the AWGN is one tenth of that of the signal of interest (10 dB AWGN SNR), and the baseband power of the impulsive noise is approximately 8 times (9 dB) that of the AWGN. The value of the parameter $\beta$ for Tukey's range is $\beta=3$. (These noise and adjacent channel interference conditions, and the value $\beta=3$, correspond to the respective channel capacities marked by the asterisks in FIG. 24).

Measure of Peakedness—

In the panels showing the amplitude densities, the peakedness of the signal+noise mixtures is measured and indicated in units of "decibels relative to Gaussian" (dBG). This measure is based on the classical definition of kurtosis [48], and for a real-valued signal may be expressed in terms of its kurtosis in relation to the kurtosis of the Gaussian (aka normal) distribution as follows [9, 10]:

$$K_{dBG}(x) = 10 lg \left[ \frac{\langle (x - \langle x \rangle)^4 \rangle}{3 \langle (x - \langle x \rangle)^2 \rangle^2} \right], \quad (35)$$

where the angular brackets denote the time averaging. According to this definition, a Gaussian distribution would have zero dBG peakedness, while sub-Gaussian and super-Gaussian distributions would have negative and positive dBG peakedness, respectively. In terms of the amplitude distribution of a signal, a higher peakedness compared to a Gaussian distribution (super-Gaussian) normally translates into "heavier tails" than those of a Gaussian distribution. In the time domain, high peakedness implies more frequent occurrence of outliers, that is, an impulsive signal.

Incoming Signal—

As one may see in the upper row of panels in FIG. 25, the incoming impulsive noise dominates over the AWGN. The peakedness of the signal+noise mixture is high (14.9 dBG), and its amplitude distribution has a heavy "tail" at positive amplitudes.

Linear Chain—

The anti-aliasing filter in the linear chain (row (b)) suppresses the high-frequency content of the noise, reducing the peakedness to 2.3 dBG. The matching filter in the baseband (row (c)) further limits the noise frequencies to within the baseband, reducing the peakedness to 0 dBG. Thus the observed baseband noise may be considered to be effectively Gaussian, and we may use the Shannon formula [42] based on the achieved baseband SNR (0.9 dB) to calculate the channel capacity. This is marked by the asterisk on the respective solid curve in FIG. 24. (Note that the achieved 0.9 dB baseband SNR is slightly larger than the "ideal" 0.5 dB SNR that would have been observed without "clipping" the outliers of the output of the anti-aliasing filter by the A/D at $\pm V_c$.)

CMTF-Based Chain—

As one may see in the panels of row V, the difference signal largely reflects the temporal and the amplitude structures of the noise and the adjacent channel signal. Thus its output may be used to obtain the range for identifying the noise outliers (i.e. the blanking value $V_c/g$). Note that a slight increase in the peakedness (from 14.9 dBG to 15.4 dBG) is mainly due to decreasing the contribution of the Gaussian signal of interest, as follows from the linearity property of kurtosis.

As may be seen in the panels of row II, since the CMTF disproportionately affects signals with different temporal and/or amplitude structures, it reduces the spectral density of the impulsive interference in the signal passband without significantly affecting the signal of interest. The impulsive noise is notably decreased, while the amplitude distribution of the filtered signal+noise mixture becomes effectively Gaussian.

The anti-aliasing (row III) and the baseband (row IV) filters further reduce the remaining noise to within the baseband, while the modified baseband filter also compensates for the insertion of the CMTF in the signal chain. This results in the 9.3 dB baseband SNR, leading to the channel capacity marked by the asterisk on the respective dashed-line curve in FIG. 24.

4.4 Alternative Topology for Signal Processing Chain Shown in FIG. 21

FIG. 26 provides an illustration of an alternative topology for signal processing chain shown in FIG. 21, where the blanking range is determined according to equation (29).

One skilled in the art will recognize that the topology shown in FIG. 21 and the topology shown in FIG. 26 both comprise a CMTF filter (transforming an input signal x(t) into an output signal χ(t)) characterized by a blanking range, and a robust means to establish said blanking range in such a way that it excludes the outliers in the difference signal x(t)−χ(t).

In FIG. 26, two QTFs receive a signal proportional to the blanker input and produce two QTF outputs, corresponding to the 1st and the 3rd quartiles of the QTF input. Then the blanking range of the blanker is established as a linear combination of these two outputs.

5 ΔΣ ADC with CMTF-Based Loop Filter

While § 4 discloses mitigation of outlier noise in the process of analog-to-digital conversion by ADiCs/CMTFs deployed ahead of an ADC, CMTF-based outlier noise filtering of the analog input signal may also be incorporated into loop filters of ΔΣ analog-to-digital converters.

Let us consider the modifications to a 2nd-order ΔΣ ADC depicted in FIG. 27. (Note that the vertical scales of the shown fragments of the signal traces vary for different fragments.) We may assume from here on that the 1st order lowpass filters with the time constant τ and the impulse response $h_\tau(t)$ shown in the figure have a bandwidth (as signified by the 3 dB corner frequency) that is much larger than the bandwidth of the signal of interest $B_x$, yet much smaller than the sampling (clock) frequency $F_s$. For example, the bandwidth of $h_\tau(t)$ may be approximately equal to the geometric mean of $B_x$ and $F_s$, resulting in the following value for $\tau$:

$$\tau \approx \frac{1}{2\pi\sqrt{B_x F_s}}. \quad (36)$$

As one may see in FIG. 27, the first integrator (with the time constant $\gamma\tau$) is preceded by a (symmetrical) blanker, where the (symmetrical) blanking function $\mathcal{B}_\alpha(x)$ may be defined as $$\mathcal{B}_\alpha(x) = \begin{cases} x & \text{for } |x| \leq \alpha \\ 0 & \text{otherwise} \end{cases}, \quad (37)$$

and where a is the blanking value.

As shown in the figure, the input $x(t)$ and the output $y(t)$ may be related by $$\frac{d}{dt}\overline{h_\tau * y} = \frac{1}{\gamma\tau}\overline{\mathcal{B}_\alpha(h_\tau * (x-y))}, \quad (38)$$

where the overlines denote averaging over a time interval between any pair of threshold (including zero) crossings of D (such as, e.g., the interval $\Delta T$ shown in FIG. 27), and the filter represented by equation (38) may be referred to as a Clipped Mean Tracking Filter (CMTF). Note that without the time averaging equation (38) corresponds to the ABAINF described by equation (15) with $\mu=0$, where x and X replaced by $h_\tau*x$ and $h_\tau*y$, respectively.

The utility of the 1st order lowpass filters $h_\tau(t)$ would be, first, to modify the amplitude density of the difference signal $x-y$ so that for a slowly varying signal of interest $x(t)$ the mean and the median values of $h_\tau*(x-y)$ in the time interval $\Delta T$ would become effectively equivalent, as illustrated in FIG. 28. However, the median value of $h_\tau*(x-y)$ would be more robust when the narrow-band signal of interest is affected by short-duration outliers such as broadband impulsive noise, since such outliers would not be excessively broadened by the wide-band filter $h_\tau(t)$. In addition, while being wide-band, this filter would prevent the amplitude of the background noise observed at the input of the blanker from being excessively large.

With $\tau$ given by equation (36), the parameter $\gamma$ may be chosen as $$\gamma \approx \frac{1}{4\pi B_x \tau} \approx \frac{1}{2}\sqrt{\frac{F_s}{B_x}}, \quad (39)$$

and the relation between the input and the output of the $\Delta\Sigma$ ADCs with a CMTF-based loop filter may be expressed as $$x(t-\Delta t) \approx ((w+\gamma\tau\dot{w})*y)(t). \quad (40)$$

Note that for large blanking values such that $\alpha \geq |h_\tau*(x-y)|$ for all t, according to equation (38) the average rate of change of $h_\tau*y$ would be proportional to the average of the difference signal $h_\tau*(x-y)$. When the magnitude of the difference signal $h_\tau*(x-y)$ exceeds the blanking value $\alpha$, however, the average rate of change of $h_\tau*y$ would be zero and would no longer depend on the magnitude of $h_\tau*x$, providing an output that would be insensitive to outliers with a characteristic amplitude determined by the blanking value $\alpha$.

Since linear filters are generally better than median for removing broadband Gaussian (e.g. thermal) noise, the blanking value in the CMTF-based topology should be chosen to ensure that the CMTF-based $\Delta\Sigma$ ADC performs effectively linearly when outliers are not present, and that it exhibits nonlinear behavior only intermittently, in response to outlier noise. An example of a robust approach to establishing such a blanking value is outlined in § 5.2.

One skilled in the art will recognize that the $\Delta\Sigma$ modulator depicted in FIG. 27 comprises a quantizer (flip-flop), a blanker, two integrators, and two wide-bandwidth 1st order lowpass filters, and the (nonlinear) loop filter of this modulator is configured in such a way that the value of the quantized representation (signal $y(t)$) of the input signal $x(t)$, averaged over a time interval $\Delta T$ comparable with an inverse of the nominal bandwidth of the signal of interest, is effectively proportional to a nonlinear measure of central tendency of said input signal $x(t)$ in said time interval $\Delta T$.

5.1 Simplified Performance Example

Let us first use a simplified synthetic signal to illustrate the essential features, and the advantages provided by the $\Delta\Sigma$ ADC with the CMTF-based loop filter configuration when the impulsive noise affecting the signal of interest dominates over a low-level background Gaussian noise.

In this example, the signal of interest consists of two fragments of two sinusoidal tones with 0.9V amplitudes, and with frequencies $B_x$ and $B_x/8$, respectively, separated by zero-value segments. While pure sine waves are chosen for an ease of visual assessment of the effects of the noise, one may envision that the low-frequency tone corresponds to a vowel in a speech signal, and that the high-frequency tone corresponds to a fricative consonant.

For all $\Delta\Sigma$ ADCs in this illustration, the flip-flop clock frequency is $F_s = NB_x$, where $N=1024$. For the 2nd-order loop filter in this illustration $\tau = (4\pi B_x)^{-1}$. The time constant $\tau$ of the 1st order lowpass filters in the CMTF-based loop filter is $\tau = (2\pi B_x \sqrt{N})^{-1} = (64\pi B_x)^{-1}$, and $\gamma=16$ (resulting in $\gamma\tau = (4\pi B_x)^{-1}$). The parameter $\alpha$ is chosen as $\alpha = V_c$. The output $y[k]$ of the $\Delta\Sigma$ ADC with the 1st-order linear loop filter (panel I of FIG. 1) is filtered with a digital lowpass filter with the impulse response $w[k]$. The outputs of the $\Delta\Sigma$ ADCs with the 2nd-order linear (panel II of FIG. 1) and the CMTF-based (FIG. 5) loop filters are filtered with a digital lowpass filter with the impulse response $w[k]+(4\pi B_x)^{-1}\dot{w}[k]$. The impulse and frequency responses of $w[k]$ and $w[k]+(4\pi B_x)^{-1}\dot{w}[k]$ are shown in FIG. 29.

As shown in panel I of FIG. 30, the signal is affected by a mixture of additive white Gaussian noise (AWGN) and white impulse (outlier) noise components, both band-limited to approximately $B_x\sqrt{N}$ bandwidth. As shown in panel II, in the absence of the outlier noise, the performance of all $\Delta\Sigma$ ADC in this example is effectively equivalent, and the amount of the AWGN is such that the resulting signal-to-noise ratio for the filtered output is approximately 20 dB in the absence of the outlier noise. The amount of the outlier noise is such that the resulting signal-to-noise ratio for the filtered output of the $\Delta\Sigma$ ADC with a 1st-order linear loop filter is approximately 6 dB in the absence of the AWGN.

As one may see in panels III and IV of FIG. 30, the linear loop filters are ineffective in suppressing the impulsive noise. Further, the performance of the $\Delta\Sigma$ ADC with the 2nd-order linear loop filter (see panel IV of FIG. 30) is more severely degraded by high-power noise, especially by high-amplitude outlier noise such that the condition $|x(t-\Delta t)+(w*v)(t)|<V_c$ is not satisfied for all t. On the other hand, as may be seen in panel V of FIG. 30, the $\Delta\Sigma$ ADC with the CMTF-based loop filter improves the signal-to-noise ratio by about 13 dB in comparison with the $\Delta\Sigma$ ADC with the 1st-order linear loop filter, thus removing about 95% of the impulsive noise.

More importantly, as may be seen in panel III of FIG. 31, increasing the impulsive noise power by an order of magnitude hardly affects the output of the $\Delta\Sigma$ ADC with the CMTF-based loop filter (and thus about 99.5% of the impulsive noise is removed), while further exceedingly degrading the output of the $\Delta\Sigma$ ADC with the 1st-order linear loop filter (panel II).

5.2 $\Delta\Sigma$ ADC with Adaptive CMTF

A CMTF with an adaptive (possibly asymmetric) blanking range $[\alpha_-,\alpha_+]$ may be designed as follows. To ensure that the values of the difference signal $h_\tau^*(x-y)$ that lie outside of $[\alpha_-,\alpha_+]$ are outliers, one may identify $[\alpha_-,\alpha_+]$ with Tukey's range [46], a linear combination of the 1st ($Q_1$) and the 3rd ($Q_3$) quartiles of the difference signal (see [33, 34] for additional discussion of quantiles of continuous signals):

$$[\alpha_-,\alpha_+]=[Q_1-\beta(Q_3-Q_1),Q_3+\beta(Q_3-Q_1)], \quad (41)$$

where $\beta$ is a coefficient of order unity (e.g. $\beta=1.5$). From equation (41), for a symmetrical distribution the range that excludes outliers may also be obtained as $[\alpha_-,\alpha_+]=[-\alpha,\alpha]$, where $\alpha$ is given by $$\alpha=(1+2\beta)Q^*_2, \quad (42)$$

and where $Q^*_2$ is the 2nd quartile (median) of the absolute value (or modulus) of the difference signal $|h_\tau^*(x-y)|$.

Alternatively, since $2Q^*_2=Q_3-Q_1$ for a symmetrical distribution, the resolution parameter $\alpha$ may be obtained as $$\alpha = \left(\frac{1}{2}+\beta\right)(Q_3 - Q_1), \quad (43)$$

where $Q_3-Q_1$ is the interquartile range (IQR) of the difference signal.

FIG. 32 provides an outline of a $\Delta\Sigma$ ADC with an adaptive CMTF-based loop filter. In this example, the 1st order lowpass filters are followed by the gain stages with the gain G, while the blanking value is set to $V_c$. Note that $$\mathcal{B}_{V_c}(Gx) = G\mathcal{B}_{\frac{V_c}{G}}(x), \quad (44)$$

and thus the "apparent" (or "equivalent") blanking value would be no longer hardware limited. As shown in FIG. 32, the input x(t) and the output y(t) may be related by $$\frac{d}{dt}\overline{h_\tau * y} = \frac{1}{\gamma\tau}\overline{\mathcal{B}_{\frac{V_c}{G}}(h_\tau * (x-y))}. \quad (45)$$

If an automatic gain control circuit maintains a constant output $-V_c/(1+2\beta)$ of the MTF circuit in FIG. 32, then the apparent blanking value $\alpha=V_c/G$ in equation (45) may be given by equation (42).

5.2.1 Performance Example

Simulation Parameters—

To emulate the analog signals in the examples below, the digitization rate is two orders of magnitude higher than the sampling rate $F_s$. The signal of interest is a Gaussian baseband signal in the nominal frequency rage $[0, B_x]$. It is generated as a broadband white Gaussian noise filtered with a root-raised-cosine filter with the roll-off factor ¼ and the bandwidth $5B_x/4$. The noise affecting the signal of interest is a sum of an AWGN background component and white impulsive noise i(t). The impulsive noise is modeled as symmetrical (bipolar) Poisson shot noise:

$$i(t) = v(t)\sum_{k=1}^{\infty}\delta(t-t_k), \quad (46)$$

where v(t) is AWGN noise, $t_k$ is the k-th arrival time of a Poisson process with the rate parameter $\lambda$, and $\delta(x)$ is the Dirac $\delta$-function [31]. In the examples below, $\lambda=B$. The gain G is chosen to maintain the output of the MTF in FIG. 32 at $-V_c/(1+2\beta)$, and the digital lowpass filter w[k] is the root-raised-cosine filter with the roll-off factor ¼ and the bandwidth $5B_x/4$. The remaining hardware parameters are the same as those in § 5.1. Further, the magnitude of the input x(t) is chosen to ensure that the average absolute value of the output signal is approximately $V_c/5$.

Comparative Channel Capacities—

For the simulation parameters described above. FIG. 33 compares the simulated channel capacities (calculated from the baseband SNRs using the Shannon formula [42]) for various signal+noise compositions, for the linear signal processing chain (solid lines) and the CMTF-based chain of FIG. 32 with $\beta=1.5$ (dotted lines).

As one may see in FIG. 33 (and compare with the simplified diagram of FIG. 2), linear and the CMTF-based chains provide effectively equivalent performance when the AWGN dominates over the impulsive noise. However, the CMTF-based chains are insensitive to further increase in the impulsive noise when the latter becomes comparable or dominates over the thermal (Gaussian) noise, thus providing resistance to impulsive interference.

Disproportionate Effect on Baseband PSDs—

For a mixture of white Gaussian and white impulsive noise, FIG. 34A illustrates reduction of the spectral density of impulsive noise in the signal baseband without affecting that of the signal of interest. In the figure, the solid lines correspond to the "ideal" signal of interest (without noise), and the dotted lines correspond to the signal+noise mixtures. The baseband power of the AWGN is one tenth of that of the signal of interest (10 dB AWGN SNR), and the baseband power of the impulsive noise is approximately 8 times (9 dB) that of the AWGN. The value of the parameter $\beta$ for Tukey's range is $\beta=1.5$. As may be seen in the figure, for the CMTF-based chain the baseband SNR increases from 0.5 dB to 9.7 dB.

For both the linear and the CMTF-based chains the observed baseband noise may be considered to be effectively Gaussian, and we may use the Shannon formula [42] based on the achieved baseband SNRs to calculate the channel capacities. Those are marked by the asterisks on the respective solid and dotted curves in FIG. 33.

FIG. 34B provides a similar illustration with additional interference in an adjacent channel. Such interference increases the apparent blanking value needed to maintain effectively linear CMTF behavior in the absence of the outliers, slightly reducing the effectiveness of the impulsive noise suppression. As a result, the baseband SNR increases from 0.5 dB to only 8.5 dB.

6 ΔΣ ADCs with Linear Loop Filters and Digital ADiC/CMTF Filtering

While § 5 describes CMTF-based outlier noise filtering of the analog input signal incorporated into loop filters of ΔΣ analog-to-digital converters, the high raw sampling rate (e.g. the flip-flop clock frequency) of a ΔΣ ADC (e.g. two to three orders of magnitude larger than the bandwidth of the signal of interest) may be used for effective ABAINF/CMTF/ADiC-based outlier filtering in the digital domain, following a ΔΣ modulator with a linear loop filter.

FIG. 35 shows illustrative signal chains for a ΔΣ ADC with linear loop and decimation filters (panel (a)), and for a ΔΣ ADC with linear loop filter and ADiC-based digital filtering (panel (b)). As may be seen in panel (a) of FIG. 35, the quantizer output of a ΔΣ ADC with linear loop filter would be filtered with a linear decimation filter that would typically combine lowpass filtering with downsampling. To enable an ADiC-based outlier filtering (panel (b)), a wideband (e.g. with bandwidth approximately equal to the geometric mean of the nominal signal bandwidth $B_x$ and the sampling frequency $F_s$) digital filter is first applied to the output of the quantizer. The output of this filter is then filtered by a digital ADiC (with appropriately chosen time parameter and the blanking range), followed by a linear lowpass/decimation filter.

FIG. 36 shows illustrative time-domain traces at points I through VI of FIG. 35, and the output of the ΔΣ ADC with linear loop and decimation filters for the signal affected by AWGN only (w/o impulsive noise). In this example, a 1st order ΔΣ modulator is used, and the quantizer produces a 1-bit output shown in panel II. The digital wideband filter is a 2nd order IIR Bessel filter with the corner frequency approximately equal to the geometric mean of the nominal signal bandwidth $B_x$ and the sampling frequency $F_s$. The time parameter of the ADiC is approximately $\tau \approx (4\pi B_x)^{-1}$, and the same lowpass/decimation filter is used as for the linear chain of FIG. 35 (a).

FIG. 37 shows illustrative signal chains for a ΔΣ ADC with linear loop and decimation filters (panel (a)), and for a ΔΣ ADC with linear loop filter and CMTF-based digital filtering (panel (b)). To enable a CMTF-based outlier filtering (panel (b)), a wideband digital filter is first applied to the output of the quantizer. The output of this filter is then filtered by a digital CMTF (with the time constant T and appropriately chosen blanking range), followed by a linear lowpass filtering (with the modified impulse response w[k]+ πẇ[k]) combined with decimation.

FIG. 38 shows illustrative time-domain traces at points I through VI of FIG. 37, and the output of the ΔΣ ADC with linear loop and decimation filters for the signal affected by AWGN only (w/o impulsive noise). In this example, a 1st order ΔΣ modulator is used, and the quantizer produces a 1-bit output shown in panel II. The digital wideband filter is a 2nd order IIR Bessel filter with the corner frequency approximately equal to the geometric mean of the nominal signal bandwidth $B_x$ and the sampling frequency $F_s$. The time parameter of the CMTF is $\tau = (4\pi B_x)^{-1}$, and the impulse response of the lowpass filter in the decimation stage is modified as w[k]+$(4\pi B_x)^{-1}$ẇ[k].

To prevent excessive distortions of the quantizer output by high-amplitude transients (especially for high-order ΔΣ modulators), and thus to increase the dynamic range of the ADC and/or the effectiveness of outlier filtering, an analog clipper (with appropriately chosen clipping values) should precede the ΔΣ modulator, as schematically shown in FIGS. 39 and 41.

FIG. 39 shows illustrative signal chains for a ΔΣ ADC with linear loop and decimation filters (panel (a)), and for a ΔΣ ADC with linear loop filter and ADiC-based digital filtering (panel (b)), with additional clipping of the analog input signal.

FIG. 40 shows illustrative time-domain traces at points I through VI of FIG. 39, and the output of the ΔΣ ADC with linear loop and decimation filters for the signal affected by AWCN only (w/o impulsive noise). In this example, a 1st order ΔΣ modulator is used, and the quantizer produces a 1-bit output. The digital wideband filter is a 2nd order IIR Bessel filter with the corner frequency approximately equal to the geometric mean of the nominal signal bandwidth $B_x$ and the sampling frequency $F_s$. The time parameter of the ADiC is approximately $\tau \approx (4\pi B_x)^{-1}$, and the same lowpass/decimation filter is used as for the linear chain of FIG. 39 (a).

FIG. 41 shows illustrative signal chains for a ΔΣ ADC with linear loop and decimation filters (panel (a)), and for a ΔΣ ADC with linear loop filter and CMTF-based digital filtering (panel (b)), with additional clipping of the analog input signal.

FIG. 42 shows illustrative time-domain traces at points I through VI of FIG. 41, and the output of the ΔΣ ADC with linear loop and decimation filters for the signal affected by AWGN only (w/o impulsive noise). In this example, a 1st order ΔΣ modulator is used, and the quantizer produces a 1-bit output. The digital wideband filter is a 2nd order IIR Bessel filter with the corner frequency approximately equal to the geometric mean of the nominal signal bandwidth $B_x$ and the sampling frequency $F_s$. The time parameter of the CMTF is $\tau = (4\pi B_x)^{-1}$, and the impulse response of the lowpass filter in the decimation stage is modified as w[k]+$(4\pi B_x)^{-1}$ẇ[k].

7 ADiC Variants

Let us revisit the ADiC block diagram shown in FIG. 12, where the depreciator is a blanker. In FIG. 12, x(t) is the input, y(t) is the output, and the "intermediate" signal χ(t) may be called the Differential Clipping Level (DCL). Without the blanker (or outliers), the DCL would be the output of a 1st order linear lowpass filter with the corner frequency $1/(2\pi\tau)$. The blanker input is the "difference signal" x(t)−χ(t). The blanker output would be equal to its input if the input falls within the blanking range, and would be zero otherwise.

If there is established a robust range $[\alpha_-, \alpha_+]$ around the difference signal, then whatever protrudes from this range may be identified as an outlier. As has been previously shown in this disclosure, such a robust range may be established in real time, for example, using quantile tracking filters.

While in the majority of the examples in this disclosure a robust range is established using quantile tracking filters, one skilled in the art will recognize that such a range may also be established based on a variety of other robust measures of dispersion of the difference signal, such as, for example, mean or median absolute deviation.

Here (and throughout the disclosure) "robust" should be read as "insensitive to outliers" when referred to filtering, establishing a range, estimating a measure of central tendency, etc.

"Robust" may also be read as "less-than-proportional" when referred to the change in an output of a filter, an estimator of a range and/or of a measure of central tendency, etc., in response to a change in the amplitude and/or the power of outliers.

While a linear filter (e.g. lowpass, bandpass, or bandstop) may not be a robust filter in general, it may perform as a robust filter when applied to a mixture of a signal and outliers when the signal and the outliers have sufficiently different bandwidths. For example, consider a mixture of a band-limited signal of interest and a wideband impulsive noise, and a linear filter that is transparent to the signal of interest while being opaque to the frequencies outside of the signal's band. When such a filter is applied to such a mixture, the amplitude and/or power of the signal of interest would not be affected, while the amplitude and/or power of the outliers (i.e. the impulsive noise) would be reduced. Thus this linear filter, while affecting the PSD of both the signal and the impulsive noise proportionally in the filter's passband, would disproportionately affect their PSDs outside of the filter's passband, and would disproportionately affect their amplitudes.

When the blanker's output is zero (that is, according to the above description, an outlier is encountered), the DCL $\chi(t)$ in the ADiC shown in FIG. 12 would be maintained at its previous level. As the result, in the ADiC's output the outliers would be replaced by the DCL $\chi(t)$, otherwise the signal would not be affected. Thus the ADiC's output would remain bounded to within the blanking (or transparency) range around the DCL.

As discussed in § 2.4, a DCL may also be formed by the output of a robust Measure of Central Tendency (MCT) filter such as, e.g., a CMTF, and the ADiC output may be formed as a weighted average of the input signal and the DCL (see equation (20)).

As discussed above (and especially when the signal and the outliers have sufficiently different bandwidths), a DCL may also be formed by the output of a linear filter that disproportionately reduces the amplitudes of the outliers in comparison with that of the signal of interest. An "ideal" linear filter to establish such a DCL would be a filter having an effectively unity frequency response and an effectively zero group delay over the bandwidth of the signal of interest.

When applied to the input signal x(t) comprising a signal of interest, a linear filter having an effectively unity frequency response and an effectively constant group delay $\Delta t > 0$ over the bandwidth of the signal of interest would establish a DCL for a delayed signal $x(t-\Delta t)$.

Further, a DCL may be formed by a large variety of linear and/or nonlinear filters, such that a filter produces an output that represents a measure of location of the input signal in a moving time window (a Windowed Measure of Location, or WML), and/or by a combination of such filters.

Thus, as illustrated in FIG. 43, an ADiC structure may also be given the following alternative description.

First, a Differential Clipping Level (DCL) $\chi(t)$ is formed. In FIG. 43, the DCL is formed by a DCL circuit that converts the input signal x(t) into the output $\chi(t)$. A preferred way to establish such a DCL would be to obtain it as an output of a robust (i.e. insensitive to outliers) filter estimating a local (windowed) measure of location (a Windowed Measure of Location, or WML) of the input signal x(t). Such a filter may be, for example, a median filter, a CMTF, an NDL, an MTF, a Trimean Tracking Filter (TTF), or a combination of such filters. However, a DCL may also be obtained by a linear (e.g. lowpass, bandpass, or bandstop) filter applied to the input signal x(t), or by a combination of linear and robust nonlinear filters mentioned above.

Then, a difference signal $x(t)-\chi(t)$ is obtained as the difference between the input signal x(t) and the DCL $\chi(t)$.

Next, a robust range $[\alpha_-(t), \alpha_+(t)]$ of the difference signal is determined, by a Robust Range Circuit (RRC), as a range between the upper ($\alpha_+(t)$) and the lower ($\alpha_-(t)$) robust "fences" for the difference signal. For example, such fences may be constructed as linear combinations of the outputs of quantile tracking filters, including linear combinations of the outputs of quantile tracking filters with different slew rate parameters. Several examples of (analog and/or digital) RRCs are provided in this disclosure, including those shown in FIGS. 21, 26, 32, 50, and 51.

The difference signal and the fences are used as input signals of a depreciator (or a differential depreciator, as described below) characterized by an influence function (or a differential influence function having a difference response, as described below) and producing a depreciator output that is effectively equal to the difference signal when the difference signal is within the robust range $[\alpha_-(t), \alpha_+(t)]$ (the "blanking range", or "transparency range"), smaller than the difference signal when the difference signal is larger than $\alpha_+(t)$, and larger than the difference signal when the difference signal is smaller than $\alpha_-(t)$.

In the examples of the depreciators discussed above, the influence function $\mathcal{I}_{\alpha_-}^{\alpha_+}{}_{\alpha_-}^{\alpha_+}(x)$ of a depreciator is characterized by the transparency function $\mathcal{T}_{\alpha_-}^{\alpha_+}{}_{\alpha_-}^{\alpha_+}(x)$ such that $\mathcal{I}_{\alpha_-}^{\alpha_+}{}_{\alpha_-}^{\alpha_+}(x) = x \mathcal{T}_{\alpha_-}^{\alpha_+}{}_{\alpha_-}^{\alpha_+}(x)$ (see, e.g., equations (12), (13), and (14)), and thus those examples imply that $\alpha_-(t) < 0 < \alpha_+(t)$. Various examples of such transparency functions are given throughout the disclosure, including those shown in FIGS. 3, 4, 20, 56, 58, 71, and 73.

In order to efficiently depreciate outliers when $\text{sign}(\alpha_-(t)) = \text{sign}(\alpha_+(t))$, it may be preferred to use a differential depreciator. The differential influence function $\mathcal{I}_{\alpha_-}^{\alpha_+}{}_{\underline{\alpha}}^{\underline{\alpha}}(x)$ of such a differential depreciator may be related to the influence function $\mathcal{I}_{\alpha_-}^{\alpha_+}{}_{\alpha_-}^{\alpha_+}(x)$ of the depreciators discussed previously as follows:

$$\mathcal{I}_{\alpha_-}^{\alpha_+}{}_{\underline{\alpha}}^{\underline{\alpha}}(x) = \mathcal{M} + \mathcal{I}_{\alpha_-}^{\alpha_+}{}_{\alpha_-}^{\alpha_+}(x - \mathcal{M}), \tag{47}$$

where $\mathcal{M}$ is an average value of the lower and the upper fences, $\alpha_-(t) < \mathcal{M} < \alpha_+(t)$ (e.g. $\mathcal{M} = (\alpha_-(t) + \alpha_+(t))/2$).

Note that it follows from equation (47) and the above discussion of influence functions that $x < \mathcal{I}_{\alpha}^{\alpha_+}{}_{\underline{\alpha}}^{\underline{\alpha}}(x) \leq \mathcal{M}$ for $x < \alpha_-$ and $\mathcal{M} \leq \mathcal{I}_{\alpha}^{\alpha_+}{}_{\underline{\alpha}}^{\underline{\alpha}}(x) < x$ for $\alpha_+ < x$.

It may be convenient to characterize a differential depreciator with the differential influence function $\mathcal{I}_{\alpha_-}^{\alpha_+}{}_{\underline{\alpha}}^{\underline{\alpha}}(x)$ by its difference response $x - \mathcal{I}_{\alpha_-}^{\alpha_+}{}_{\underline{\alpha}}^{\underline{\alpha}}(x)$ (i.e. by the difference between the input and the output of a depreciator), as illustrated in FIG. 44. It may be seen in FIG. 44 that the difference response of a differential depreciator is a monotonically increasing function of its input, and the difference response $x - \mathcal{I}_{\alpha}^{\alpha_+}{}_{\underline{\alpha}}^{\underline{\alpha}}(x)$ is effectively zero when the depreciator input is within the transparency range (i.e. for $\alpha_- < x < \alpha_+$).

A function $f(x)$ would be monotonically increasing (also increasing or non-decreasing) if for any $\Delta x \geq 0$ $f(x + \Delta x) \geq f(x)$.

Finally, as shown in FIG. 43, the ADiC output y(t) is formed as a sum of the DCL $\chi(t)$ and the depreciator output.

Specifically, for the blanking influence function $\mathcal{B}_{\alpha_-}^{\alpha_+}(x)$ (e.g. given by equation (18)), the ADiC output y(t) would be proportional to the ADiC input x(t) when the difference signal is within the range $[\alpha_-, \alpha_+]$, and it would be proportional to the DCL $\chi(t)$ otherwise:

$$y = G[\chi + \mathcal{B}_{\alpha_-}^{\alpha_+}(x - \chi)] = G\begin{cases} x & \text{for } \alpha_- \leq x - \chi \leq \alpha_+ \\ \chi & \text{otherwise} \end{cases}, \quad (48)$$

where G is a positive or a negative gain value.

FIG. 45 shows a block diagram of such an ADiC with a blanking depreciator, where the multiplication of the ADiC input x(t) and the DCL $\chi(t)$ by the depreciator weights is performed by a single pole double-throw switch (SPDT), forming the ADiC output y(t) according to equation (48) with G=1.

As shown in FIG. 45, a Window Detector Circuit (WDC) (or Window Comparator Circuit (WCC), or Dual Edge Limit Detector Circuit (DELDC)) may be used to determine whether the difference signal is within the range $[\alpha_-, \alpha_+]$, where said range is produced by an RRC.

In FIG. 45, the WDC outputs a two-level Switch Control Signal (SCS) so that the 1st level corresponds to the WDC input (the difference signal x(t)−χ(t)) being within the range $[\alpha_-, \alpha_+]$, $\alpha_- < x(t) - \chi(t) < \alpha_+$, and otherwise the WDC outputs the 2nd level. The 1st level WDC output puts the switch in position "1", and the second level puts the switch in position "2". As the result, in the ADiC output y(t) the outliers would be replaced by the DCL, χ(t), otherwise the signal would not be affected.

FIG. 46 shows illustrative signal traces for the ADiC shown in FIG. 45 with the DCL established by a linear lowpass filter, and the lower ($\alpha_+(t)$) robust fences for the difference signal are constructed as a linear combination of the outputs of two QTFs. In this example, the WML of the input signal x(t) is obtained as a weighted average in the moving window w(t).

If the outliers are depreciated by a differential blanker with the influence function $\overline{\mathcal{B}_{\alpha_-}^{\alpha_+}}(x)$ given by $$\overline{\mathcal{B}_{\alpha_-}^{\alpha_+}}(x) = \begin{cases} x & \text{for } \alpha_- \leq x \leq \alpha_+ \\ \frac{\alpha_+ + \alpha_-}{2} & \text{otherwise} \end{cases}, \quad (49)$$

then the ADiC output y(t) would be given by $$y(t) = G\begin{cases} x(t) & \text{for } \alpha_-(t) \leq x(t) - \chi(t) \leq \alpha_+(t) \\ \chi(t) + \frac{\alpha_+(t) + \alpha_-(t)}{2} & \text{otherwise} \end{cases}, \quad (50)$$

where G is a positive or a negative gain value.

7.1 Robust Filters

While a linear filter (e.g. lowpass, bandpass, or bandstop) may not be a robust filter in general, it may perform as a robust filter when applied to a mixture of a signal and outliers when the signal and the outliers have sufficiently different bandwidths. In such a case, a linear filter, while affecting the PSD of both the signal and the impulsive noise proportionally in the filter's passband, would disproportionately affect their PSDs outside of the filter's passband, and would disproportionately affect their amplitudes.

Examples of nonlinear filters estimating a robust local measure of location of the input signal x(i) include, but are not limited to, the following nonlinear filters: a median filter; a slew rate limiting filter; a Nonlinear Differential Limiter (NDL) [9, 10, 24, 32]; a Clipped Mean Tracking Filter (CMTF); a Median Tracking Filter (MTF); a Trimean Tracking Filter (TTF) described below (see § 7.1.1).

7.1.1 Trimean Tracking Filter (TTF)

Simple yet efficient real-time robust filters may be constructed as weighted averages of outputs of quantile tracking filters described in § 3.

In particular, a Trimean Tracking Filter (TTF) may be constructed as a weighted average of the outputs of the MTF (§ 3.1) and the QTFs (§ 3.2):

$$Q_{12w3}(t) = \frac{Q_1(t) + wQ_2(t) + Q_3(t)}{2 + w}, \quad (51)$$

where w≥0.

Note that in practical electronic-circuit (analog) TTF implementations continuous high-resolution comparators (see § 10.3) may be used for implementing the MTF and the QTFs. Alternatively, comparators with hysteresis (Schmitt triggers) may be used to reduce the comparator switching rates when the values of the inputs of the MTF and the QTFs are close to their respective outputs.

An example of a numerical algorithm implementing a finite-difference version of a TTF may be given by the following MATLAB function:

```
function y=TTF(x,dt,mu,w)
y=zeros(size(x(:)));
gamma=mu*dt; Q3=x(1); Q2=x(1); Q1=x(1); y(1)=x(1);
for i=2:length(x);
    dX=x(i) −Q3;
    if dX >−0.5*gamma & dX<1.5*gamma. Q3=x(i);
    else Q3=Q3+gamma*(sign(dX)+0.5);
    end
    dX=x(i) −Q2;
    if abs(dX)<gamma. Q2=x(i);
    else. Q2=Q2+gamma*sign(dX);
    end
    dX=x(i) −Q1;
    if dX >−1.5*gamma & dX<0.5*gamma. Q1=x(i);
    else. Q1=Q1+gamma*(sign(dX)−0.5);
    end
    y(i)=(Q1+w*Q2+Q3)/(2+w);
end
return
```

An example of a numerical algorithm implementing a numerical version of an ADiC with the DCL formed by a TTF may be given by the following MATLAB function:

```
function [xADiC,xDCL,alpha_p,alpha_m]=ADiC_TTF(x,
dt,mu_TTF,w,mu_range,beta)
%
-------------------------------------------------------------------------
xADiC=zeros(size(x)); xDCL=zeros(size(x));
alpha_p=zeros(size(x)); alpha_m=zeros(size(x));
gamma_TTF=mu_TTF*dt; gamma_range=mu_range*dt;
```

```
xADiC(1)=x(1); xDCL(1)=x(1);
Q3=x(1); Q2=x(1); Q1=x(1); dQ3=0; dQ1=0;
%
---------------------------------------------------------------
for i=2:length(x);
% TRIMEAN TRACKING FILTER (TTF)
    dX=x(i) -Q3;
    if dX >-0.5*gamma_TTF & dX<1.5*gamma_TTF Q3=x(i);
    else Q3=Q3+gamma_TTF*(sign(dX)+0.5); end
    dX=x(i) -Q2;
    if abs(dX)<gamma_TTF Q2=x(i);
    else Q2=Q2+gamma_TTF*sign(dX); end
    dX=x(i) -Q1;
    if dX >-1.5*gamma_TTF & dX<0.5*gamma_TTF Q1=x(i);
    else Q1=Q1+gamma_TTF*(sign(dX)-0.5); end
% TRIMEAN DCL
    xDCL(i)=(Q1+w*Q2+Q3)/(2+w);
% "Difference Signal"
    dX=x(i) -xDCL(i);
% QUARTILE TRACKING FILTERS (QTFs) for difference signal
    dX3=dX -dQ3;
    if dX3 >-0.5*gamma_range & dX3<1.5*gamma_range dQ3=dX;
    else dQ3=dQ3+gamma_range*(sign(dX3)+0.5); end
    dX1=dX  -dQ1; if dX1 >-1.5*gamma_range & dX1<0.5*gamma_range dQ1=dX;
    else dQ1=dQ1+gamma_range*(sign(dX1)-0.5); end
% TUKEY'S RANGE
    alpha_p(i)=dQ3+beta*(dQ3-dQ1);
    alpha_m(i)=dQ1-beta*(dQ3-dQ1);
% ADiC output
    if dX>alpha_p(i)|dX<alpha_m(i) xADiC(i)=xDCL(i);
    else xADiC(i)=x(i); end
end
return
```

FIG. 47 and FIG. 48 show illustrative signal traces for the ADiC shown in FIG. 45 with the DCL established by a TTF.

The top panel in FIG. 47 shows the input ADiC signal without noise (an up-chirp signal), and the panel second from the top shows the input ADiC signal with noise (the signal x(t) at point I in FIG. 45). The middle panel in FIG. 47 shows the DCL signal $\chi(t)$ established by a robust filter (a TTF) applied to x(i) (the signal $\chi(t)$ at point II in FIG. 45), and the panel second from the bottom shows the difference signal x(t)-$\chi(t)$ (the signal at point III in FIG. 45). The bottom panel in FIG. 47 shows the upper ($\alpha_+(t)$) and lower ($\alpha_-(t)$) fences of the difference signal produced by the Robust Range Circuit (RRC).

The top panel in FIG. 48 shows the bandpass-filtered up-chirp signal without noise, and the panel second from the top shows the bandpass-filtered signal with noise (the signal at point IV in FIG. 45). The middle panel in FIG. 48 shows the bandpass-filtered ADiC output y(t) (the signal at point V in FIG. 45), while the lower two panels show the bandpass-filtered noise with and without ADiC.

8 Simplified ADiC Structure

Note that the robust fences $\alpha_+(t)$ and $\alpha_-(t)$ may be constructed for the input signal itself (as opposed to the difference signal) in such a way that the DCL value may be formed as an average $\mathcal{M}(t)$ of the upper and lower fences, e.g., as the arithmetic mean of the fences: $\chi(t) = \mathcal{M}(t) = [\alpha_+(t) + \alpha_-(t)]/2$. Then, if the depreciator in FIG. 43 is characterized by the influence function $\mathcal{I}_{\alpha'_-}^{\alpha'_+}{}_{\alpha'_-}^{\alpha'_+}(x)$, where $\alpha'_+ = \alpha_+ - \mathcal{M}$ and $\alpha'_- = \alpha_- - \mathcal{M}$, the ADiC output y(t) would be described by $$y = \mathcal{M} + \mathcal{I}_{\alpha_-}^{\alpha_+}{}_{\alpha_-}^{\alpha_+} \mathcal{M}^{\alpha_+} \mathcal{M}_{+(x - \mathcal{M})} = \mathcal{I}_{\alpha_-}^{\alpha_+}{}_{\alpha_-}^{\alpha_+}(x). \quad (52)$$

FIG. 49 provides a block diagram of such simplified ADiC structure wherein the robust fences $\alpha_+(t)$ and $\alpha_-(t)$ are constructed for the input signal itself (as opposed to the difference signal) and the outliers are depreciated by a differential depreciator $\mathcal{I}_{\alpha}^{\alpha + g}_{g}(x)$.

The robust fences $\alpha_+(t)$ and $\alpha_-(t)$ may be constructed in a variety of ways, e.g. as linear combinations of the outputs of QTFs applied to the input signal.

FIG. 50 provides an example of such simplified ADiC structure wherein the robust fences $\alpha_+(t)$ and $\alpha_-(t)$ are constructed for the input signal as linear combinations of the outputs of QTFs applied to the input signal, and wherein the outliers are depreciated by a differential blanker that may be described by the differential blanking function $\mathcal{B}_{\alpha}^{g}(x)$ given by equation (49).

FIG. 51 provides a simplified diagram of illustrative electronic circuit for the ADiC structure shown in FIG. 50. In this example, ADiC circuit acts as an Outlier-Removing Buffer (ORB), removing the outliers without otherwise affecting the signal. As an example, FIG. 52 provides illustrative signal traces from an LTspice simulation of such simple ORB circuit. The upper panel in the figure shows the ORB's input, the middle panel shows its "fences" $\alpha_+(t)$ and $\alpha_-(t)$, and the lower panel shows the ORB output.

An example of a numerical algorithm implementing a numerical version of an ADiC shown in FIG. 50 may be given by the following MATLAB function:

```
function [xADiC,alpha_p,alpha_m]=ADiC_QTFs(x,dt,mu,beta)
%
---------------------------------------------------------------
xADiC=zeros(size(x));
alpha_p=zeros(size(x)); alpha_m=zeros(size(x));
gamma=mu*dt;
xADiC(1)=x(1); Q3=x(1); Q1=x(1);
for i=2:length(x);
% QTFs
    dX=x(i) -Q3;
    if dX>-0.5*gamma & dX<1.5*gamma Q3=x(i);
    else Q3=Q3+gamma*(sign(dX)+0.5); end
    dX=x(i) -Q1;
    if dX >-1.5*gamma & dX<0.5*gamma Q1=x(i);
    else Q1=Q1+gamma*(sign(dX)-0.5); end
% FENCES
    alpha_p(i)=Q3+beta*(Q3-Q1);
    alpha_m(i)=Q1-beta*(Q3-Q1);
% ADiC output
    if x(i)>alpha_p(i)|x(i)<alpha_m(i) xADiC(i)=0.5*(Q3+Q1);
    else xADiC(i)=x(i); end
end
return
```

FIG. 53 provides and example of applying a numerical version of an ADiC shown in FIG. 50 to the input signal used in FIG. 15, illustrating that its performance is similar to that of the MATLAB function of § 2.5.

8.1 Cascaded ADiC Structures

To improve suppression of outliers, two or more ADiCs may be cascaded, as illustrated in FIG. 54. Since an ADiC depreciates outliers, the fences in a subsequent ADiC may be made "tighter" as they would be less affected by the reduced (depreciated) outliers, thus enabling further outlier reduction.

This is illustrated in FIG. 55. The top panel in the figure shows the signal of interest affected by outlier noise (the signal x(i) in FIG. 54). While, as shown in the panel second from the top, the "intermediate" fences $\alpha'_+(t)$ and $\alpha'_-(t)$ (e.g. constructed using QTFs) would be relatively robust, they would still be affected by the outliers, and the range $[\alpha'_-, \alpha'_+]$ for the outlier depreciation may be unnecessarily wide. Since only those outliers that extend outside of the range $[\alpha'_-, \alpha'_+]$ would be depreciated, the "intermediate" ADiC output y'(t) would still contain outliers that do not protrude from the range formed by $\alpha'_+(t)$ and $\alpha'_-(t)$. This may be seen in the middle panel of FIG. 55.

Since the outliers in y'(t) are reduced in comparison with those in x(t), the fences $\alpha_+(t)$ and $\alpha_-(t)$ around y'(t) may be made "tighter" as they would be less affected by the reduced (depreciated) outliers, as may be seen in the panel second from the bottom in FIG. 55. This may enable further outlier reduction, since the outliers that extend outside of the reduced range $[\alpha_-, \alpha_+]$ would be depreciated, as may be seen in the bottom panel of the figure.

9 ADiC-Based Filtering of Complex-Valued Signals

In a number of applications it may be desirable to perform ADiC-based filtering of complex-valued signals. For example, since the power of transient interference in a quadrature receiver would be shared between the in-phase and the quadrature channels, the complex-valued processing (as opposed to separate processing of the in-phase/quadrature components) may have a potential of significantly improving the efficiency of the ADiC-based interference mitigation [8-10, 32, for example].

In a complex-valued ADiC with the input z(t) and the DCL $\zeta(t)$, outliers may be identified based on a magnitude of the complex-valued difference signal, e.g. based on $|z(t)-\zeta(t)|$.

For example, a complex-valued CMTF may be constructed as illustrated in FIG. 56.

In FIG. 56, an influence function $\mathcal{I}^{\alpha+}_{\alpha-\ \alpha^2}(x)$ is represented as $\mathcal{I}^{\alpha+}_{\alpha-\ \alpha^2}(x) = x \mathcal{T}^{\alpha}_{\alpha-\ \alpha^2}(x^2)$, where $\mathcal{T}^{\alpha}_{\alpha-\ \alpha^2}(x^2)$ is a transparency function with the characteristic transparency range $\alpha^2$. We may require that $\mathcal{T}^{\alpha+}_{\alpha\ \alpha^2}(x^2)$ is effectively (or approximately) unity for $x^2 \leq \alpha^2$, and that $\mathcal{T}^{\alpha+}_{\alpha-\ \alpha^2}(x^2)$ becomes smaller than unity (e.g. decays to zero) as $x^2$ increases for $x^2 > \alpha^2$.

As one should be able to see in FIG. 56, a nonlinear differential equation relating the input z(t) to the output $\zeta(t)$ of a complex-valued CMTF may be written as $$\frac{d}{dt}\zeta = \frac{1}{\tau}\mathcal{I}_{\alpha^2}(z-\zeta) = \frac{z-\zeta}{\tau}\mathcal{T}_{\alpha^2}(|z-\zeta|^2), \quad (53)$$

where $\tau$ is the CMTF's time parameter (or time constant).

One skilled in the art will recognize that, according to equation (53), when the magnitude of the difference signal $|z(t)-\zeta(t)|^2$ is within the transparency range, $|z-\zeta|^2 \leq \alpha^2$, the complex-valued CMTF would behave as a 1st order linear lowpass filter with the 3 dB corner frequency $1/(2\pi\tau)$, and, for a sufficiently large transparency range, the CMTF would exhibit nonlinear behavior only intermittently, when the magnitude of the difference signal extends outside the transparency range.

If the transparency range $\alpha^2(t)$ is chosen in such a way that it excludes outliers of $|z(t)-\zeta(t)|^2$, then, since the transparency function $\mathcal{T}^{\alpha-}_{\alpha\ \alpha^2}(x^2)$ decreases (e.g. decays to zero) for $x^2 > \alpha^2$, the contribution of such outliers to the output $\zeta(t)$ would be depreciated.

It may be important to note that outliers would be depreciated differentially, that is, based on the magnitude of the difference signal $|z(t)-\zeta(t)|^2$ and not the input signal z(t).

The degree of depreciation of outliers based on their magnitude would depend on how rapidly the transparency function $\mathcal{T}^{\alpha-}_{\alpha-\ \alpha^2}(x^2)$ decreases (e.g. decays to zero) for $x^2 > \alpha^2$. For example, as follows from equation (53), once the transparency function decays to zero, the output, $\zeta(t)$ would maintain a constant value until the magnitude of $|z(t)-\zeta(t)|^2$ returns to within non-zero values of the transparency function.

In FIG. 56, double-line arrows correspond to complex-valued signals, while single-line arrows correspond to real-valued signals.

An example of a numerical algorithm implementing a numerical version of a complex-valued ADiC with the DCL formed by a complex-valued CMTF may be given by the following MATLAB function:

```
function   [zADiC,zCMTF,dZsq_A,Q1,Q3,alpha]=ADiC_
complex(z,dt,tau,beta,mu)
%
-------------------------------------------------------------
Ntau=(1+floor(tau/dt)); A=1;
%
-------------------------------------------------------------
zADiC=zeros(size(z));         zCMTF=zeros(size(z));
dZsq_A=zeros(1,length(z));
Q1=zeros(1,length(z)); Q3=zeros(1,length(z));
alpha=zeros(1,length(z)); gamma=mu*dt;
%
-------------------------------------------------------------
zADiC(1)=z(1); zCMTF(1)=z(1); dZsq_A(1)=0;
Q1(1)=0; Q3(1)=0; alpha(1)=0; Balpha=0;
%
-------------------------------------------------------------
for i=2:length(z);
   dZ=z(i)-zCMTF(i-1); dZsq_A(i)=dZ*conj(dZ)/A;
%
   dZ_=dZsq_A(i) -Q3(i-1);
   if dZ_>-0.5*gamma & dZ_<1.5*gamma
      Q3(i)=dZsq_A(i);
   else
      Q3(i)=Q3(i-1)+gamma*(sign(dZ_)+0.5);
   end
   dZ_=dZsq_A(i) -Q1(i-1);
   if dZ_>-1.5*gamma & dZ_<0.5*gamma
      Q1(i)=dZsq_A(i);
   else
      Q1(i)=Q1(i-1)+gamma*(sign(dZ_)-0.5);
   end
%
-------------------------------------------------------------
% TUKEY'S upper fence
   alpha(i)=Q3(i)+beta*(Q3(i)-Q1(i));
%
-------------------------------------------------------------
   if dZsq_A(i)>alpha(i)
      Balpha=0;
``` else
  Balpha=dZ;
end
zCMTF(i)=zCMTF(i−1)+Balpha/Ntau;
zADiC(i)=Balpha+zCMTF(i−1);
end
return FIG. 57 provides an illustration of using a complex-valued ADiC for mitigation of impulsive interference (e.g. OOB interference from a digital communication transmitter) affecting the signal in a quadrature receiver. The leftmost panels show the in-phase (I) and the quadrature (Q) traces of the baseband QRSK-modulated received signal affected by a mixture of Gaussian (e.g. thermal) and impulsive noise, observed at a bandwidth significantly wider (e.g. several times or an order of magnitude wider) than the bandwidth of the signal of interest. In a linear receiver, this signal would be digitized, filtered with a matched filter, and appropriately sampled to obtain the received symbols. However, the power of the impulsive noise in the signal bandwidth is significant, which results in a noisy, low SNR output and high error rates. This may be seen from the constellation diagram shown in the top of the rightmost panels.

Since the power of the interference would be shared between the in-phase and the quadrature channels, we may treat the I and Q traces as a complex-valued signal z(t)=I(t)+iQ(t), and apply a complex-valued ADiC for mitigation of this interference before downsampling and applying a matched filter. As one may see from the constellation diagram shown in the bottom of the rightmost panels in FIG. 57, the ADiC filter suppresses the impulsive part of the interference affecting the baseband signal, increasing the SNR and decreasing the BER.

In FIG. 57, double-line arrows correspond to complex-valued signals.

As illustrated in FIG. 58, a complex-valued ADiC structure may also be given the following alternative description. In the figure, double-line arrows correspond to complex-valued signals, while single-line arrows correspond to real-valued signals.

First, a complex-valued Differential Clipping Level (DCL) $\zeta(t)$ is formed by an analog or digital DCL circuit. Such a DCL may be established as an output of a robust (i.e. insensitive to outliers) filter estimating a local Measure of Central Tendency (MCT) of the complex-valued input signal z(t). A complex-valued MCT filter may be formed, for example, by two real-valued MCT filters applied separately to the real and the imaginary components of z(t). Another example of a complex-valued MCT filter would be a complex-valued Median Tracking Filter (MTF) described in the next paragraph.

Complex-Valued Median Tracking Filter—

Let us consider the signal $\zeta(t)$ related to a complex-valued signal z(t) by the following differential equation:

$$\frac{d}{dt}\zeta = \frac{A}{T}\text{sgn}(z-\zeta) = \mu\text{sgn}(z-\zeta), \quad (54)$$

where A is a parameter with the same units as |z| and |ζ|, T is a constant with the units of time, and the signum (sign) function is defined as sgn(z)=z/|z|. The parameter μ may be called the slew rate parameter. Equation (54) would describe the relation between the input z(t) and the output $\zeta(t)$ of a particular robust filter for complex-valued signals, the Median Tracking Filter (MTF).

Then, the difference signal z(t) −$\zeta$(t) is obtained.

Next, a robust range α(t) for the magnitude of the difference signal is determined, by a Robust Range Circuit (RRC). Such a range may be, e.g., a robust upper fence α(t) constructed for |z(t)−$\zeta$(t)| as a linear combination of the outputs of quantile tracking filters applied to |z(t)−$\zeta$(t)|. Or, as shown in FIG. 58, such a range may be, e.g., a robust upper fence $\alpha^2(t)$ constructed for $|z(t)-\zeta(t)|^2$ as a linear combination of the outputs of quantile tracking filters applied to $|z(t)-\zeta(t)|^2$.

The magnitude of the difference signal and the upper fence are the input signals of the depreciator characterized by a transparency function and producing the output, e.g., $\mathcal{T}^{\alpha+}_{\alpha-}(|z-\zeta|)$ or $\mathcal{T}^{\alpha+}_{\alpha-}\alpha^2(|z-\zeta|^2)$, used for depreciation of outliers. Specifically, the ADiC output v(t) may be set to be equal to a weighted average of the input signal z(t) and the DCL $\zeta(t)$, with the weights given by the depreciator output $\mathcal{T}^{\alpha|}_{\alpha-}(|z-\zeta|)$ or $\mathcal{T}^{\alpha|}_{\alpha-}\alpha^2(|z-\zeta|^2)$ as follows:

$$v=\zeta+(z-\zeta)\mathcal{T}^{\alpha+}_{\alpha-}(|z-\zeta|), \quad (55)$$

or, as shown in FIG. 58.

$$v=\zeta+(z-\zeta)\mathcal{T}^{\alpha|}_{\alpha-}\alpha^2(|z-\zeta|^2). \quad (56)$$

For example, for the transparency function given by a boxcar function, the ADiC output v(t) would be equal to the ADiC input z(t) when the difference signal is within the range (e.g. α(t) or $\alpha^2(t)$), and it would be equal to the DCL $\zeta(t)$ otherwise:

$$v = \begin{cases} z & \text{for } |z-\zeta| \leq \alpha \\ \zeta & \text{otherwise} \end{cases}. \quad (57)$$

An example of a numerical algorithm implementing a numerical version of a complex-valued ADiC with the DCL formed by a complex-valued MTF, a boxcar depreciator, and a robust upper fence $\alpha^2(t)$ constructed for $|z(t)-\zeta(t)|^2$ using QTFs, may be given by the following MATLAB function:

```
function [zADiC,zMTF,dZsq_A,alpha]=ADiC_MTF_complex(z,dt,mu_MTF,mu_range,beta)
%
-----------------------------------------------------------------
zADiC=zeros(size(z));            zMTF=zeros(size(z));
dZsq_A=zeros(1,length(z));
alpha=zeros(1,length(z));        gamma_MTF=mu_MTF*dt;
gamma_range=mu_range*dt;
%
-----------------------------------------------------------------
zADiC(1)=z(1); zMTF(1)=z(1); dZsq_A(1)=0; alpha(1)=0;
Q3=0; Q1=0;
%
-----------------------------------------------------------------
for i=2:length(z);
dZ=z(i)-zMTF(i-1); dZsq_A(i)=dZ*conj(dZ);
%
-----------------------------------------------------------------
% MEDIAN TRACKING FILTER (MTF) applied to incoming signal
    if abs(dZ)<gamma_MTF
   zMTF(i)=z(i);
    else
   zMTF(i)=zMTF(i-1)+gamma_MTF*(sign(dZ));
    end
%
-----------------------------------------------------------------
% QUARTILE TRACKING FILTERS (QTFs) applied to squared difference signal
```

```
dZ_=dZsq_A(i) -Q3;
if dZ_>-0.5*gamma_range & dZ_<1.5*gamma_range
Q3=dZsq_A(i);
else
Q3=Q3+gamma_range*(sign(dZ_)+0.5);
end
dZ_=dZsq_A(i) -Q1;
if dZ_>-1.5*gamma_range & dZ_<0.5*gamma_range
Q1=dZsq_A(i);
else
Q1=Q1+gamma_range*(sign(dZ_)-0.5);
end
%
----------------------------------------------------------------
% TUKEY'S upper fence
   alpha(i)=Q3+beta*(Q3-Q1);
%
----------------------------------------------------------------
% ADiC output
   if dZsq_A(i)>alpha(i) zADiC(i)=zMTF(i); else zADiC(i)
=z(i); end
end
return
```

10 Explanatory Comments and Discussion

It should be understood that the specific examples in this disclosure, while indicating preferred embodiments of the invention, are presented for illustration only. Various changes and modifications within the spirit and scope of the invention should become apparent to those skilled in the art from this detailed description. Furthermore, all the mathematical expressions, diagrams, and the examples of hardware implementations are used only as a descriptive language to convey the inventive ideas clearly, and are not limitative of the claimed invention.

Further, one skilled in the art will recognize that the various equalities and/or mathematical functions used in this disclosure are approximations that are based on some simplifying assumptions and are used to represent quantities with only finite precision. We may use the word "effectively" (as opposed to "precisely") to emphasize that only a finite order of approximation (in amplitude as well as time and/or frequency domains) may be expected in hardware implementation.

Ideal Vs. "Real" Blankers—

For example, we may say that an output of a blanker characterized by a blanking value is effectively zero when the absolute value (modulus) of said output is much smaller (e.g. by an order of magnitude or more) than the blanking range.

In addition to finite precision, a "real" blanker may be characterized by various other non-idealities. For example, it may exhibit hysteresis, when the blanker's state depends on its history.

For a "real" blanker, when the value of its input x extends outside of its blanking range $[\alpha_-, \alpha_+]$, the value of its transparency function would decrease to effectively zero value over some finite range of the increase (decrease) in x. If said range of the increase (decrease) in x is much smaller (e.g. by an order of magnitude or more) than the blanking range, we may consider such a "real" blanker as being effectively described by equations (18), (32) and/or (37).

Further, in a "real" blanker the change in the blanker's output may be "lagging", due to various delays in a physical circuit, the change in the input signal. However, when the magnitude of such lagging is sufficiently small (e.g. smaller than the inverse bandwidth of the input signal), and provided that the absolute value of the blanker output decreases to effectively zero value, or restores back to the input value, over a range of change in x much smaller than the blanking range (e.g. by an order of magnitude or more), we may consider such a "real" blanker as being effectively described by equations (18), (32) and/or (37).

10.1 Mitigation of Non-Gaussian (e.g. Outlier) Noise in the Process of Analog-to-Digital Conversion: Analog and Digital Approaches Conceptually, ABAINFs are analog filters that combine bandwidth reduction with mitigation of interference. One may think of non-Gaussian interference as having some temporal and/or amplitude structure that distinguishes it form a purely random Gaussian (e.g. thermal) noise. Such structure may be viewed as some "coupling" among different frequencies of a non-Gaussian signal, and may typically require a relatively wide bandwidth to be observed. A linear filter that suppresses the frequency components outside of its passband, while reducing the non-Gaussian signal's bandwidth, may destroy this coupling, altering the structure of the signal. That may complicate further identification of the non-Gaussian interference and its separation from a Gaussian noise and the signal of interest by nonlinear filters such as ABAINFs.

In order to mitigate non-Gaussian interference efficiently, the input signal to an ABAINF would need to include the noise and interference in a relatively wide band, much wider (e.g. ten times wider) than the bandwidth of the signal of interest. Thus the best conceptual placement for an ABAINF may be in the analog part of the signal chain, for example, ahead of an ADC, or incorporated into the analog loop filter of a $\Delta\Sigma$ ADC. However, digital ABAINF implementations may offer many advantages typically associated with digital processing, including, but not limited to, simplified development and testing, configurability, and reproducibility.

In addition, as illustrated in § 3.3, a means of tracking the range of the difference signal that effectively excludes outliers of the difference signal may be easily incorporated into digital ABAINF implementations, without a need for separate circuits implementing such a means.

While real-time finite-difference implementations of the ABAINFs described above would be relatively simple and computationally inexpensive, their efficient use would still require a digital signal with a sampling rate much higher (for example, ten times or more higher) than the Nyquist rate of the signal of interest.

Since the magnitude of a noise affecting the signal of interest would typically increase with the increase in the bandwidth, while the amplitude of the signal+noise mixture would need to remain within the ADC range, a high-rate sampling may have a perceived disadvantage of lowering the effective ADC resolution with respect to the signal of interest, especially for strong noise and/or weak signal of interest, and especially for impulsive noise. However, since the sampling rate would be much higher (for example, ten times or more higher) than the Nyquist rate of the signal of interest, the ABAINF output may be further filtered and downsampled using an appropriate decimation filter (for example, a polyphase filter) to provide the desired higher-resolution signal at lower sampling rate. Such a decimation filter may counteract the apparent resolution loss, and may further increase the resolution (for example, if the ADC is based on $\Delta\Sigma$ modulators).

Further, a simple (non-differential) "hard" or "soft." clipper may be employed ahead of an ADC to limit the magnitude of excessively strong outliers in the input signal.

As discussed earlier, mitigation of non-Gaussian (e.g. outlier) noise in the process of analog-to-digital conversion may be achieved by deploying analog ABAINFs (e.g. CMTFs or ADiCs) ahead of the anti-aliasing filter of an ADC, or by incorporating them into the analog loop filter of a $\Delta\Sigma$ ADC, as illustrated in FIG. 59, panels (a) and (b), respectively.

Alternatively, as illustrated in panel (b) of FIG. 59, a wider-bandwidth anti-aliasing filter may be employed ahead of an ADC, and an ADC with a respectively higher sampling rate may be employed in the digital part. A digital ABAINF (e.g. CMTF or ADiC) may then be used to reduce non-Gaussian (e.g. impulsive) interference affecting a narrower-band signal of interest. Then the output of the ABAINF may be further filtered with a digital filter, (optionally) downsampled, and passed to the subsequent digital signal processing.

Prohibitively low (e.g. 1-bit) amplitude resolution of the output of a $\Delta\Sigma$ modulator would not allow direct application of a digital ABAINF. However, since the oversampling rate of a $\Delta\Sigma$ modulator would be significantly higher (e.g. by two to three orders of magnitude) than the Nyquist rate of the signal of interest, a wideband (e.g. with bandwidth approximately equal to the geometric mean of the nominal signal bandwidth $B_x$ and the sampling frequency $F_s$) digital filter may be first applied to the output of the quantizer to enable ABAINF-based outlier filtering, as illustrated in panel (b) of FIG. 60.

It may be important to note that the output of such a wideband digital filter would still contain a significant amount of high-frequency digitization (quantization) noise. As follows from the discussion in § 3, the presence of such noise may significantly simplify using quantile tracking filters as a means of determining the range of the difference signal that effectively excludes outliers of the difference signal.

The output of the wideband filter may then be filtered by a digital ABAINF (with appropriately chosen time parameter and the blanking range), followed by a linear lowpass/decimation filter.

10.2 Comments on $\Delta\Sigma$ Modulators

The 1st order $\Delta\Sigma$ modulator shown in panel I of FIG. 1 may be described as follows. The input D to the flip-flop, or latch, is proportional to an integrated difference between the input signal x(t) of the modulator and the output Q. The clock input to the flip-flop provides a control signal. If the input D to the flip-flop is greater than zero, D>0, at a definite portion of the clock cycle (such as the rising edge of the clock), then the output Q takes a positive value $V_c$, Q=$V_c$. If D<0 at a rising edge of the clock, then the output Q takes a negative value $-V_c$, Q=$-V_c$. At other times, the output Q does not change. It may be assumed that $\overline{Q}$ is the compliment of Q and $\overline{Q}$=-Q.

Without loss of generality, we may require that if D=0 at a clock's rising edge, the output Q retains its previous value.

Figure 1:
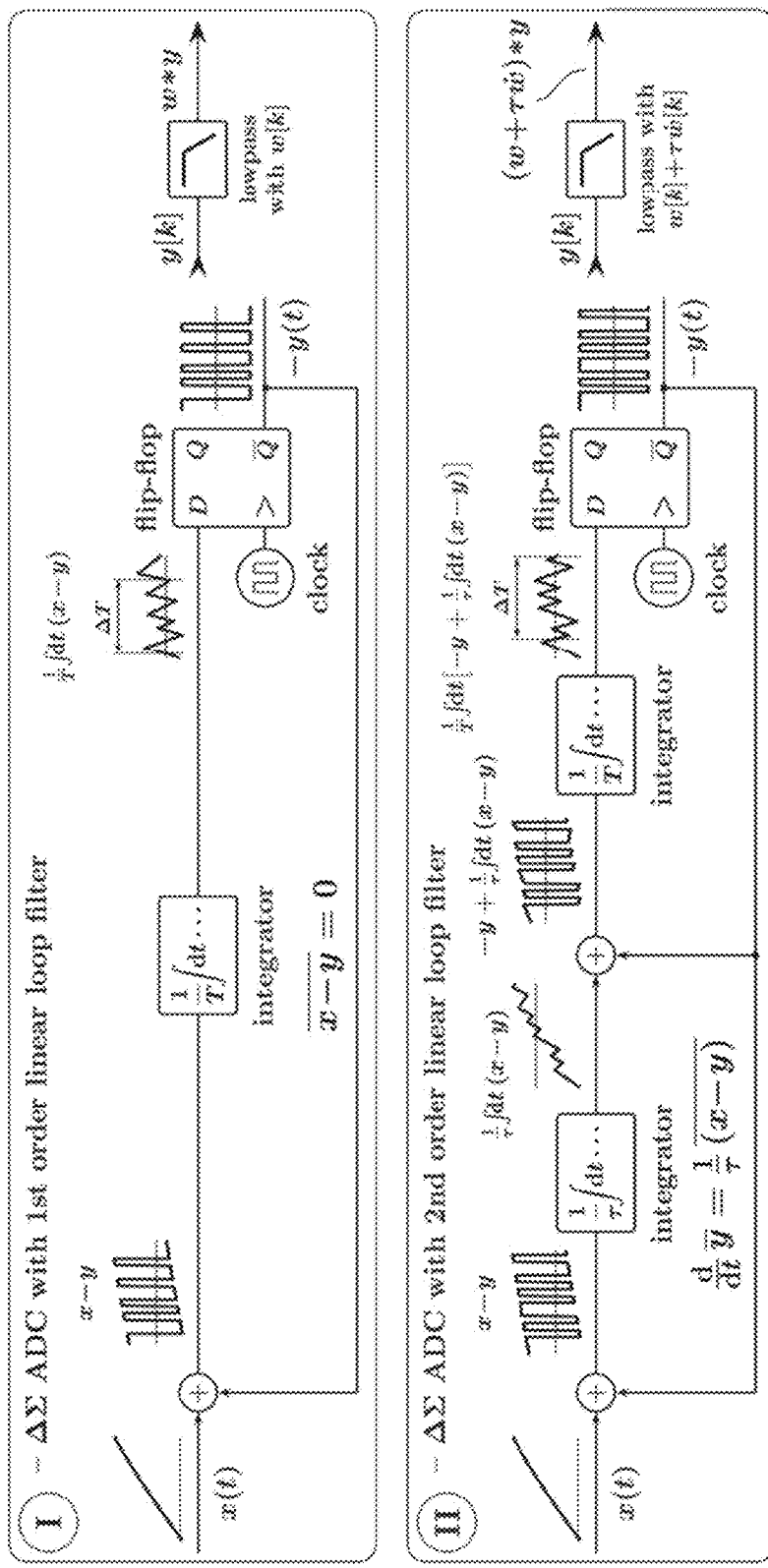
FIG. 1. ΔΣ ADCs with 1st-order (I) and 2nd-order (II) linear loop filters.

One may see in panel I of FIG. 1 that the output Q is a quantized representation of the input signal, and the flip-flop may be viewed as a quantizer. One may also see that the integrated difference between the input signal of the modulator and the output Q (the input D to the flip-flop) may be viewed as a particular type of a weighted difference between the input and the output signals. One may further see that the output Q is indicative of this weighted difference, since the sign of the output values (positive or negative) is determined by the sign of the weighted difference (the input D to the flip-flop).

One skilled in the art will recognize that the digital quantizer in a $\Delta\Sigma$ modulator may be replaced by its analog "equivalent" (i.e. Schmitt trigger, or comparator with hysteresis).

Also, the quantizer may be realized with an N-level comparator, thus the modulator would have a $\log_2$(N)-bit output. A simple comparator with 2 levels would be a 1-bit quantizer; a 3-level quantizer may be called a "1.5-bit" quantizer; a 4-level quantizer would be a 2-bit quantizer; a 5-level quantizer would be a "2.5-bit" quantizer.

10.3 Comparators, Discriminators, Clippers, and Limiters

A comparator, or a discriminator, may be typically understood as a circuit or a device that only produces an output when the input exceeds a fixed value.

For example, consider a simple measurement process whereby a signal x(t) is compared to a threshold value D. The ideal measuring device would return '0' or '1' depending on whether x(t) is larger or smaller than D. The output of such a device may be represented by the Heaviside unit step function θ(D−x(t)) [30], which is discontinuous at zero. Such a device may be called an ideal comparator, or an ideal discriminator.

More generally, a discriminator/comparator may be represented by a continuous discriminator function $\mathcal{F}_\alpha(x)$ with a characteristic width (resolution) a such that $\lim_{\alpha \to 0} \mathcal{M}_\alpha(x) = \theta(x)$.

In practice, many different circuits may serve as discriminators, since any continuous monotonic function with constant unequal horizontal asymptotes would produce the desired response under appropriate scaling and reflection. For example, the voltage-current characteristic of a subthreshold transconductance amplifier [49, 50] may be described by the hyperbolic tangent function, $\mathcal{F}_\alpha(x) = A\tanh(x/\alpha)$. Note that $$\lim_{\alpha \to 0} \frac{\tilde{\mathcal{F}}_\alpha(x) - A}{2A} = \theta(x),$$

and thus such an amplifier may serve as a discriminator.

When $\alpha \ll A$, a continuous comparator may be called a high-resolution comparator.

A particularly simple continuous discriminator function with a "ramp" transition may be defined as $$\mathcal{F}_{g,A}(x) = \begin{cases} gx & \text{for } g|x| \leq A \\ A\text{sgn}(x) & \text{otherwise} \end{cases}, \quad (58)$$

where g may be called the gain of the comparator, and A is the comparator limit.

Note that a high-gain comparator would be a high-resolution comparator.

The "ramp" comparator described by equation (58) may also be called a clipping amplifier (or simply a "clipper") with the clipping value A and gain g.

For asymmetrical clipping values $\alpha_+$ (upper) and $\alpha_-$ (lower), a clipper may be described by the following clipping function $C_{\alpha_-}^{\alpha_+}(x)$:

$$C_{\alpha_-}^{\alpha_+}(x) = \begin{cases} \alpha_+ & \text{for } x > \alpha_+ \\ \alpha_- & \text{for } x < \alpha_- \\ x & \text{otherwise} \end{cases} \quad (59)$$

It may be assumed in this disclosure that the outputs of the active components (such as, e.g., the active filters, integrators, and the gain/amplifier stages) may be limited to (or clipped at) certain finite ranges, for example, those determined by the power supplies, and that the recovery times from such saturation may be effectively negligible.

10.4 Windowed Measures of Location

In the current disclosure, a Windowed Measure of Location (WML) would be a summary statistics that attempts to describe a set of data in a given time window by a single value. Most typically, a measure of location may be understood as a measure of central location, or central tendency. A weighted mean (often called a weighted average) would be the most typically used measure of central tendency, and it may be called a Windowed Measure of Central Tendency (WMCT). When the weights do not depend on the data values, a WMCT may be considered a linear measure of central tendency.

An example of a (generally) nonlinear measure of central tendency would be the quasi-arithmetic mean or generalized $f$-mean [51]. Other nonlinear measures of central tendency may include such measures as a median or a truncated mean value, or an L-estimator [46, 52, 53].

A measure of location obtained in a moving time window $w(t)$ would be a Windowed Measure of Location (WML). For example, given an input signal $x(t)$, the output $\chi(t)$ of a linear lowpass or bandpass filter with the impulse response $w(t)$, $\chi(t)=(w*x)(t)$, may represent a linear measure of location of the input signal $x(t)$ in a moving time window $w(t)$.

Note that when $\int_{-\infty}^{\infty} ds\, w(s)=1$, $w(t)$ would represent a lowpass filter, and a linear WML in such a time window would be a linear WMCT. However, such $w(t)$ that $\int_{-\infty}^{\infty} ds\, w(s)=0$ (e.g., an impulse response of a linear bandpass or bandstop filter) may also be used to obtain a linear WML for a signal. For example, if the linear filter has an effectively unity frequency response and an effectively zero group delay over the bandwidth of a signal of interest, such a filter may be used to obtain a linear WML for the signal of interest affected by an interfering signal.

As another example, let us consider the signal $\chi(t)$ implicitly given by the following equation:

$$\int_{-\infty}^{\infty} ds\, w(t-s)\mathrm{sign}(\chi(t)-x(s))=w(t)*\mathrm{sign}(\chi-x(t))=0, \quad (60)$$

where $\int_{-\infty}^{\infty} ds\, w(s)=1$. Such $\chi(t)$ would represent a weighted median of the input signal $x(t)$ in a moving time window $w(t)$, and $\chi(t)$ would be a robust nonlinear WML (WMCT) of the input signal $x(t)$ in a moving time window $w(t)$.

One skilled in the art will recognize that such nonlinear filters as a median filter, a CMTF, an NDL, an MTF, or a TTF would represent nonlinear WMLs (i.e. WMCTs) of their inputs.

10.5 Mitigation of Non-Impulsive Non-Gaussian Noise

The temporal and/or amplitude structures (and thus the distributions) of non-Gaussian signals are generally modifiable by linear filtering, and non-Gaussian interference may often be converted from sub-Gaussian into super-Gaussian, and vice versa, by linear filtering [9, 10, 32, e.g.]. Thus the ability of the ADiCs/CMTFs/ABAINFs disclosed herein, and $\Delta\Sigma$ ADCs with analog nonlinear loop filters, to mitigate impulsive (super-Gaussian) noise may translate into mitigation of non-Gaussian noise and interference in general, including sub-Gaussian noise (e.g. wind noise at microphones). For example, a linear analog filter may be employed as an input front end filter of the ADC to increase the peakedness of the interference, and the $\Delta\Sigma$ ADCs with analog nonlinear loop filter may perform analog-to-digital conversion combined with mitigation of this interference. Subsequently, if needed, a digital filter may be employed to compensate for the impact of the front end filter on the signal of interest.

Alternatively, increasing peakedness of the interference may be achieved by modifying the wideband filter following the $\Delta\Sigma$ modulator and preceding the ADiC, as illustrated in panel (b) of FIG. 61. In this example, the function of the wideband filter with the impulse response g[k] would be to enhance the distinction between the signal of interest and the outlier noise, thus increasing the efficiency of the outlier noise mitigation by the ADiC.

The response g[k] of the wideband "outlier-enhancing" filter may be such that it affects the signal of interest, e.g. g[k] * w[k] # w[k], where w[k] is the response of the "original" narrow-band "baseband" filter (such as a lowpass or bandpass filter) of the $\Delta\Sigma$ ADC before the addition of the ADiC-based processing (see panel (a) of FIG. 61). In such a case, the filter w[k] may be modified by adding the term $\Delta w[k]$ to compensate for the impact of the wideband filter on the signal of interest. For example, the term $\Delta w[k]$ may be chosen to satisfy the following condition:

$$g[k]*(w[k]+\Delta w[k]) \approx w[k]. \quad (61)$$

As an example, let as consider mitigation of wideband impulsive noise that was previously filtered with a 2nd order bandpass filter such that the filtered noise may no longer clearly appear impulsive, as may be seen in the upper left panel of FIG. 62. The cross-hatched areas in the rightmost panels of FIG. 62 correspond to the passband PSD of the "ideal" signal of interest (without interference), and the solid lines correspond to the PSDs of the filtered signal+noise mixtures.

Since the noise contains non-zero power spectral density in the signal's passband, a linear passband filter applied directly to the signal+interference mixture (the panels in row II of FIG. 62) affects the signal and the interference proportionally in its passband, and it does not improve the passband SNR.

While the bandpass-filtered impulsive noise shown in row I of FIG. 62 may no longer be a distinct outlier noise that would be efficiently mitigated by an ADiC, filtering this noise by a 1st order highpass filter with an appropriate time constant may convert this noise into a distinctly outlier (e.g. impulsive) noise, as illustrated in the left panel of row III. As shown in row IV of FIG. 62, such an outlier noise may be efficiently mitigated by an ADiC.

From the differential equation for a 1st order highpass filter it would follow that $g_r*[w+(1/r)\int dt\, w]=w$, where the asterisk denotes convolution and where $g_r(t)$ is the impulse response of the 1st order linear highpass filter with the corner frequency $1/(2\pi\tau)$. Thus, to compensate for the insertion of a 1st order highpass filter before an ADiC, the digital bandpass filter after the ADiC may be modified by adding a term proportional to an antiderivative of the impulse response w[k] of the bandpass filter, w[k]→w[k]+

$\Delta w[k] = w[k] + (1/r) \int dt w[k]$. FIG. 63 illustrates the impulse and the frequency responses of w[k] and w[k]+$\Delta$w[k] used in the example of FIG. 62.

The modified passband filter w[k]+$\Delta$w[k] applied to the ADiC's output would suppress the remaining interference outside of the passband, while compensating for the insertion of the 1st order highpass filter before the ADiC. This would result in an increased passband SNR, as illustrated in the panels of row V in FIG. 62.

As another illustrative example, let as consider ADiC-based mitigation of wideband impulsive noise affecting the baseband signal of interest in the presence of a strong adjacent-channel interference.

Let us first notice that an impulse response of a bandstop filter may be constructed by adding an outlier to an impulse response of a bandpass filter. Therefore, by removing (e.g. by an ADiC) this outlier from the impulse response of the bandstop filter the bandstop filter would be effectively converted to a respective bandpass filter. It then would follow that applying an ADiC filter to an impulsive noise filtered with a bandstop filter may effectively convert the bandstop-filtered impulsive noise into a respective bandpass-filtered impulsive noise, as illustrated by the idealized example of FIG. 64.

As schematically shown in FIG. 65, ADiC-based mitigation of wideband impulsive noise affecting the baseband signal of interest in the presence of a strong adjacent-channel interference may be performed as follows.

First, a bandstop filter is applied to the signal+noise+ interference mixture to effectively suppress (or adequately reduce) the adjacent channel interference. Then the ADiC filtering is applied to the output of the bandstop filter, mitigating the impulsive noise in the baseband. Finally, a linear baseband filter is applied to the ADiC's output, suppressing the remaining interference outside of the baseband.

Let us compare the two signal processing chains shown in FIG. 66, and inspect the examples of the time-domain traces and the PSDs of the signals at points I, II, III, IV, and V.

The example input signal (point I in FIG. 66 and the panels in row I of FIG. 67) consists of the baseband signal of interest, a mixture of a broadband-filtered AWGN and a broadband impulsive noise, and an adjacent-channel interference with the PSD in its passband much larger than that of the impulsive noise and that of the baseband PSD of the signal of interest.

Since the impulsive noise contains non-zero power spectral density in the signal's passband, a linear baseband filter applied directly to the signal+interference mixture (point II in FIG. 66 and the panels in row II of FIG. 67) affects the signal and the interference proportionally in its passband, and it does not improve the baseband SNR.

As discussed earlier, when a (narrow-band) baseband signal of interest is affected only by a mixture of a broadband Gaussian and a broadband impulsive noise, the latter may be efficiently mitigated by an ADiC. However, as illustrated in the upper left panel of FIG. 67, the presence of a strong adjacent-channel interference may "obscure" the impulsive noise, impeding its identification as "outliers" and making a direct use of an ADiC for its mitigation ineffective.

To enable impulsive noise mitigation, one may first suppress the adjacent-channel interference by a linear bandstop filter, thus "revealing" the impulsive noise (point III in FIG. 66 and the panels in row III of FIG. 67) and making its "pulses" identifiable as outliers.

An ADiC applied to the bandstop-filtered signal would thus be enabled to mitigate the impulsive noise, disproportionately reducing its baseband PSD while raising its PSD in the stopband of the bandstop filter by approximately the respective amount (point IV in FIG. 66 and the panels in row IV of FIG. 67).

A linear baseband filter applied to the ADiC's output would suppress the remaining interference outside of the baseband, resulting in an increased baseband SNR (point V in FIG. 66 and the panels in row V of FIG. 67).

10.6 Concluding Remarks

"ADiC-based filter" should be understood as a filter comprising an ADiC structure. For example, an ADiC-based filter may consist of a wideband linear lowpass filter followed by an ADiC followed by a linear bandpass filter. As another example, in FIG. 66 the ADiC-based filter consists of a bandstop filter followed by an ADiC followed by a linear lowpass filter.

As another example of an ADiC-based filter, an "ADiC-based decimation filter" should be understood as a decimation filter comprising an ADiC structure. For example, it may consist of a digital ADiC followed by a digital decimation filter.

FIG. 68 provides an example of a $\Delta\Sigma$ ADC with an ADIC-based decimation filter for mitigation of wideband impulsive noise affecting the baseband signal of interest in the presence of a strong adjacent-channel interference. In this example, the ADiC-based decimation filter consists of (i) a digital wideband filter followed by (ii) a digital ADiC followed by (iii) a digital decimation filter.

The wideband filter may, in turn, consist of a several cascaded filters. For example, for mitigation of wideband impulsive noise affecting the baseband signal of interest in the presence of a strong adjacent-channel interference, the wideband filter may consist of a wide-band lowpass filter cascaded with a bandstop filter for suppression of the adjacent-channel interference.

While conceptually the best implementation and use of ADiC-based filters may be in analog hardware, as discussed in this disclosure, inherently high (e.g. by two to three orders of magnitude higher than the Nyquist rate for the signal of interest) oversampling rate of a $\Delta\Sigma$ ADC may be used for a real-time, low memory, and computationally inexpensive "effectively analog" digital ADiC-based filtering during analog-to-digital conversion. Such numerical ADiC implementations may offer many advantages typically associated with digital processing, including simplified development and testing, on-the-fly configurability, reproducibility, and the ability to "train" (optimize) the ADiC parameters (e.g., using machine learning approaches). In addition, such an approach may simplify ADiC's integration into those existing systems that use $\Delta\Sigma$ ADCs for analog-to-digital conversion.

For example, FIG. 69 illustrates a direct conversion receiver architecture with quadrature baseband ADCs, where the ADiC-based filtering (using either complex-valued processing, or separate processing of the in-phase and quadrature components) may be performed early in the digital domain, immediately following $\Delta\Sigma$ modulators (e.g. 1-bit $\Delta\Sigma$ modulators). A high sampling rate of $\Delta\Sigma$ modulators would allow the use of relaxed analog filtering requirements. e.g. much wider antialiasing filter bandwidth. For instance, one may use a low-order Bessel filter with the 3 dB corner frequency that is an order of magnitude wider than that of the baseband, to provide a sufficient bandwidth margin along with preserving the shape of the interference's outliers.

FIG. 70 shows a generic example of a superheterodyne receiver architecture with incorporated ADiC-based filtering. In such a receiver, a baseband stage may amplify, filter, and then A/D convert the resulting in-phase and quadrature signals. After the A/D (performed, e.g., by 1-bit $\Delta\Sigma$ modulators), digital ADiC-based filtering may be performed to attenuate interferers before digital detection of the bit sequence is performed. Alternatively, the IF signal may be digitized by a single ADC (e.g. by a $\Delta\Sigma$ ADC) after which additional filtering (including ADiC filtering), quadrature downconversion to DC, and bit detection are performed in the digital domain.

One skilled in the art will recognize that a variety of electronic circuit topologies may be developed and/or used to implement the intended functionality of various ADiC structures. FIGS. 71, 72, and 73 outline brief examples of idealized algorithmic topologies for several ADiC sub-circuits based on the operational transconductance amplifiers (OTAs). Transconductance cells based on the metal-oxide-semiconductor (MOS) technology represent an attractive technological platform for implementation of such active nonlinear filters as ADiCs, and for their incorporation into IC-based signal processing systems. ADiCs based on transconductance cells offer simple and predictable design, easy incorporation into ICs based on the dominant IC technologies, small size, and can be used from the low audio range to gigahertz applications [54-57].

For example, FIG. 71 provides a conceptual schematic of a sub-circuit for an OTA-based implementation of a depreciator with the transparency function given by equation (30) and depicted in FIG. 20.

FIG. 72 provides an example of an OTA-based squaring circuit (e.g. "SQ" circuit in FIG. 58) for a complex-valued signal.

FIG. 73 provides an example of a conceptual schematic of a sub-circuit for an OTA-based implementation of a depreciator with the transparency function depicted in FIGS. 56 and 58 and given by the following equation:

$$\mathcal{T}_{\alpha^2}(|z-\zeta|^2) = \begin{cases} 1 & \text{for } |z-\zeta| \le \alpha \\ \left(\frac{\alpha}{|z-\zeta|}\right)^2 & \text{otherwise} \end{cases} \quad (62)$$

One skilled in the art will recognize that various other OTA-based sub-circuits for different ADiC embodiments (e.g. implementing addition/subtraction, multiplication/division, absolute value, square root, and other linear and/or nonlinear functions) may be implemented using the approaches and the circuit topologies described, for example, in [58-61].

Note that if the DCLs $\chi(t)$ or $\zeta(t)$ in FIG. 43, 50 or 58 are established by filtering the signal x(t) or z(t) with a linear filter with the impulse response w(t) (i.e. as $\chi(t)=(w*x)(t)$ or $\zeta(i)=(w*z)(t)$), having an effectively unity frequency response and an effectively constant group delay $\Delta t>0$ over the bandwidth of the signal of interest, they may be viewed as DCLs for the delayed signals $x(t-\Delta t)$ or $z(t-\Delta t)$. Then the difference signals for $x(t-\Delta t)$ or $z(t-\Delta t)$ (i.e. $x(t-\Delta t)-\chi(t)$ or $z(t-\Delta t)-\zeta(t)$) may be obtained as the respective outputs of a bandstop filter with the impulse response $\delta(t-\Delta t)-w(t)$, where $\delta(x)$ is the Dirac $\delta$-function [31].

REFERENCES

[1] M. Stojanovic and J. Preisig. Underwater acoustic communication channels: Propagation models and statistical characterization. In *IEEE Communications Magazine*, volume 47, pages 84-89, January 2009.

[2] J. S. G. Panaro. F. R. B. Lopes, L. M. Barreira, and F. E. Souza. Underwater acoustic noise model for shallow water communications. In *XXX Simpósio Brasileiro de Telecomuniçōes (SBrT 2012)*, Brazil, 13-16 Sep. 2012.

[3] G. B. Kinda, Y. Simard, C. Gervaise, J. I. Mars, and L. Fortier. Arctic underwater noise transients from sea ice deformation: Characteristics, annual time series, and forcing in Beaufort Sea. *The Journal of the Acoustical Society of America*, 138(4):2034-2045, October 2015.

[4] J. D. Parsons. *The Mobile Radio Propagation Channel*. Wiley, Chichester, 2 edition, 2000.

[5] X. Yang and A. P. Petropulu. Co-channel interference modeling and analysis in a Poisson field of interferers in wireless communications. *IEEE Transactions on Signal Processing*, 51 (1):64-76, 2003.

[6] A. V. Nikitin. On the impulsive nature of interchannel interference in digital communication systems. In *Proc. IEEE Radio and Wireless Symposium*, pages 118-121, Phoenix, Ariz., 2011.

[7] A. V. Nikitin. On the interchannel interference in digital communication systems, its impulsive nature, and its mitigation. *EURASIP Journal on Advances in Signal Processing*, 2011(137), 2011.

[8] A. V. Nikitin, M. Epard, J. B. Lancaster, R. L. Lutes, and E. A. Shumaker. Impulsive interference in communication channels and its mitigation by SPART and other nonlinear filters. *EURASIP Journal on Advances in Signal Processing*, 2012(79), 2012.

[9] A. V. Nikitin, R. L. Davidchack, and T. J. Sobering. Adaptive analog nonlinear algorithms and circuits for improving signal quality in the presence of technogenic interference. In *Proceedings of IEEE Military Communications Conference 2013*, San Diego, Calif., 18-20 Nov. 2013.

[10] A. V. Nikitin, R. L. Davidchack, and J. E. Smith. Out-of-band and adjacent-channel interference reduction by analog nonlinear filters. *EURASIP Journal on Advances in Signal Processing*, 2015(12), 2015.

[11] J. Carey. Noise wars: Projected capacitance strikes back against internal noise. *EDN*, pages 61-65, Jan. 19, 2012.

[12] T. B. Cabrielson. Mechanical-thermal noise in micromachined acoustic and vibration sensors. *IEEE Transactions on Electron Devices*, 40(5):903-909, 1993.

[13] F. Mohd-Yasin, D. J. Nagel, and C. E. Korman. Noise in MEMS. *Measurement Science and Technology*, 21(012001), 2010.

[14] S. H. Ardalan and J. J. Paulos. An analysis of nonlinear behavior in delta-sigma modulators. *IEEE Transactions on Circuits and Systems*, CAS-34(6), 1987.

[15] E. Janssen and A. van Roermund. *Look-Ahead Based Sigma-Delta Modulation*. Springer, 2011.

[16] A. Chopra. *Modeling and Mitigation of Interference in Wireless Receivers with Multiple Antennae*. Phd thesis, The University of Texas at Austin, December 2011.

[17] I. Shanthi and M. L. Valarmathi. Speckle noise suppression of SAR image using hybrid order statistics filters. *International Journal of Advanced Engineering Sciences and Technologies (IJAEST)*, 5(2):229-235, 2011.

[18] R. Dragomir, S. Puscoci, and D. Dragomir. A synthetic impulse noise environment for DSL access networks. In *Proceedings of the 2nd International conference on Circuits, Systems, Control, Signals (CSCS'11)*, pages 116-119, 2011.

[19] V. Guillet, G. Lanmarque, P. Ravier, and C. Léger. Improving the power line communication signal-to-noise

[20] M. Katayama, T. Yamazato, and H. Okada. A mathematical model of noise in narrow-band power line communication systems. *IEEE J. Sel. Areas Commun.*, 24(7): 1267-1276, 2006.

[21] M. Nassar, J. Lin, Y. Mortazavi, A. Dabak, I. H. Kim, and B. L. Evans. Local utility power line communications in the 3-500 kHz band: Channel impairments, noise, and standards. *IEEE Signal Processing Magazine*, 29(5):116-127, 2012.

[22] M. Nassar, A. Dabak, H Han Kim, T. Pande, and B. L. Evans. Cyclostationary noise modeling in narrowband powerline communication for Smart Grid applications. In *2012 IEEE Int. Conf. Acoust. Speech Signal Process. (ICASSP)*, pages 3089-3092, 25-30 March 2012.

[23] J. Lin, M. Nassar, and B. L. Evans. Impulsive noise mitigation in powerline communications using sparse Bayesian learning. *IEEE Journal on Selected Areas in Communications*, 31(7):1172-1183, 2013.

[24] A. V. Nikitin, D. Scutti, B. Natarajan, and R. L. Davidchack. Blind adaptive analog nonlinear filters for noise mitigation in powerline communication systems. In *Proc. IEEE IIternational Symposium on Power Line Communications and Its Applications (ISPLC 2015)*, Austin, Tex., 29-31 Mar. 2015.

[25] S. A. Bhatti, Q. Shan, R. Atkinson, M. Vieira, and I. A. Glover. Vulnerability of Zigbee to impulsive noise in electricity substations. In *General Assembly and Scientific Symposium, 2011 XXXth URSI*, 13-20 Aug. 2011.

[26] S. R. Mallipeddy and R. S. Kshetrimayum. Impact of UWB interference on IEEE 802.11a WLAN system. In *National Conference on Communications (NCC)*, 2010.

[27] C. Fischer. Analysis of cellular CDMA systems under UWB interference. In *International Zurich Seminar on Communications*, pages 130-133, 2006.

[28] K. Slattery and H. Skinner. *Platform Interference in Wireless Systems*. Elsevier, 2008.

[29] F. Leferink, F. Silva, J. Catrysse, S. Batterman, V. Beauvois, and A. Roc'h. Man-made noise in our living environments. *Radio Science Bulletin*, (334):49-57, September 2010.

[30] R. Bracewell. *The Fourier Transform and Its Applications*, chapter "Heaviside's Unit Step Function, H(x)", pages 61-65. McGraw-Hill, New York, 3rd edition, 2000.

[31] P. A. M. Dirac. *The Principles of Quantum Mechanics*. Oxford University Press, London, 4th edition, 1958.

[32] A. V. Nikitin. Method and apparatus for signal filtering and for improving properties of electronic devices. U.S. Pat. No. 8,489,666 (16 Jul. 2013), U.S. Pat. No. 8,990,284 (24 Mar. 2015), U.S. Pat. No. 9,117,099 (Aug. 25, 2015), U.S. Pat. No. 9,130,455 (8 Sep. 2015), and U.S. Pat. No. 9,467,113 (11 Oct. 2016).

[33] A. V. Nikitin and R. L. Davidchack. Signal analysis through analog representation. *Proc. R. Soc. Lond. A*, 459(2033):1171-1192, 2003.

[34] A. V. Nikitin and R. L. Davidchack. Adaptive approximation of feedback rank filters for continuous signals. *Signal Processing*, 84(4):805-811, 2004.

[35] A. V. Nikitin and R. L. Davidchack. Method and apparatus for analysis of variables. U.S. Pat. No. 7,133,568 (Nov. 7, 2006) and U.S. Pat. No. 7,242,808 (Jul. 10, 2007).

[36] A. V. Nikitin. Method and apparatus for real-time signal conditioning, processing, analysis, quantification, comparison, and control. U.S. Pat. No. 7,107,306 (Sep. 12, 2006), U.S. Pat. No. 7,418,469 (Aug. 26, 2008), and U.S. Pat. No. 7,617,270 (Nov. 10, 2009).

[37] A. V. Nikitin. Method and apparatus for adaptive real-time signal conditioning and analysis. U.S. Pat. No. 8,694,273 (Apr. 8, 2014).

[38] G. I. Bourdopoulos, A. Pnevmatikakis, V. Anastassopoulos, and T. L. Deliyannis. *Delta-Sigma Modulators: Modeling. Design and Applications*. Imperial College Press, London, 2003.

[39] W. Kester, editor. *Data Conversion Handbook*. Elsevier, Oxford, 2005.

[40] Y. Geerts, M. Steyaert, and W. M. C. Sansen. *Design of Multi-Bit Delta-Sigma A/D Converters*. The Springer International Series in Engineering and Computer Science. Springer US, 2006.

[41] A. V. Nikitin. *Pulse Pileup Effects in Counting Detectors*. Phd thesis, University of Kansas, Lawrence, 1998.

[42] C. E. Shannon. Communication in the presence of noise. *Proc. Institute of Radio Engineers*, 37(1):10-21, January 1949.

[43] F. R. Hanipel. The influence curve and its role in robust estimation. *J. Am. Stat. Assoc.*, 69(346):383-393, 1974.

[44] S. O. Rice. Mathematical analysis of random noise. *Bell System Technical Journal*, 23: 282-332, 1944. Ibid. 24:46-156, 1945. Reprinted in: Nelson Wax, editor, *Selected papers on noise and stochastic processes*. Dover, N.Y., 1954.

[45] A. V. Nikitin, R. L. Davidchack, and T. P. Armstrong. The effect of pulse pile-up on threshold crossing rates in a system with a known impulse response.

[46] J. W. Tukey. *Exploratory Data Analysis*. Addison-Wesley, 1977.

[47] H. V. Poor. *An Introduction to signal detection and estimation theory*. Springer, 1998.

[48] M. Abramowitz and I. A. Stegun, editors. *Handbook of Mathematical Functions with Formulas, Graphs, and Mathematical Tables*. 9th printing. New York: Dover, 1972.

[49] C. Mead. *Analog VLSI and neural systems*. Addison-Wesley, 1989.

[50] K. Urahama and T. Nagao. Direct analog rank filtering. *IEEE Trans. Circuits Syst.-I*, 42(7):385 388, July 1995.

[51] V. M. Tikhomirov, editor. *Selected Works of A. N. Kolmogorov*, volume I: Mathematics and Mechanics, pages 144-146. Springer Netherlands, 1991.

[52] P. J. Huber. *Robust Statistics*. Wiley Series in Probability and Statistics. Wiley, 2005.

[53] S. V. Vaseghi. *Advanced Digital Signal Processing and Noise Reduction*. Wiley, 4th edition, 2008.

[54] R. Schaumann and M. E. Van Valkenburg. *Design of analog filters*. Oxford University Press, 2001.

[55] Yichuang Sun. *Design of High Frequency Integrated Analogue Filters*. IEE Circuits, Devices and Systems Series, 14. The Institution of Engineering and Technology, 2002.

[56] Y. Zheng. *Operational transconductance amplifiers for gigahertz applications*. Phd thesis, Queen's University. Kingston, Ontario. Canada, September 2008.

[57] T. Parveen. *A Textbook of Operational transconductance Amplifier and Analog Integrated Circuits*. I.K. International Publishing House Pvt. Ltd., 2009.

[58] E. Sánchez-Sinencio, J. Ramírez-Angulo, B. Linares-Barranco, and A. Rodríguez-Vázquez. Operational transconductance amplifier-based nonlinear function syntheses. *IEEE Journal of Solid-State Circuits (JCCS)*, 24(6):1576-1586, 1989.

[59] N. Minhaj. OTA-based non-inverting and inverting precision full-wave rectifier circuits without diodes. *International Journal of Recent Trends in Engineering*, 1(3): 72-75, 2009.

[60] C. Chanapromma, T. Worachak, and P. Silapan. A temperature-insensitive wide-dynamic range positive/negative full-wave rectifier based on operational transconductance amplifier using commercially available ICs. *World Academy of Science. Engineering and Technology*, 58:49-52, 2011.

[61] A. Díaz-Sánchez, J. Ramírez-Angulo, A. Lopez-Martin, and E. Sánchez-Sinencio. A fully parallel CMOS analog median filter. *IEEE Transactions on Circuits and Systems II: Express Briefs*, 51(3):116-123, 2004.

Regarding the invention being thus described, it will be obvious that the same may be varied in many ways. Such variations are not to be regarded as a departure from the spirit and scope of the invention, and all such modifications as would be obvious to one skilled in the art are intended to be included within the scope of the claims. It is to be understood that while certain now preferred forms of this invention have been illustrated and described, it is not limited thereto except insofar as such limitations are included in the following claims.

I claim:

1. An apparatus for signal filtering converting an input signal into an output signal, wherein said input signal is a physical signal and wherein said output signal is a physical signal, the apparatus comprising:
   a) a means to establish a differential clipping level, wherein said differential clipping level is a measure of location of said input signal in a moving time window;
   b) a means to obtain a difference signal, wherein said difference signal is the difference between said input signal and said differential clipping level;
   c) a means to establish a lower fence and an upper fence for said difference signal, wherein said lower fence and said upper fence form a robust range that effectively excludes outliers of said difference signal, and wherein an average of said lower fence and said upper fence represents a measure of location of said difference signal;
   d) a depreciator characterized by said lower fence, said upper fence, said average, and a difference response and operable to receive a depreciator input and to produce a depreciator output, wherein said depreciator output is not larger than said average when said depreciator input is smaller than said lower fence, wherein said depreciator output is not smaller than said average when said depreciator input is larger than said upper fence, wherein said difference response is the difference between said depreciator input and said depreciator output, wherein said difference response is an increasing function of said depreciator input, and wherein said difference response is effectively zero when said depreciator input is within said robust range; wherein said depreciator input is effectively equal to said difference signal and wherein said output signal is proportional to the sum of said differential clipping level and said depreciator output.

2. The apparatus of claim 1 wherein said means to establish said lower fence and said upper fence comprises a quantile tracking filter operable to receive a quantile tracking filter input proportional to said difference signal and to produce a quantile tracking filter output.

3. The apparatus of claim 1 wherein said means to establish said lower fence and said upper fence comprises a plurality of quantile tracking filters operable to receive a plurality of quantile tracking filter inputs and to produce a plurality of quantile tracking filter outputs, and wherein said lower fence and said upper fence are linear combinations of said plurality of quantile tracking filter outputs.

4. The apparatus of claim 1 wherein said depreciator output is effectively equal to said average when said depreciator input is outside of said robust range.

5. The apparatus of claim 4 wherein said means to establish said lower fence and said upper fence comprises a quantile tracking filter operable to receive a quantile tracking filter input proportional to said difference signal and to produce a quantile tracking filter output.

6. The apparatus of claim 4 wherein said means to establish said lower fence and said upper fence comprises a plurality of quantile tracking filters operable to receive a plurality of quantile tracking filter inputs and to produce a plurality of quantile tracking filter outputs, and wherein said lower fence and said upper fence are linear combinations of said plurality of quantile tracking filter outputs.

7. An apparatus for signal filtering converting an input signal into an output signal, wherein said input signal is a physical signal and wherein said output signal is a physical signal, the apparatus comprising:
   a) a means to establish a lower fence and an upper fence for said input signal, wherein said lower fence and said upper fence form a robust range that effectively excludes outliers of said input signal, and wherein an average of said lower fence and said upper fence represents a measure of location of said input signal;
   b) a depreciator characterized by said lower fence, said upper fence, said average, and a difference response and operable to receive a depreciator input and to produce a depreciator output, wherein said depreciator output is not larger than said average when said depreciator input is smaller than said lower fence, wherein said depreciator output is not smaller than said average when said depreciator input is larger than said upper fence, wherein said difference response is the difference between said depreciator input and said depreciator output, wherein said difference response is an increasing function of said depreciator input, and wherein said difference response is effectively zero when said depreciator input is within said robust range; wherein said depreciator input is effectively equal to said input signal and wherein said output signal is proportional to said depreciator output.

8. The apparatus of claim 7 wherein said means to establish said lower fence and said upper fence comprises a quantile tracking filter operable to receive a quantile tracking filter input proportional to said input signal and to produce a quantile tracking filter output.

9. The apparatus of claim 7 wherein said means to establish said lower fence and said upper fence comprises a plurality of quantile tracking filters operable to receive a plurality of quantile tracking filter inputs and to produce a plurality of quantile tracking filter outputs, and wherein said lower fence and said upper fence are linear combinations of said plurality of quantile tracking filter outputs.

10. The apparatus of claim 7 wherein said depreciator output is effectively equal to said average when said depreciator input is outside of said robust range.

11. The apparatus of claim 10 wherein said means to establish said lower fence and said upper fence comprises a quantile tracking filter operable to receive a quantile tracking filter input proportional to said input signal and to produce a quantile tracking filter output.

12. The apparatus of claim 10 wherein said means to establish said lower fence and said upper fence comprises a plurality of quantile tracking filters operable to receive a plurality of quantile tracking filter inputs and to produce a plurality of quantile tracking filter outputs, and wherein said lower fence and said upper fence are linear combinations of said plurality of quantile tracking filter outputs.

13. A digital signal processing apparatus comprising a digital signal processing unit configurable to perform one or more functions including a filtering function transforming an input signal into an output filtered signal, wherein said filtering function comprises:
   a) a robust range function operable to establish a lower fence and an upper fence for said input signal, wherein said lower fence and said upper fence form a robust range that effectively excludes outliers of said input signal, and wherein an average of said lower fence and said upper fence represents a measure of location of said input signal;
   b) a depreciator function characterized by said lower fence, said upper fence, said average, and a difference response and operable to receive a depreciator input and to produce a depreciator output, wherein said depreciator output is not larger than said average when said depreciator input is smaller than said lower fence, wherein said depreciator output is not smaller than said average when said depreciator input is larger than said upper fence, wherein said difference response is the difference between said depreciator input, and said depreciator output, wherein said difference response is an increasing function of said depreciator input, and wherein said difference response is effectively zero when said depreciator input is within said robust range;
   wherein said depreciator input is effectively equal to said input signal and wherein said output signal is proportional to said depreciator output.

14. The apparatus of claim 13 wherein said robust range function comprises a quantile tracking filter operable to receive a quantile tracking filter input proportional to said input signal and to produce a quantile tracking filter output.

15. The apparatus of claim 13 wherein said robust range function comprises a linear filter operable to receive a linear filter input proportional to said input signal and to produce a linear filter output.

16. The apparatus of claim 13 wherein said robust range function comprises a plurality of quantile tracking filters operable to receive a plurality of quantile tracking filter inputs and to produce a plurality of quantile tracking filter outputs, and wherein said lower fence and said upper fence are linear combinations of said plurality of quantile tracking filter outputs.

17. The apparatus of claim 13 wherein said depreciator output is effectively equal to said average when said depreciator input is outside of said robust range.

18. The apparatus of claim 17 wherein said robust range function comprises a quantile tracking filter operable to receive a quantile tracking filter input proportional to said input signal and to produce a quantile tracking filter output.

19. The apparatus of claim 17 wherein said robust range function comprises a linear filter operable to receive a linear filter input proportional to said input signal and to produce a linear filter output.

20. The apparatus of claim 17 wherein said robust range function comprises a plurality of quantile tracking filters operable to receive a plurality of quantile tracking filter inputs and to produce a plurality of quantile tracking filter outputs, and wherein said lower fence and said upper fence are linear combinations of said plurality of quantile tracking filter outputs.

* * * * *